United States Patent [19]

Sachs

[11] Patent Number: 6,021,358
[45] Date of Patent: Feb. 1, 2000

[54] THREE DIMENSIONAL MODEL AND MOLD MAKING METHOD USING THICK-SLICE SUBTRACTIVE FABRICATION

[76] Inventor: George A. Sachs, 29989 Ravenscroft Rd, Farmington Hills, Mich. 48331

[21] Appl. No.: 08/716,557

[22] Filed: Sep. 18, 1996

[51] Int. Cl.$^7$ .............................. G06F 19/00; G06G 7/66
[52] U.S. Cl. ................................ 700/98; 700/95; 700/96; 700/118; 700/163
[58] Field of Search ........................ 364/468.01, 468.02, 364/468.04, 468.15, 468.16, 468.25, 468.26, 468.27, 474.05, 474.26; 700/95, 96, 98, 108, 109, 118, 119, 120, 163; 382/154; 345/139, 418–420; 359/458

[56] References Cited

U.S. PATENT DOCUMENTS

| | | | |
|---|---|---|---|
| 2,242,631 | 5/1941 | Stillman | 41/25 |
| 2,903,390 | 9/1959 | Kojima | 154/125 |
| 3,301,725 | 1/1967 | Frontera | 156/89 |
| 3,932,923 | 1/1976 | DiMatteo | 29/407 |
| 4,393,450 | 7/1983 | Jerard | 364/474 |
| 4,575,330 | 3/1986 | Hall | 425/174.4 |
| 4,665,492 | 5/1987 | Masters | 364/468 |
| 4,752,352 | 6/1988 | Feygin | 156/630 |
| 5,015,312 | 5/1991 | Klazie | 156/63 |
| 5,071,503 | 12/1991 | Berman | 156/250 |
| 5,121,329 | 6/1992 | Crump | 364/468 |
| 5,156,700 | 10/1992 | Berman et al. | 156/155 |
| 5,287,435 | 2/1994 | Cohen | 395/118 |
| 5,301,863 | 4/1994 | Prinz et al. | 228/33 |
| 5,398,193 | 3/1995 | DeAngelis | 364/468 |
| 5,432,704 | 7/1995 | Vouzelaud et al. | 364/474.24 |
| 5,481,465 | 1/1996 | Ioth et al. | 364/468 |
| 5,514,232 | 5/1996 | Burns | 156/64 |
| 5,590,454 | 1/1997 | Rickhardson | 29/27.4 |
| 5,594,652 | 1/1997 | Penn et al. | 364/468.26 |
| 5,596,504 | 1/1997 | Tata et al. | 364/468.27 |
| 5,637,175 | 6/1997 | Feygin et al. | 156/264 |
| 5,681,513 | 10/1997 | Farley | 264/102 |
| 5,705,008 | 1/1998 | Hecht | 156/148 |
| 5,718,951 | 2/1998 | Sterett et al. | 427/466 |

OTHER PUBLICATIONS

Paul Dvorak; Machine Design; Other Routes to Rapid Prototypes: Jun. 25, 1992; 5pgs.
Marshall Burns; Prentice Hall; Automated Fabrication; 1993; 369pgs.
Paul Dvorak; Machine Design; Rapid Prototypes for Production Parts; Oct. 1, 1993, 5pgs.
Joanne Wolfe; Plastics Design Forum; Rapid Product Realization; May 1, 1994; 9pgs.
N.A.; Manufacturing Engineering; Rapid Prototyping, Rapid Progress, Jul. 1, 1994, 1pg.
Diana Phillips Mahoney; Computer Graphics World; Rapid Prototyping in Medicine; Feb. 1, 1995; 5pgs.
Robert Brown et. al.; RPA; Need for Expanding the Development and Refinement of Rapid Prototyping Technologies; First Quarter 1995, 3pgs.
William Leichter; Rapid Prototyping and Manufacturing 1995; Rapid Prototyping with Laser Cutting; May 3, 1995; 12 pgs.

(List continued on next page.)

*Primary Examiner*—Paul P. Gordon
*Assistant Examiner*—Ramesh Patel

[57] ABSTRACT

A method of rapid prototyping which can utilize existing subtractive fabrication devices for the purpose of forming complex three-dimensional objects from a computer model. The method extends the capability of existing milling machines and other subtractive devices thereby allowing them to create objects of greater complexity than would normally be possible. Complex objects are subdivided by a computer control program into optimal machinable layers having a uniform outer geometry which permits simplified alignment and fixturing and wherein portions of the object are temporarily suspended by integrally machined support membranes. A minimum number of layers are required and these layers will have substantial thickness as compared with those of conventional additive fabricators. Surfaces of the models will be smooth and require little or no hand finishing. Methods for creating various types of molds from the models are described and a visualization and verification aid is provided for the operator, together with various diagnostic information.

51 Claims, 21 Drawing Sheets

OTHER PUBLICATIONS

David Tait; SME Rapid Prototyping Conference Proceedings; Big Parts, Big Savings An Economic View; May 1995.

Paul Dvorak; Suppliment to Computer–Aided Engineering; Tools For Speed; Jul. 1995, 4pgs.

Gary Winek, et. al.; Journal of Engineering Technology; Rapid Prototyping; The State of the Technology; Fall 1995, 7pgs.

Gerry Kobe; Automotive industries; 100–Day Engine; Mar. 1995, 3pgs.

Rob Hassold; Modern Machine Shop; CNC Machining as a Rapid Prototyping Technique; Oct. 10, 1995, 3pgs.

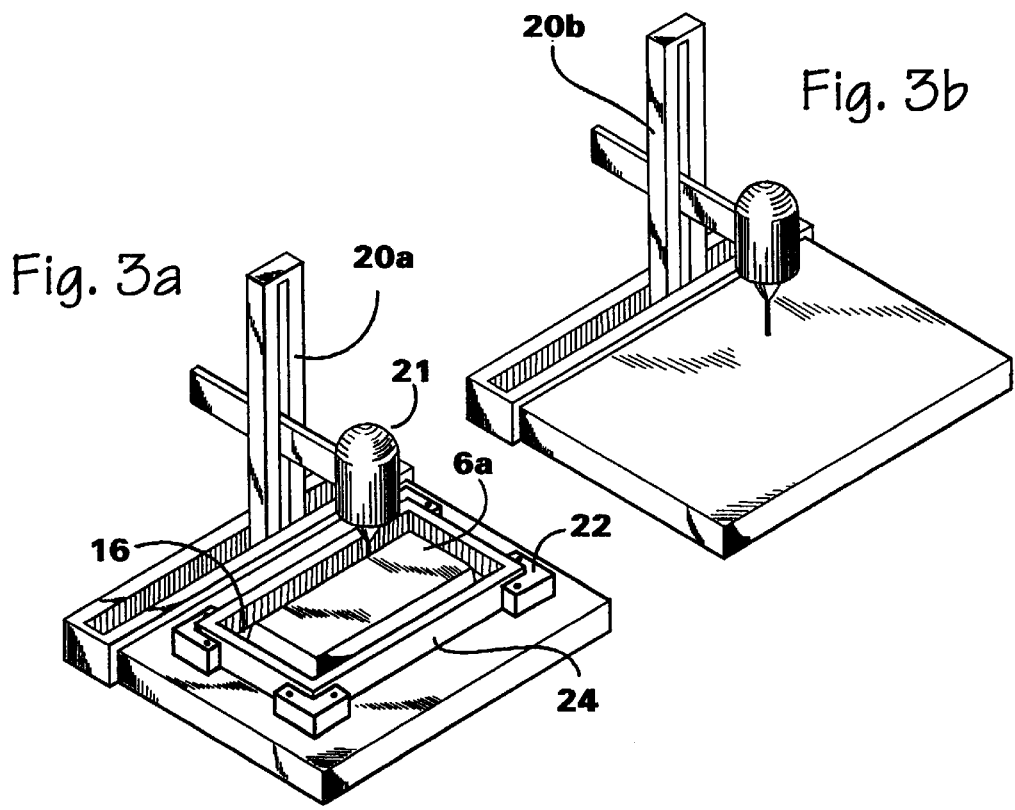
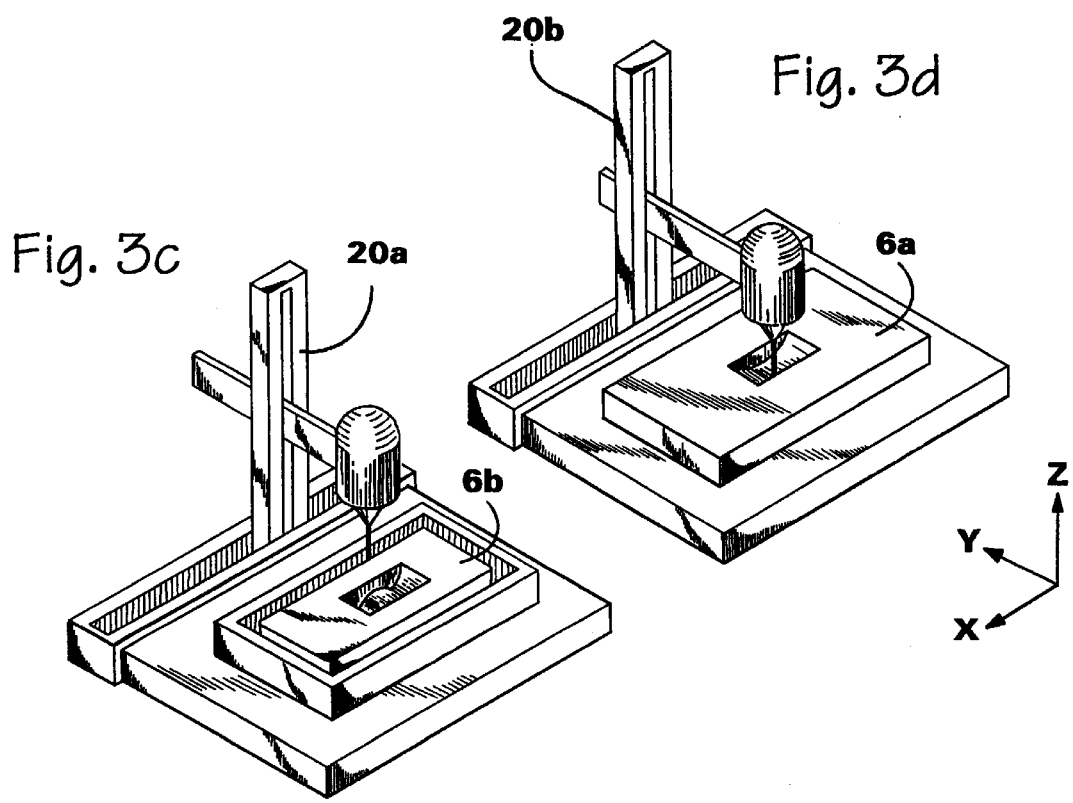

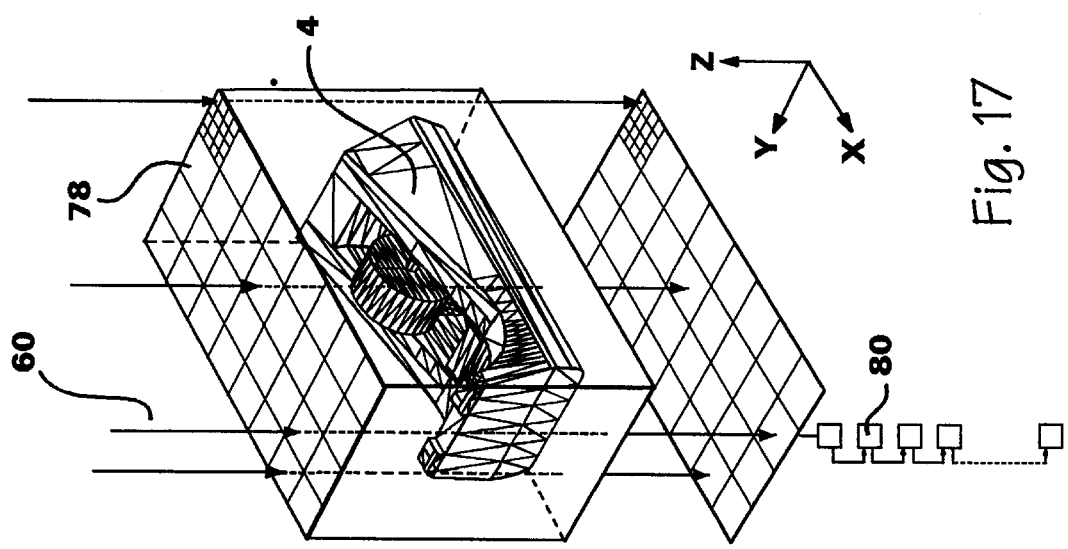
Fig. 17
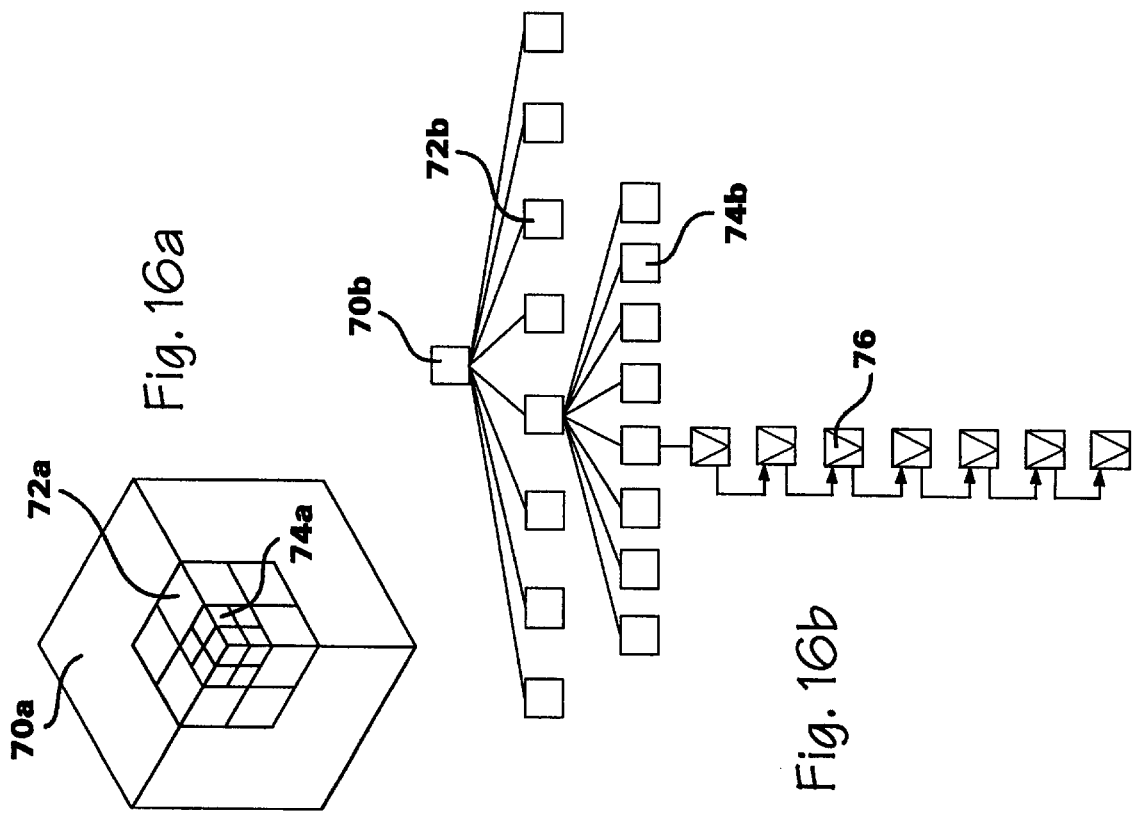
Fig. 16a
Fig. 16b

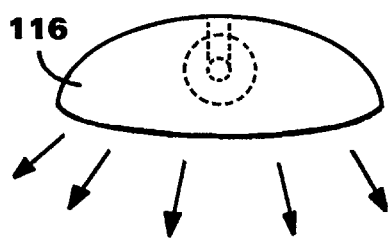
Fig. 28
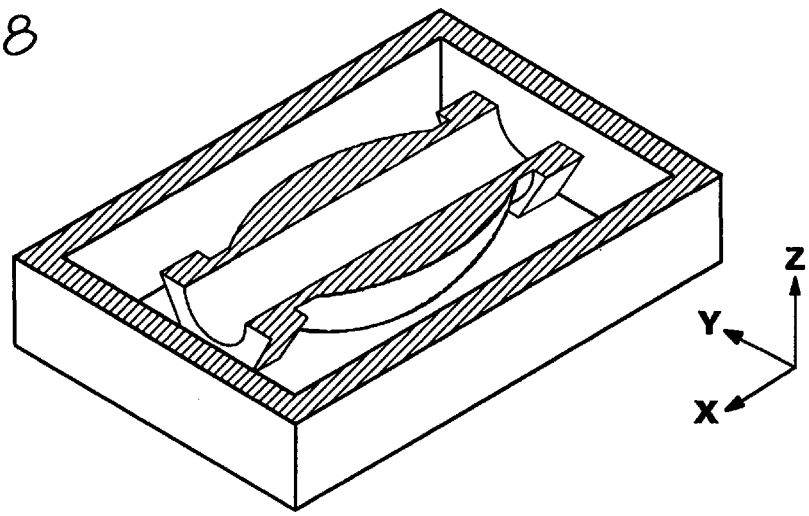
Fig. 29
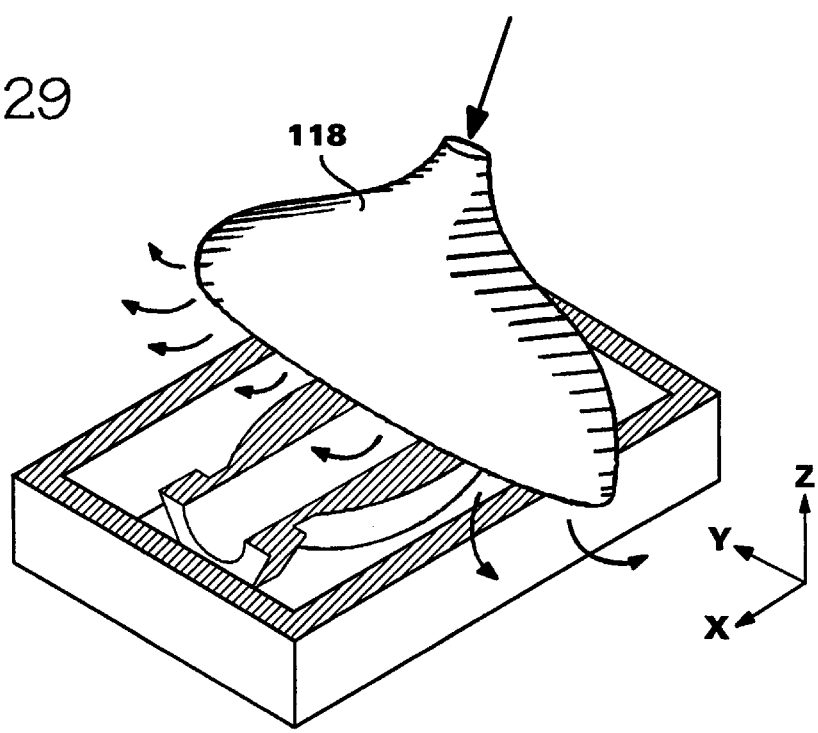

THREE DIMENSIONAL MODEL AND MOLD MAKING METHOD USING THICK-SLICE SUBTRACTIVE FABRICATION

CROSS-REFERENCE TO RELATED APPLICATIONS

N.A.

STATEMENT REGARDING FEDERALLY SPONSORED RESEARCH

N.A.

BACKGROUND—FIELD OF THE INVENTION

This invention relates, in general, to rapid prototype model making and more specifically to a method for the automated creation of mockups, models and molds of three-dimensional computer generated objects by means of subtractive fabrication.

BACKGROUND—DESCRIPTION OF THE PRIOR ART

In recent years there have been a large number of techniques proposed and developed in an effort to provide methods for quickly and automatically creating three dimensional (3D) objects directly from computer aided design (CAD) models. This area of technology has become variously known as rapid prototyping (RP), 3D hardcopy/printing (3DP) and freeform fabrication (FFF). The advancements made in this field have had an immediate and direct impact on the ability to quickly design and manufacture products in response to global industrial and consumer demands. A large number of industries are the beneficiaries of these advancements, in particular those involving automotive and aerospace manufacturing.

Nevertheless, there are numerous issues that limit the broader applicability of many of the fabricators currently available. One of these is the size limitation of the existing machines, which prevents some manufacturers from being able to build full scale models of their designs. In addition, most of the fabricators available today are very expensive to acquire and operate. It is the intention of the present invention to alleviate most, if not all, of these limitations.

To further an understanding of the present invention and highlight its departure from the many preceding approaches, it is valuable to review the various methods which have been proposed for simplifying the creation of three dimensional models.

Both current and past efforts have primarily evolved from a stratification principle dating back to the ancient Greeks. The stratification principle, which is attributed to Democritus, states that any closed figure can be approximated, to arbitrary precision, by a large number of inscribed rectangular cross sections. This powerful approximation technique can be used to decompose complicated curved objects into a multitude of geometrically trivial rectangular elements, which in turn, can be used to compute the approximate areas, perimeters and volumes of the more complex objects of interest.

With the advent of technologies that could allow this stratification principle to be reversed and thereby used to create arbitrary shapes from a multitude of individually formed and assembled planar approximations, there was a proliferation of methods proposed which (by combining various basic technologies) allowed for the formation of very complex objects. Most of the recent improvements and refinements of these methods involve using thinner cross sectional elements, varying the lamination methods employed, and discovering ways to more accurately and rapidly generate the needed cross sectional contours. All but a very few of the RP machines and processes developed to date, have been based in some way on this fundamental planar slicing and bonding principle. Differences are found in the materials used, the means by which the planar sections are formed, the manner in which they are laminated and the means for post-processing the completed object. The vast majority of these methods are now collectively referred to as additive processes, to distinguish them from subtractive fabrication methods such as traditional computer numerical control (CNC) machining, which creates parts by removing unwanted material from a block of oversized stock. The various methods can be further delineated and grouped into roughly seven technological categories, all of which are in some type of commercial use to date. These are described in more detail in "Automated Fabrication. Improving Productivity in Manufacturing", Marshall Burns, Prentice Hall Publishers, 1993. They are:

(1) Selective photocuring also known as stereolithography and represented in U.S. Pat. No. 4,575,330 (C. Hull) describes the process of using a laser light source to successively solidify planar sections of the computer model within a container of liquid photopolymer. Another approach, also based on photocuring, is that taken in U.S. Pat. No. 5,287,435 (N. Cohen et. al.) which describes a process whereby a masked light source is used to solidify the photopolymer rather than a laser and providing the advantage of simultaneous exposure of the polymer to the catalyzing energy.

(2) Laser cut sheet lamination, also known as laminated object manufacture, and described in U.S. Pat. No. 4,752,352 (M. Feygin) as the process of using special paper supplied by a roll fed device that is laser cut and laminated to form a wood like model.

(3) Selective laser sintering as represented in U.S. Pat. No. 5,354,414 (M. Feygin) wherein thin layers of a powder material is subjected to focused energy sufficient to induce sintering in the powder.

(4) Particle jetting techniques, also known as ballistic particle manufacture and described in U.S. Pat. No. 4,665,492 (W. Masters) as a method for forming objects from the deposition and fusing of individual droplets of molten material ejected from a computer controlled nozzle.

(5) Robotically guided extrusion as described in U.S. Pat. No. 5,121,329 which creates models by melting a filament of material and extruding it through a computer controlled nozzle.

(6) Droplet deposition on powder which has been commercialized by Soligen, Inc., Northridge, Calif. is based on the jetting of small particles of molten material or binder onto a powder which becomes selectively solidified by the particles.

(7) Three-dimensional welding, metal spaying and robotically guided metal droplet deposition technologies, which are still under development in a number of companies and universities.

Some of the advantages claimed for the additive fabrication technologies, are that they are less wasteful of expensive consumables, that they can leverage state of the art technologies such as lasers, computers and new materials to greater advantage and that they are able to automatically form extremely complex parts. Nevertheless the disadvantages of these prior methods are numerous and include some or all of the following:

The devices involved are, in most cases, quite expensive to acquire and maintain.

They require special types of consumables, which are usually proprietary, costly, sometimes toxic and sometimes limited in terms of their material properties.

They are significantly restricted in terms of the size of objects that they can build, in one operation.

For larger size models, these methods are often much slower than traditional subtractive processes.

They require a specially trained operator and special maintenance.

Once model constructions are begun, they normally cannot be stopped. Therefore it is not possible to temporarily suspend the build process if a priority change requires that a partially completed object be removed from the machine and completed at a later time.

To remove, cleanup, and achieve good surface finishes on parts, often requires considerable manual post processing.

If the original computer model contains imperfections, many systems have difficulties completing the build.

The cost of producing models increases rapidly in proportion to the volume of the object.

Methods for using more common materials and less expensive fabrication devices have also been attempted. Representative of these approaches is a product by the Sparx company (Molndal, Sweden) which is designed to provide a very low cost means of producing, very approximate, prototypes of CAD models. This device is essentially a plotter with a hot cutting tip used to cut sheets of foam material which are then assembled and bonded using registration pins as guides. Because of the staircasing inaccuracies introduced and the inability to handle highly complex objects, the results are not very useful except as a very basic visual 3D rendering aid. A similar method is used by Schroff Development Corporation (Mission, Kans.).

Larger objects have also been produced by laser cutting thin sections of cardboard, or plastic, which are then used to produce skeleton forms of the intended object. These forms are then filled with expanding foam and hand sanded. This method is used by LaserCAMM (Menlo Park, Calif.).

Prior to the emergence of the more sophisticated RP technologies outlined above, there were numerous other attempts to create three dimensional models by planar segmentation and assembly. In many of these methods, the thickness' of the planar elements comprising the model were much greater than those used by current fabricators. These approaches are exemplified in U.S. Pat. No. 2,242,631 (A. Stillman) which described a process of manufacturing reliefs by first forming a rectangular carving block from a plurality of numbered slats which were temporarily clamped together on edge. The block was then carved out to produce a master relief. Reproductions of the master were then made by copying the profile of the individual slats, assembling these and then hand finishing. Apart from the manual operations involved in this method, there was the requirement of using a large number of such slats to reproduce an object with good fidelity. The orientation of the slats also resulted in a large number of seams being presented, which had to be cosmetically treated. The edges of each slat were initially cut square with the base, rather than three-dimensionally carved, and objects having contours on all sides, or objects having voids or complex geometries, could not be made. In U.S. Pat. No. 2,903,390 (Seichi Kojima) the Stillman method is referenced when describing a method for making laminated furniture by means of the stacking and bonding together of cross sectional layers corresponding to the furniture to be made. No new art was contributed in terms of the shaping or assembly of the cross sectional members and therefore all the problems cited above remained. In U.S. Pat. No. 3,301,725 (E. F. Fontera) there is also described a means of creating sculptures by a contour layering process. This method was also an entirely manual one and required large amounts of hand finishing work.

In U.S. Pat. No. 3,932,923 (DiMatteo) a method is described whereby the above approaches were partially automated by means of a contour follower which would trace the XY profile of a master model to be reproduced and use this information to directly drive a cutting device. The cutting device would then reproduce the corresponding XY profile by cutting some type of sheet material. These pieces were then stacked, clamped and bonded. In order to produce smoother surfaces a larger number of cross sections were called for. This approach had numerous problems. The method depended on the existence of a master model for the contour follower and did not provide a means of creating parts directly from computer models. The method only used XY contour information and therefor required the use of a large number of sections in order to yield acceptable surfaces. Because the sections required manual assembly there was the possibility of introducing substantial registration errors. In addition, there was also a failure to account for the kerf (tool offset), which is produced by any cutting tool, so that significant and uncompensated inaccuracies could be introduced during the cutting process. Because of the uncompensated kerf problem, many of the masking and bonding techniques cited in the patent would probably have met with unanticipated failure, the to the adhesive entering unwanted regions and preventing proper separation of parts. The creation of complex geometries which could include void regions, islands, and overhanging portions, also could not be realized using the DiMatteo process.

Reference can also be drawn to U.S. Pat. No. 4,393,450 (R. Jerard) which provides for an automated means of forming a curvilinear shape within a soft material directly under computer control by employing an abrasive wire to cut away portions of an initial block of material while the block is rotated and the wire is translated in two dimensions. This method has many of the same limitations cited earlier. In particular, it requires the building of a special machine which would be limited to constructing objects from soft materials that could be easily and quickly cut using an abrasive wire. The object to be formed would also have to be characterized by simple contours and could not have internal voids, islands, or overhanging components. In addition, because the cutting means consists of a straight segment several inches in length, shapes having multiple protrusions or intricate contour changes (along the prescribed rotational direction) could not be formed.

All earlier attempts to create objects using thicker sections of material have suffered, from among other problems, significant staircasing effects which resulted in the creation of parts having only crude approximations to the desired objects and further requiring a considerable amount of hand finishing to produce acceptable results. Even in the most contemporary of processes, there is still a requirement for some type of manual post-process cleanup, or separation work and therefore no method, yet devised, provides a completely turnkey solution, that does not require a trained operator.

A more recent hybrid approach for providing rapid prototyping capability using both subtractive and additive fabrication is described in U.S. Pat. No. 5,398,193 (deAngelis). This method combines selective deposition of a principal material together with a complementary support material followed by the removal of selected portions of both deposited materials. However several potential disadvantages of this method can be listed:

The method does not enable object formation by subtractive machining alone.

The method does not indicate how, or if, existing machines could be used exclusively in the process.

The method does not require or indicate the possible advantages of using multiple machines to accomplish the construction.

The method only permits machining the uppermost surface of each layer.

The method does not attempt to orient the computer model in an optimal manner prior to fabrication.

The method does not indicate how the predetermined thickness(es) for each layer are determined.

The method fails to describe any novel provisions in the invention, implying that of the invention, implying that it utilizes exclusively two dimensional slice contours.

The additive means consists of selective localized deposition rather than using complete slabs of pre-formed material having a substantial thickness.

The method requires the use of complementary materials for support purposes.

The method does not use the Z axis for purposes other than indexing through layers of material.

The method does not provide for the use of machines having more than three axes of motion and therefore fails to exploit their numerous advantages.

Cost Comparison

Even though it is difficult to make generalizations regarding costs covering a wide range of technologies in most of the RP processes referred to above, we can apply scaling analysis to describe the dynamics of costs associated with manufacturing objects of different sizes. Such an analysis can provide a cost metric for comparison purposes. There are basically three costs to be considered when evaluating RP technologies. These are the hardware/software acquisition costs, the labor costs associated with operation of the machines, and the costs for consumables and maintenance. In general the cost for labor and overhead can be assumed to be approximately three to four times the cost for consumables as measured on a per hour of machine time basis. If we simplify the analysis somewhat further by entirely ignoring the cost of acquisition, then the problem can be reduced to one of considering only the build time required. We can furthermore assume that the longer the machine operates, the more material will be consumed. In almost all prior art processes cited, the time required for object formation increases in proportion to the thickness and average cross sectional area of the object. These variables are in turn proportional to the volume of the object. In addition, the material consumed in the build is also directly related to the volume of the object. Since the volume of an object increases with the cube of its linear size factor, it could reasonably be expected that as the size of an object triples, its volume and thereby fabrication cost would rise by a factor of 27. This estimate is in fact a fairly good approximation for the actual build costs which a user would encounter. Now, we can also apply the same cost analysis to a method wherein the build time is dependent on the surface area of the object to be built rather than its volume. This would be the case for traditional CNC subtractive machining. Although the material cost would still be dependent on volume, the materials used in CNC machining would be expected to cost considerably less than those used in the additive processes described herein above, and they would most likely cost significantly less than one third that of the other hourly amortized expenditures. Under these assumptions CNC fabrication should result in an object of triple size costing less than half that produced by additive fabrication. This cost differential, could be even larger if the rate of subtractive machining were substantially higher than that for additive fabrication. Indeed various users of both RP and CNC report that in some cases CNC can produce a part in ¹/₁₀'th the time required by RP. References relating to the superior speed advantages of conventional CNC can be found in articles such as, *Rapid Prototypes for Production Parts*; Paul Dvorak, Machine Design; October 1993, *Rapid Product Realization*; Joanne Wolfe; Plastics Design Forum; May 1994, *CNC Machining As A Rapid Prototyping Technique*; Rob Hassold; Modern Machine Shop; October 1995. In addition, subtractive fabrication also results in significantly greater accuracy as is reported in: *Other Routes To Rapid Protoypes*; Paul Dvorak; Machine Design; June 1992. In particular, for larger parts, we can clearly see that if an automated subtractive fabrication process, suitable for creating more complex objects, were made available; it could offer significant economic benefits over that afforded by the additive fabricators, especially from an operational standpoint.

To date, no method has been proposed which has fully exploited subtractive fabrication in order to extend its capabilities to allow the creation of complex computer models having all manner of inner voids, inner components and overhanging portions. The need therefore exists for a method which will allow such larger and more complex objects to be created within a CAD/CAM system tied to a subtractive machining process.

SUMMARY OF THE INVENTION

It is the general object of the present invention to provide a process for creating three-dimensional models and mock-ups of arbitrary size directly from computer designed models using a wide variety of low cost, readily available materials. This and other objects of the present invention are achieved by using either existing or specially designed subtractive fabrication machines and providing the appropriate software and methodology to optimally section a complex model, in such a manner that it can be constructed by lamination of a minimal number of substantially thick and specially machined slabs, containing portions of the object and having preferably uniform outer profiles which enable simple alignment, containment and lamination of the individual sections. It is another object of the present invention to provide a comprehensive teaching on the method for producing rapid prototypes using CNC machine tools. It is a further object of the present invention to provide a process whereby the large installed base of standard machining centers can be utilized more efficiently and effectively to create a broader spectrum of objects than currently feasible. It is a further object of the invention to allow low cost fabrication of models with high quality surface finishes, for educational, artistic and hobby use.

Yet another object of the present invention is to indicate to operators the most economical method for fabricating a complex model given the availability of multiple technologies. Still another object of the invention is to provide a visual verification of the fabrication process by means of computer generated renderings of the various stages of the process in such a manner as to allow the object formation process to be seen as it would appear during the manufacturing process. Yet another object of the invention is to provide a means for generating wax models having integral sprues and parting surfaces which could be used in investment casting or for creating rubber or plaster molds. Still further objects and advantages will become apparent from a consideration of the ensuing description and accompanying drawings.

DRAWINGS

FIG. 3a is an isometric illustration of a fabrication station forming the underside surfaces of the first section of a model;

FIG. 3b is an isometric illustration showing the second fabrication station idle in preparation for receiving the first section seen in FIG. 3a from the first fabrication station;

FIG. 3c is an isometric illustration showing the first fabrication station cutting the underside surfaces for the second section of the model;

FIG. 3d is an isometric illustration showing the second fabrication station processing the upper surfaces of the inverted first section received from the machine in FIG. 3a;

FIG. 11c shows an investment mold created from model in FIG. 11a;

FIG. 16a is an illustration of the partial octree partition of a cubic bounding box;

FIG. 16b is an illustration of the organization of the octree data for FIG. 16a, showing the eight subdivisions for each level and the linked list used to store the tessellation or surface portion data;

FIG. 17 shows Z-rays piercing the partitioned model and yielding a linked list of intersection data;

FIG. 28 shows the use of a radiant heat source as a method of heating and melting the upper most portion of a slab fabricated from a wax or thermoplastic material so that it can be made to adhere to the next layer placed onto it;

FIG. 29 shows the use of a heated air stream to melt the uppermost surfaces of a slab made from a wax or thermoplastic material prior to affixing the succeeding slab;

FIG. 30a is an illustration of the front side of a two dimensional isometric rendering on paper which conveys the appearance of one completed slab;

FIG. 30b is an illustration of the bottom of the slab as rendered isometrically on the back side of the paper shown in FIG. 30a;

DETAILED DESCRIPTION OF THE INVENTION

The description of the present invention will proceed from a consideration of general principles to a detailed exposition of each embodiment of the invention, in such a manner as to enable anyone skilled in the art to make or use the invention disclosed herein.

The rapid prototyping method described in the present invention will comprise the following subsystems:

(a) A computer and controls subsystem.
(b) At least one subtractive fabrication machine having at least three axes of motion, for the fabrication of a number of predetermined slabs, prepared from a variety of materials.
(c) A set of algorithms which are used to specify the optimal slicing and fabricating steps which will enable the 3D model to be faithfully fabricated from a minimum number of slabs within existing machine constraints and allowing for the creation of supporting membranes, embedded gating and parting surfaces.
(d) An illustration and verification method for visually previewing results of the above algorithms and showing the correct construction sequence and appearance for each fabricated layer.

Fabrication Process

Figure 1:
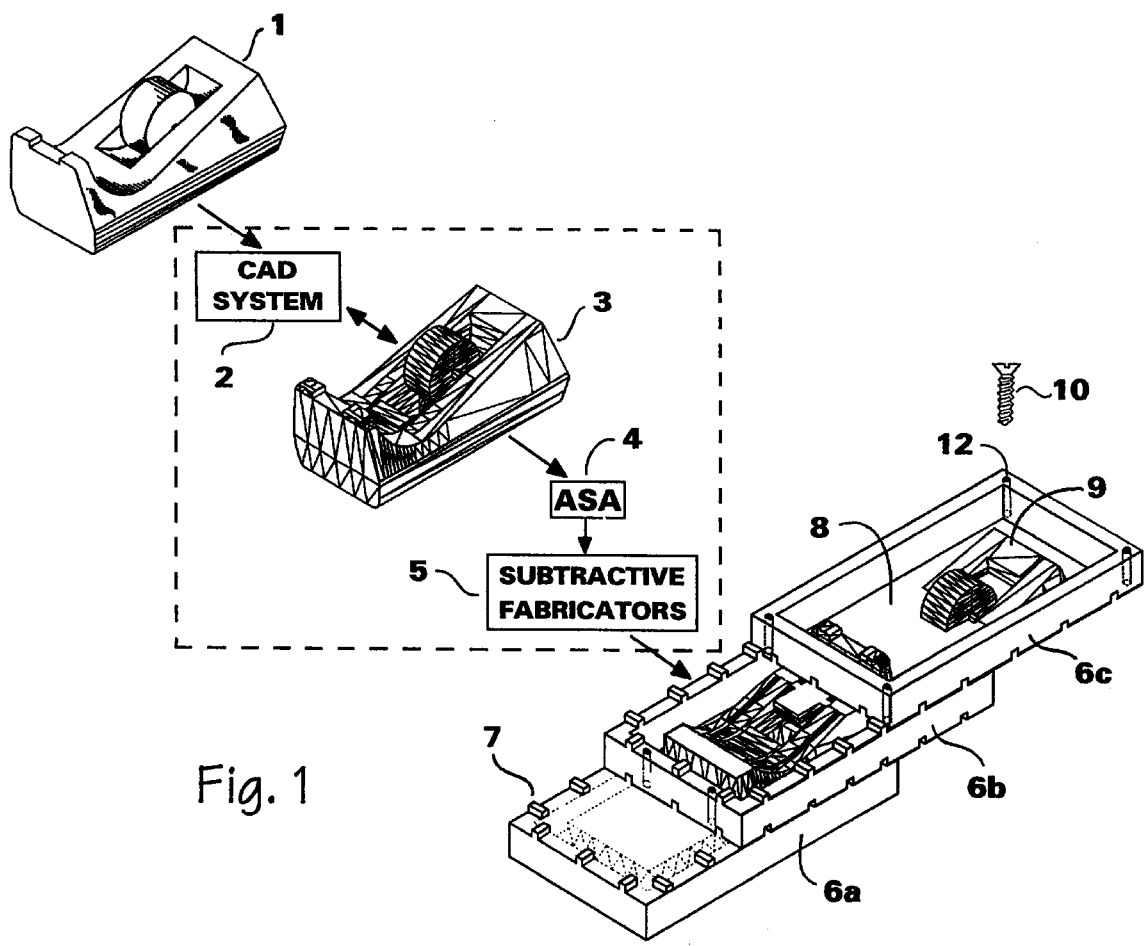
FIG. 1 is an isometric drawing of the overall process where the model represented in a CAD/CAM system is formed into a three-dimensional object comprised of a number of thick machined slabs having integral support membranes, outer frames and optional striations.

By reference now to the drawings, wherein like reference numerals refer to similar or identical parts throughout the several views and more specifically to FIG. 1 which generally illustrates the three stages of a preferred embodiment of the 3D model creation process. The process comprises the steps of representing an object 1 within a computer CAD/CAM system 2 by any of a number of mathematical descriptions/models 3 well known to those practiced in the art, such as the tessellated approximation shown. Since model 3 within CAD/CAM system 2 is equivalent to object 1 for the purposes of the present invention, it will be understood that they may be used interchangeably without loss of meaning. Object 1 and model 3 may also represent a plurality of nested but disjoint objects which are to be fabricated in the same process, since the invention is capable of fabricating such objects as well. Furthermore, model 3 could optionally include auxiliary components intended to provide additional structural support should this be desired.

Model 3 is utilized during the various fabrication stages to determine optimal strategies for fabricating object 1 from a plurality of slabs 6a, 6b, 6c, such that all surfaces of model 3 both external and internal, will be faithfully reproduced upon assembly. The process of optimally slicing model 3 into machinable sections, is performed by an adaptive sectioning algorithm/ASA 4. Data from ASA 4 is sent to a fabrication path generator which determines the fabrication paths necessary to form each slab 6. The fabrication path generator also advises the operator should problems arise and will suggest options which will allow the fabrication to proceed. A number of subtractive fabricators 5 are then driven by the data provided from the fabrication path algorithm to form each slab 6.

As is illustrated by slab 6c, there is provided in accordance with a preferred embodiment of the present invention a method of supporting and positionally restraining intermediate portions of model 3 which may become isolated components 9 during the formation process by embedding these components 9 within a thin support membrane 8 which is automatically prescribed and fabricated under the direction of the computer control program to be described in greater detail hereinafter. It is further seen that in accordance with one preferred embodiment of the present invention, slabs 6a, 6b, 6c are sequentially assembled and bonded to form a composite structure containing embedded object 1. In accordance with another embodiment of the present invention, slabs 6a, 6b, 6c may also be temporarily secured during bonding by any number of threaded shafts/screws 10 through a plurality of registration holes 12 which are automatically provided along the periphery of slabs 6a, 6b, 6c.

Figure 2:
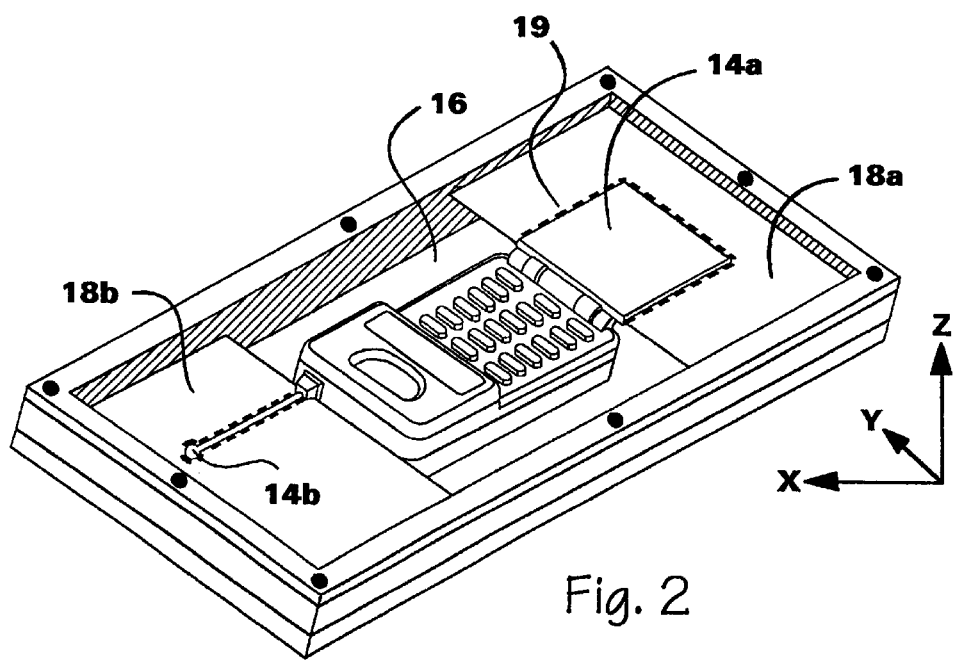
FIG. 2 shows an isometric drawing of a more complex model having overhanging components which require the preservation of two additional intermediate support membranes.

Referring now to FIG. 2 we see an illustration of the end result of applying the above general principle of construction to an object having moderate complexity and overhanging components 14a, 14b. A thin principal support membrane 8 within the first layer is augmented by thin auxiliary support membranes 18a and 18b which are automatically determined and fabricated and can include optional perforations 19 added along the outer peripheral edges of the supported portions.

FIG'S. 3a, 3b, 3c, 3d, 3e, 3f, 3g, 3h illustrate in greater detail a preferred embodiment of the progressive fabrication process which creates object 1 from slabs 6a, 6b, 6c with the use of a tandem pair of fabrication stations 20a and 20b. Such fabrication stations could be individual CNC type milling machines such as the machines available from Fadal Engineering of Chatsworth, Calif. or they could be much larger gantry type units such as those made by Quickmill Inc. of Buffalo, N.Y. The machines could also consist of specially designed tandem units, such as those made by Mikron Corp. of Monroe, Conn.

Fabrication station 20a of FIG. 3a is capable of at least three axes of motion and is provided with a fabrication head 21 which can have additional degrees of freedom such as would be the case for a five axes type CNC machine. Fabrication head 21 can utilize any type of available subtractive machining technology such as milling or laser cutting, in order to form slabs 6a, 6b, 6c.

Inverted first slab 6a is secured by a suitable standard fixturing mechanism 22 which is not an embodiment of the present invention and can be provided by any manner of sliding, anchoring, clamping, bracketing, magnetic holding, vacuum holding, motor driven vise or other common mode of fixturing known in the art of machining. Fixturing mechanism 22 will therefor be regarded as a component of the fabrication apparatus and will not be illustrated or referred to in succeeding figures.

Slab 6a is machined to conform to the underside surfaces of the lowest portion of model 3 preferably together with a principal support membrane 8. As can be further seen in FIG. 3a, a frame 24 is preferably created during the fabrication process which has a preferably predetermined and uniform outer contour consisting of a sufficient and predetermined width of material whose upper and lower faces are preferably, planar, level and parallel to the base of fabrication machine 20. In keeping with the preferred embodiment of the present invention, frame 24 is preserved during the entire fabrication process so as to allow the accurate registration and bonding of succeeding layers. According to another embodiment of the present invention, frame 24 can also be automatically provided with a series of alignment striations 7 illustrated in FIG. 1 and positioned along the periphery of frame 24 in such an arrangement as to permit the successive slabs 6 to mesh and thereby to be easily aligned, secured, and fastened into place, without the need for registration pins. In order to provide such striations 7 it is necessary for the computer control program to instruct the fabrication path algorithm to allow each slab 6 to be thickened by an amount corresponding to the height of the ridges to be machined along the top and bottom boundaries of each frame 24 while restoring the thickness prescribed by ASA 4 on the interior portions of each slab 6.

Figure 3F:
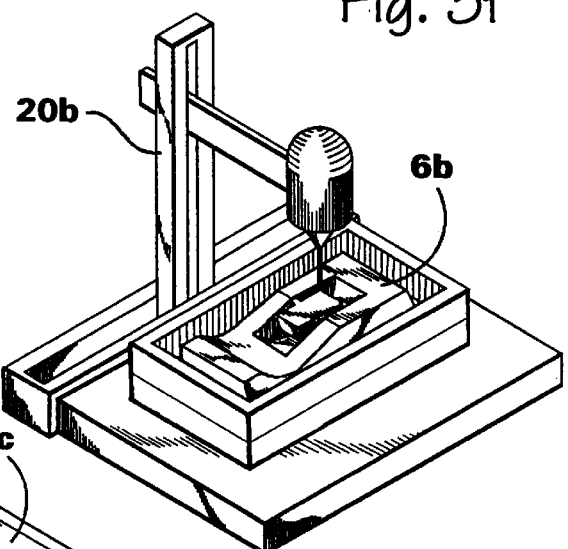
FIG. 3f is an isometric illustration showing the second fabrication station processing the upper surfaces of the inverted second section received from the machine in FIG. 3c after it has been attached to the top of the preceding slab.
Figure 3E:
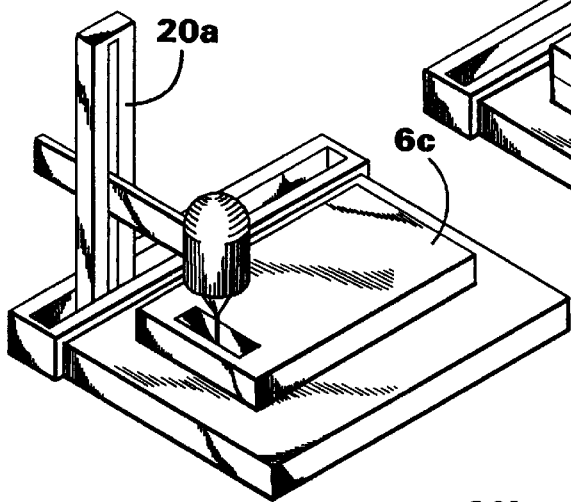
FIG. 3e is an isometric illustration showing the first fabrication station processing the underside surfaces of the third section of the model.
Figure 3H:
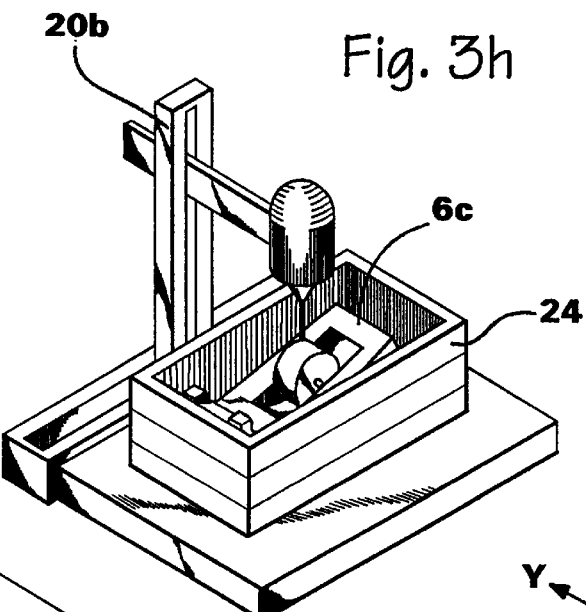
FIG. 3h is an illustration showing the second fabrication station completing the formation of the upper surfaces of the inverted final section received from the machine in FIG. 3e after it has been attached to the top of the preceding slab.
Figure 3G:
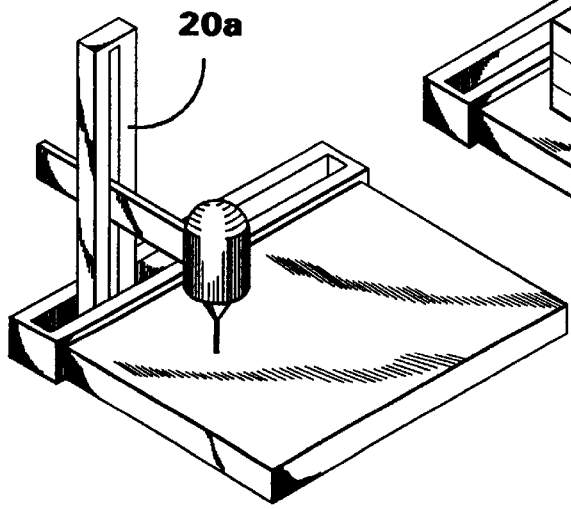
FIG. 3g is an isometric illustration showing the first fabrication station finished and now idle.

Reference is now made to FIG. 3b which illustrates fabrication station 20b temporarily idle in preparation for receiving slab 6a from first fabrication station 20a. FIG. 3c shows first fabrication station 20a machining the underside of slab 6b while in FIG. 3d second fabrication station 20b is shown simultaneously completing work on the upper surfaces of slab 6a which has been transferred and inverted from first fabrication station 20a by either manual or automated conveyance. FIG. 3e shows fabrication station 20a preparing the underside of slab 6c. In FIG. 3f fabrication station 20b is shown completing work on the upper surfaces of slab 6b which has been transferred from station 20a and then inverted and bonded to previous slab 6a. The bonding can be achieved using a standard adhesive and with or without additional mechanical fastening. According to one embodiment of the invention, the mechanical fastening is achieved by using registration pins, screws and or striations, set into frame 24 in such a way as to allow the fabrication process to continue while the adhesive layer is setting. The preferred use of a cyanoacrylate type adhesive would hasten the setting time and eliminate the need for mechanical fastening. After completing formation of the surfaces comprising slab 6b the computer control program can then direct the fabrication station 20b to automatically remove support membrane 8 from second layer slab 6b since it is no longer required to provide support and immobilization of the components therein. Membrane 8 removal preferably proceeds in such a manner as to permit the thin edges of membrane 8 to be shaped so as to conform and match as closely as possible the shape and curvature of the surfaces on either side of each membrane 8. Membrane 8 removal is preferably conditional on the membrane not being that of the first slab and not being required to provide support for overhanging model components 14. Referring now to FIG. 3g fabrication station 20a is shown idle having completed fabrication of the underside portion of final slab 6c. In FIG. 3h slab 6c has been transferred from station 20a and affixed to prior slab 6b on fabrication station 20b which is shown completing the final machining of the remaining surfaces of model 3. Model 3 is then ready to be removed from the composite structure comprised of frame 24 and lower support membrane 8.

Figure 4:
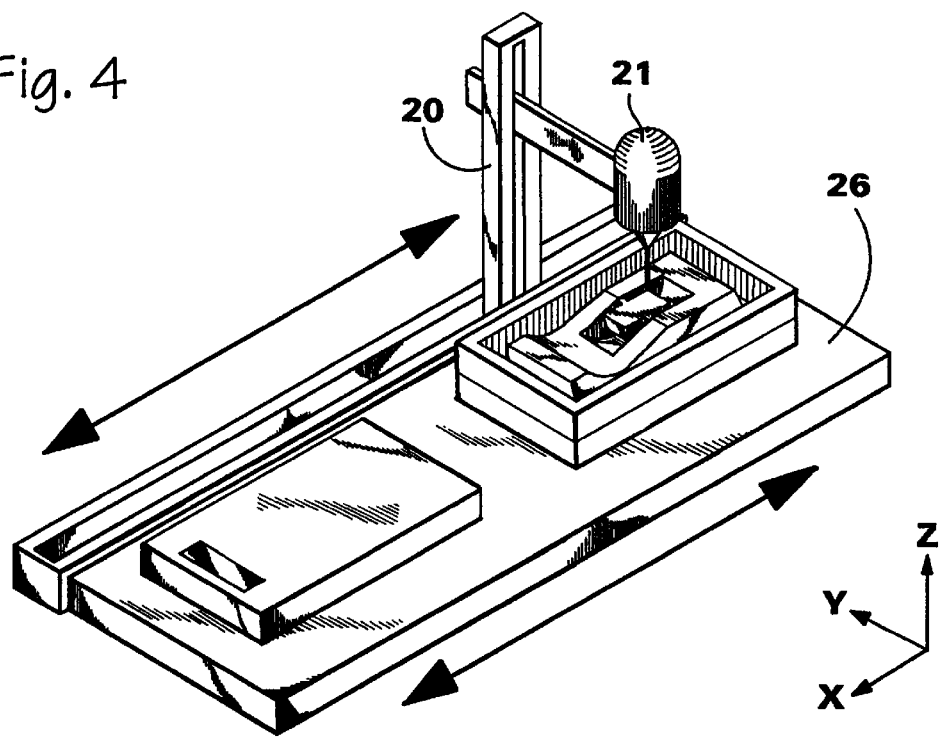
FIG. 4 is an isometric illustration showing the tandem fabrication of slabs using a single fabrication station by translation of either the fixturing table or tool.
Figure 5:
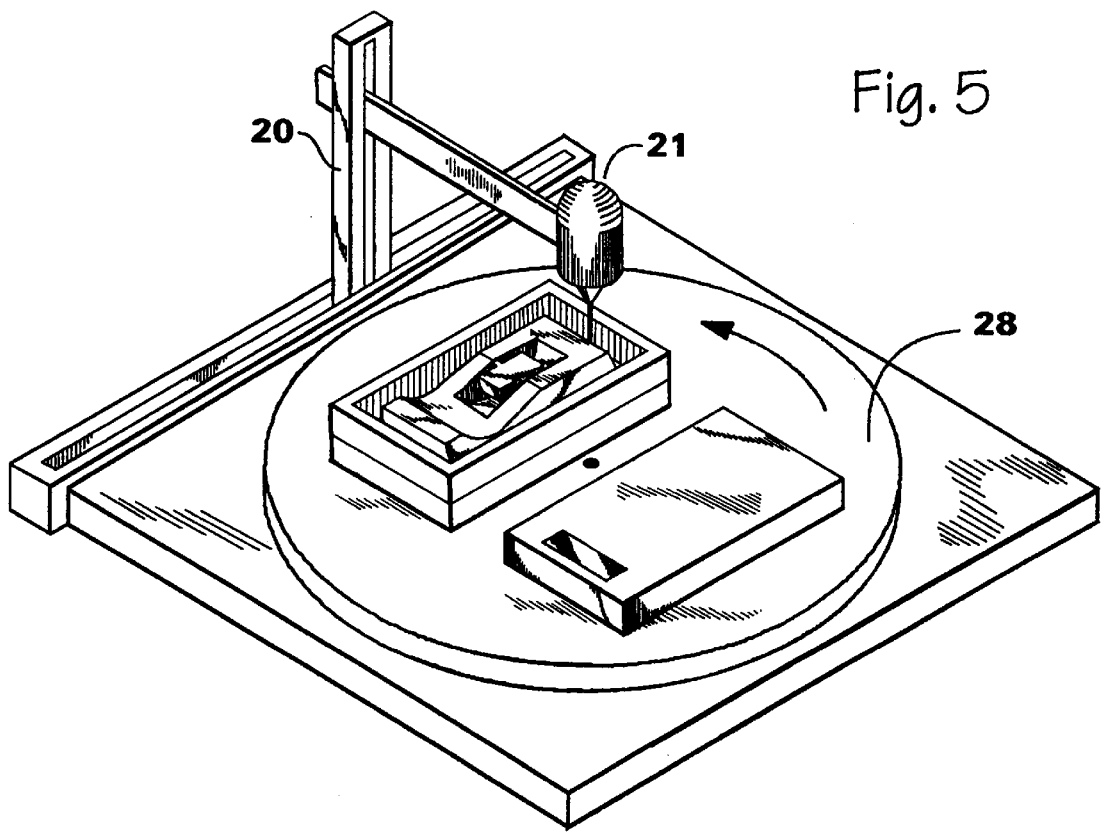
FIG. 5 is an isometric illustration showing the tandem fabrication of slabs by alternating the slabs on a rotating fixturing table.

The preferred embodiments described herein above, in which tandem fabrication occurs utilizing dual machining stations, is of advantage only in that it allows for a significant increase in the speed of construction and is therefore not a strict requirement of the present invention. Other methods for achieving similar results which would be within the scope of the present invention include the use of one fabrication station 20 as shown in FIG. 4 having a mechanism to allow alternating operations on each work piece using an extended travel fixturing table 26 or by equivalently allowing fabrication head 21 to travel between workpieces. Still another embodiment of the present invention is shown in FIG. 5 in which a tandem fabrication capability is provided by using one fabrication station 20 which incorporates a rotational fixturing and transferring table 28. It is also possible, in keeping with yet another embodiment of the present invention, to carry out the construction using only a single fabrication station 20 without modifications, as will be better understood by referring once again to FIG. 3f. Accordingly, machine 20b can be used exclusively, by allowing each slab 6 to be temporarily fastened onto the preceding layer, whereby the underside surfaces of each slab 6 can be formed. Each successive slab 6 is then inverted and preferably bonded to preceding slab 6 whereupon the process continues as previously described. Such an approach, however, will reduce construction speed by about 50%.

Still other methods for providing tandem fabrication capability which are known within the art, can be substituted for those methods described above without deviating significantly from the main embodiments of the present invention.

We will now consider in further detail the use of support membranes 8 as further embodied in the present invention. Supporting membranes 8 which are preferably an integral component within each slab 6 are comprised of three basic types which are determined by the computer control program. Such membranes 8 are provided to increase rigidity, immobilize components, and provide for a number of molding options. The three types of supporting membranes 8 can be further described as follows:

(a) A thin supporting membrane 8 consisting of a uniformly thin surface extending outwardly from one or more components within slab 6 to frame 24 as illustrated in FIG. 1

Figure 6:
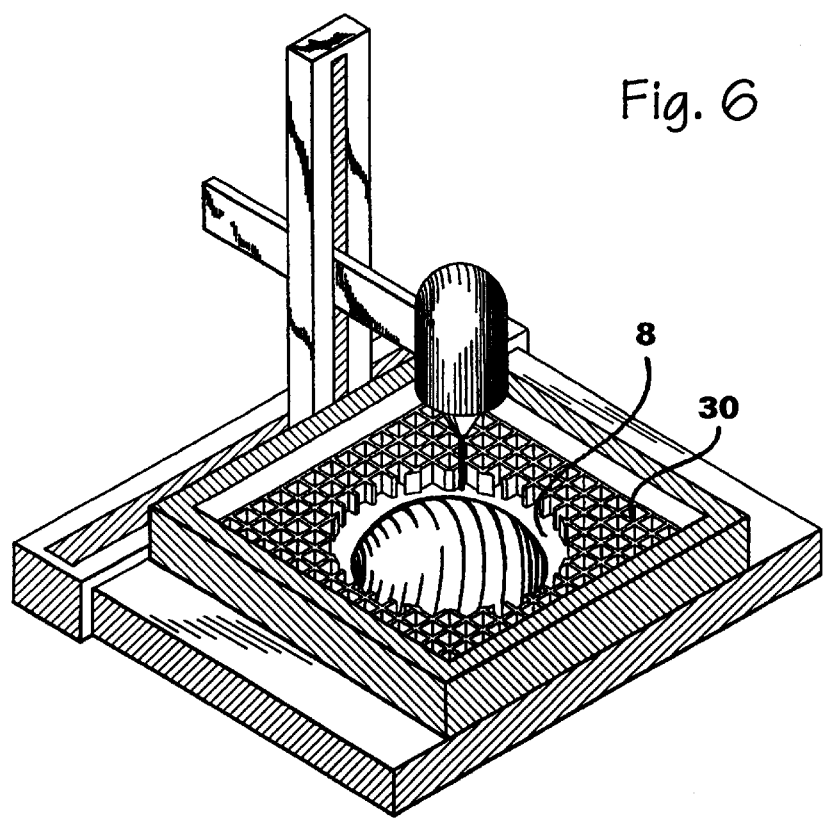
FIG. 6 is an isometric illustration of an enhanced ribbed support structure and clearance membrane.

(b) A thin supporting membrane 8 having a narrow width which serves as a tool clearance area and which is augmented by a mesh like or ribbed support structure 30 extending to outer frame 24 as is shown in FIG. 6 and which provides increased rigidity during fabrication. Ribbed support structure 30 also serves to limit the amount of material consumed when an investment casting is to be made in which a portion of the supporting structure is to be retained to provide entrance paths for the casting material.

Figure 7:
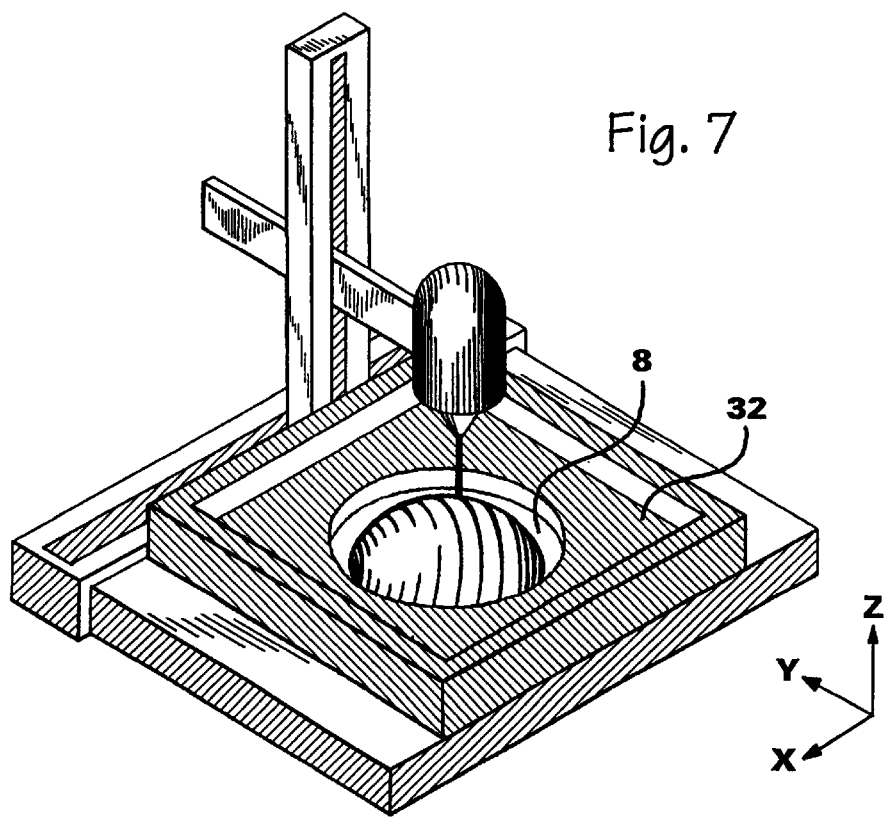
FIG. 7 is an isometric illustration of an enhanced support structure having a thin clearance membrane and thicker main support.

(c) A thin supporting membrane 8 having a preferably narrow width and which is augmented by a substantially thickened and solid support structure 32 as shown in FIG. 7. Thickened support structure 32 extends from the thinner inner support membrane 8 to outer frame 24 in such a manner as to provide greatly increased rigidity, while reducing fabrication time.

Figure 8:
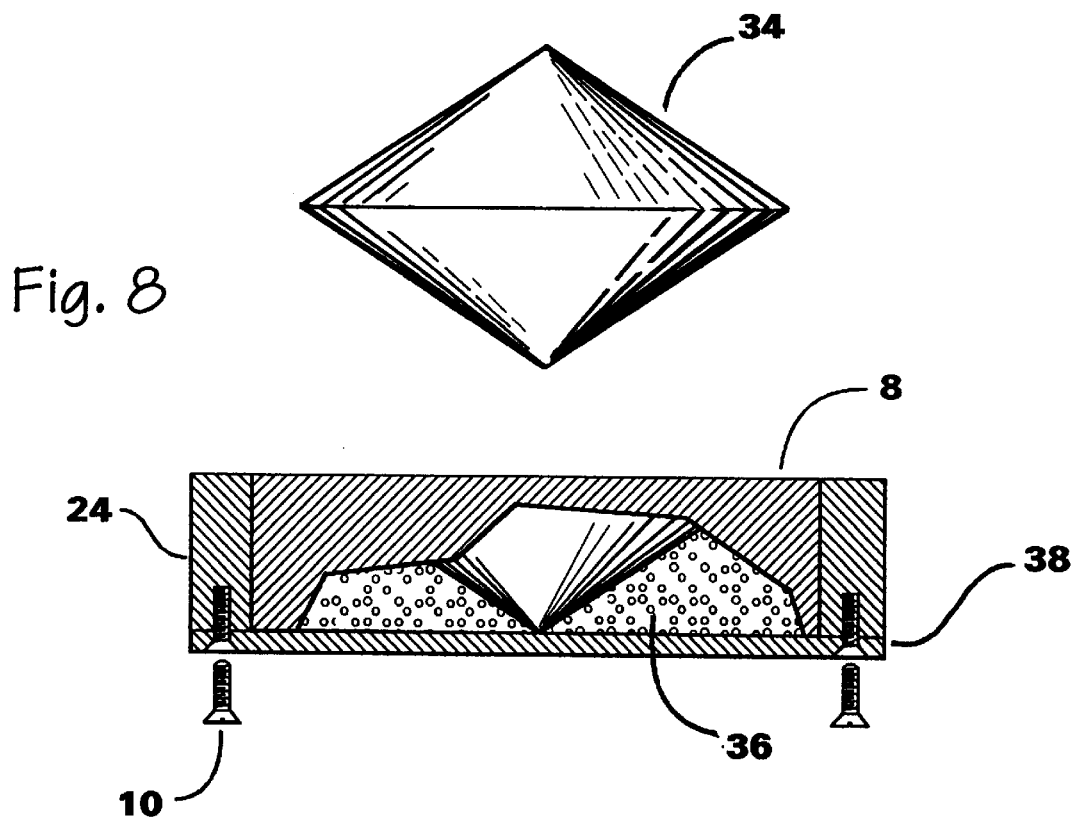
FIG. 8 is an illustration of a method for providing enhanced support for objects which lack a sufficiently broad natural base through the utilization of a granular or power based media which is packed into the underside voids of the first section and temporarily sealed by means of a removable flat cover plate.

It is sometimes the case that an object such as conical object 34 shown in FIG. 8, is to be created in its preferred orientation which is lacking of any substantial planar lower surface which could be used to help provide increased support when fabricating higher level surfaces. Although it is possible to use the augmented support structures 30 and 32 previously described to significantly reduce the instability of such a structure, in yet another embodiment of the present invention another method for increasing support for first slab 6a is provided by filling the void regions between support membrane 8 and the lower edges of outer frame 24 with one of a number of easily removable filler material 36, such as sand, powder, foam, wax, plaster, or other soluble compound, in such a manner as to provide a plane and level surface which is flush with the lower faces of frame 24. In the case that such material is not firmly set in place such as with the use of sand, a planar cover plate 38 can be secured by screws 10 or with a temporary adhesive so as to result in a broader and firmer support base upon which other operations can be performed without resulting in unacceptable deformation of the principal support membrane 8 and thereby ensuring a high accuracy in the succeeding steps of the process.

Figure 9:
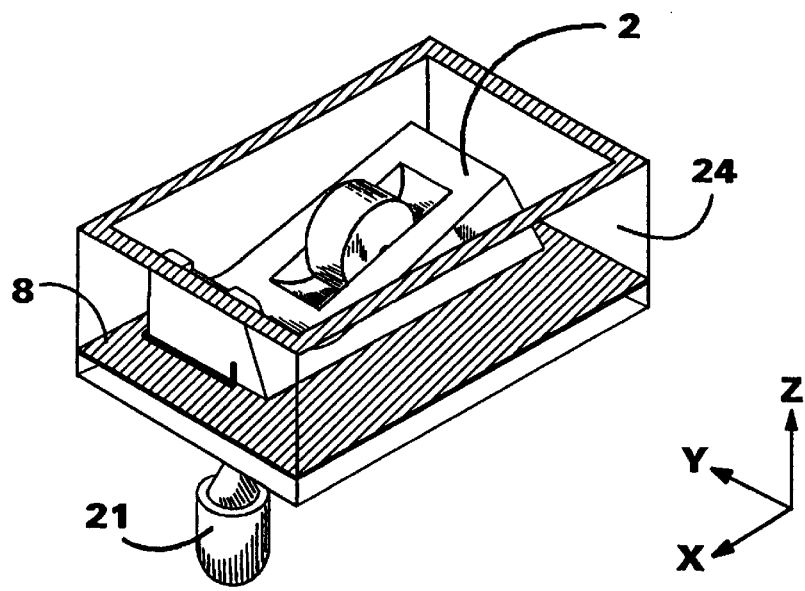
FIG. 9 shows the completed object being removed from its support membrane.

Upon completing all steps of the fabrication process, the result will be object 1 suspended by typically a single lower support membrane 8 within outer frame 24 which is to be removed in the final step of the process as shown in FIG. 9. The removal of object 1 from the composite structure can be accomplished by any of a number of procedures such as manual cutting or automated trimming using fabrication station 20. Upon removal of object 1 there can be additional surface finishing and treatments applied such as filing, hand sanding and the application of sealers and paints. In the case where object 1 is created as a preliminary step for a casting process, a portion of the membrane may be retained as an integral part of the model as illustrated in FIGS. 10–13.

Figure 10A:
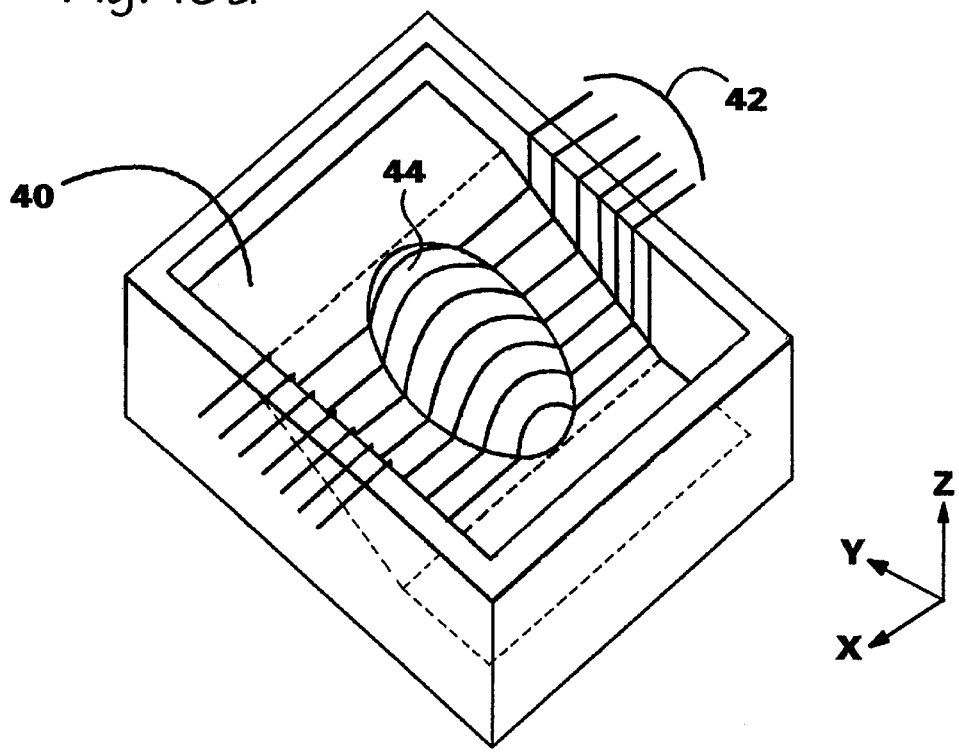
FIG. 10a shows the non-planar support membrane/parting surface and the cutter paths which can be used to form an obliquely oriented shape within a single slab.
Figure 10B:
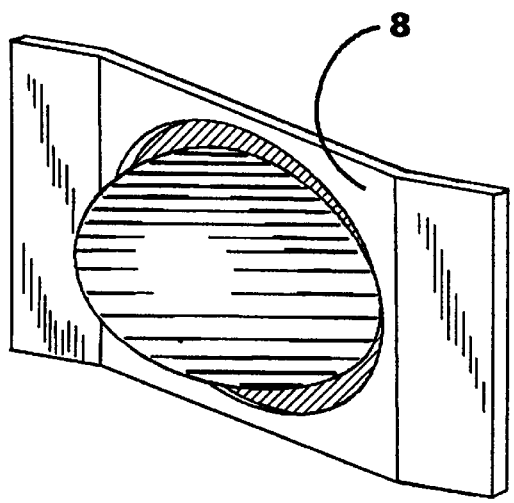
FIG. 10b shows the shape of FIG. 10a with parting flange, removed from support frame and ready for mold creation.
Figure 10C:
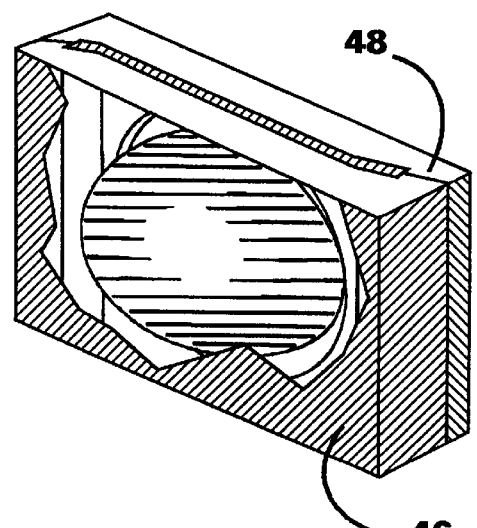
FIG. 10c shows a casting mold with protruding membrane on one side and parting surfaces extending from the membrane.

Reference is now made to FIG. 10a which illustrates a non-planar support membrane 40 and the associated fabrication paths for an obliquely oriented oblong object 44. FIG. 10b shows the oblong object 44 removed from frame 24 but retaining a portion of support membrane 8. In accordance with one embodiment of the present invention this is done in preparation for the object to be used to create an injection type mold 46. The membrane portion is trimmed to be consistent with the size of the mold to be made. A mold is then fashioned from the composite object formed from oblong object 44 together with the portion of its support membrane 8 as shown in FIG. 10c. A portion of support membrane 8 can thereby be used to provide an entrance port for the molten material to be injected while the remaining portions can serve as parting line guides. The parting line guides will then be joined with a set of extended parting surfaces 48 so that the mold can be easily separated and the cast part removed.

Figure 11A:
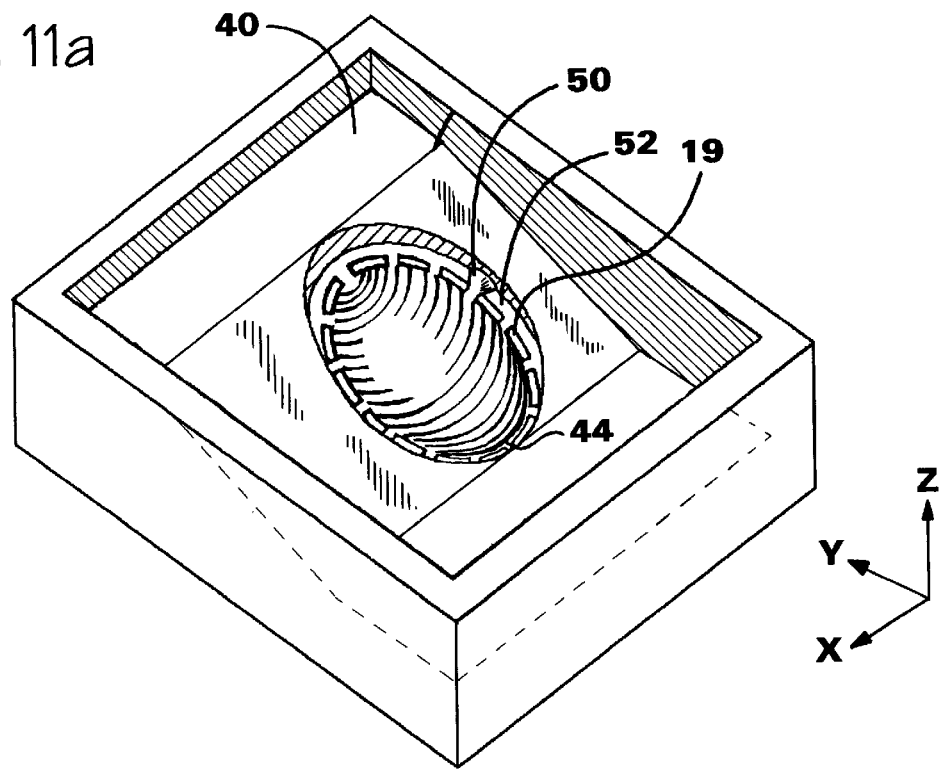
FIG. 11a shows the object of FIG. 10a with a perforated support membrane/parting surface for use in an investment casting mold or to permit simpler removal of the model.
Figure 11B:
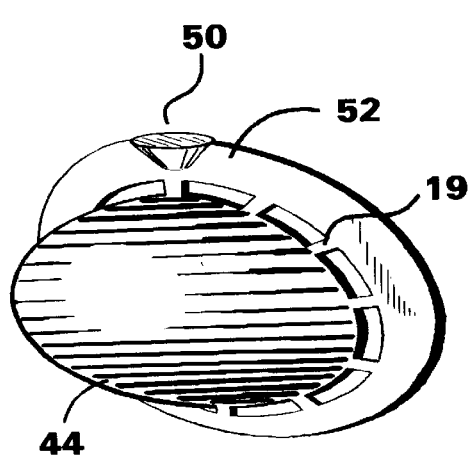
FIG. 11b shows the shape from FIG. 11a removed from the support frame and ready for mold creation, having various auxiliary mold making features, such as sprues, runners, parting surfaces, funnels, etc.
Figure 11C:
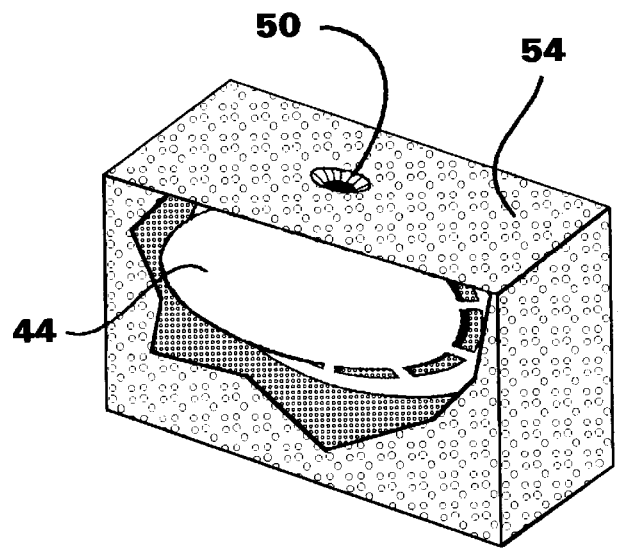

In FIG. 11a oblong object 44 is shown supported by non-planar membrane 40 having a thin annular rim 52, a perforated edge 19 and a funnel 50 as auxiliary integral components. The auxiliary structures are optionally and automatically added by the computer control program as directed by operator specified parameters in accordance with one preferred embodiment of the present invention. Support membrane 40 is then substantially trimmed to the outer edge of rim 52 while funnel 50 is retained, as shown in FIG. 11b. Support rim 52 will later function as both a runner and parting surface in mold 54, while perforations 19 will function as sprues, allowing molten material to enter the mold cavity. FIG. 11c now shows oblong object 44 together with its filler funnel 50 and support rim 52 encased within an investment type mold 54 which will be fired so as to eliminate entirely oblong object 44 and thereby form the complementary void necessary for the investment casting process. The materials used for object fabrication in the case of investment casting, would normally consist of wax or styrene foam.

Figure 12:
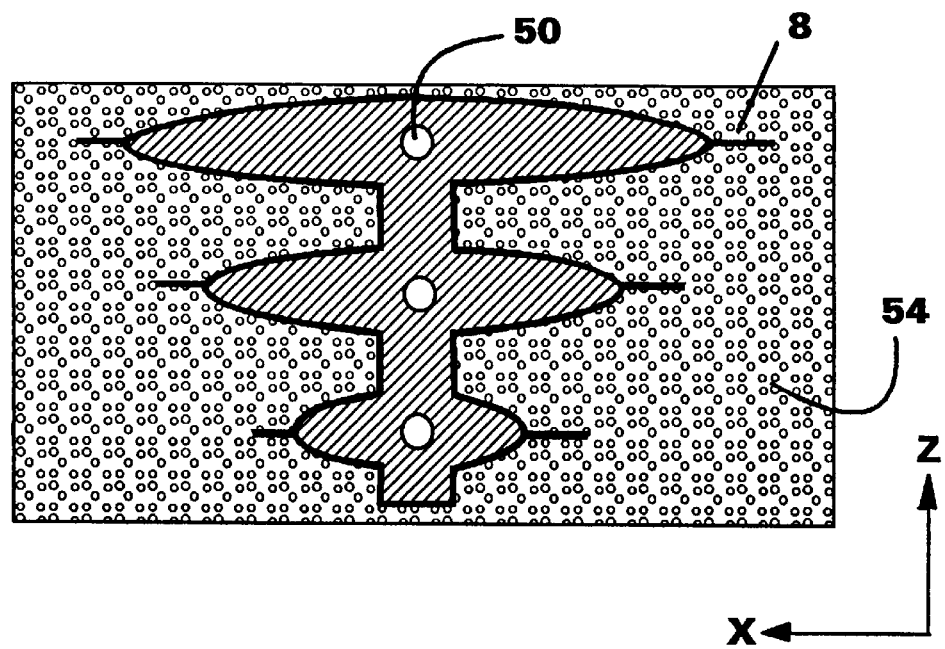
FIG. 12 is an illustration of a complex multi-segment investment mold with multiple partially trimmed parting surfaces.
Figure 13:
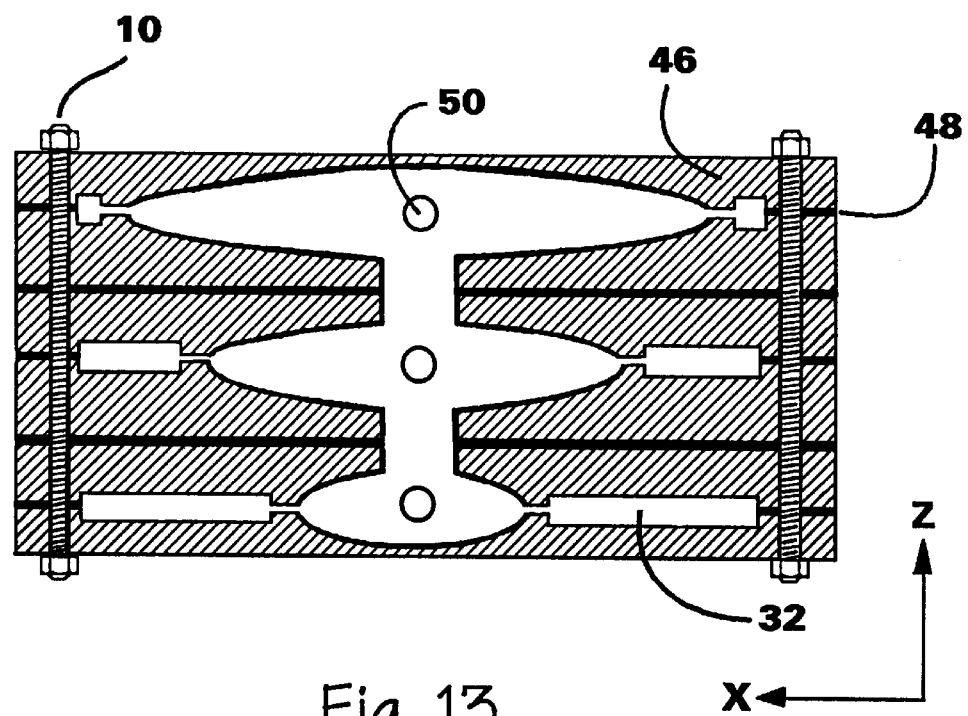
FIG. 13 is an illustration of a complex multi-segment injection mold having multiple parting surfaces determined by the support membrane geometry.

Reference is now made to FIG. 12 which illustrates a more complex investment mold 54 which includes multiple support membranes 8, and multiple filler ports 50. FIG. 13 is an illustration of a similar complex injection type mold 46 which includes multiple thickened support membranes 32, multiple filler ports 50 and multiple parting surfaces 48 which are held together by means of threaded shaft 10. It is therefore understood that the present invention can be used to create various types of molds, including those having multiple fill ports and/or multiple parting surfaces.

Computer Control Algorithms

The algorithms which comprise the computer control program, will now be explained in greater detail. This explanation will be aided by reference first to FIG. 14 which shows a hemispherical shell 56 as represented by tessellated approximation 3 consisting of a large number of triangular facets 58. Shell 56 is further illustrated being pierced by a vertical line segment which will be henceforth referred to as a Z-ray 60 and which can also be described as a vector parallel to the Z-axis of fabrication station 20. Z-ray 60 is further seen to intersect two pair of inner and outer facets 58. In this particular case Z-ray 60 will be said to have an intersection count of four with shell 56. In the more general case shown in FIG. 15 a portion of an arbitrary object, is seen to comprise four mathematically described surfaces 62 which could be of a type nurbs, bezier, coons, facets 58, etc. We can see by way of this illustration, that gaps 64 separate surfaces 62 and that a single Z-ray 60 can easily pass through a gap 64 and therefore not intersect any surface 62. Therefore according to one embodiment of the present invention a remedy for this potential problem is provided by using the concept of a Z-ray bundle 66 which is a cylindrical arrangement of a large number of individual Z-rays 60 having a variable diameter which is dependent on an operator specified gap tolerance or parameter. The effect of having multiple Z-rays 60 intersecting surfaces 62 can be seen by the fact that at least some ray/surface intersections 68 can be found even when many Z-rays 60 fail to intersect any surface 62. The ray/surface intersection count for a Z-ray bundle 66 piercing such an arbitrary object, will then be defined to be the maximum number of intersections found for any single Z-ray 60 within Z-ray bundle 66. The intersection count is an important principle which is used in one embodiment of the partitioning algorithm, as will be described in greater detail hereinafter.

The general set of algorithms particularly suited to providing the information required to enable the further embodiments of the present invention will be henceforth collectively referred to as "adaptive sectioning algorithms" or ASA 4. Slabs 6 are fabricated using a number of subtractive fabrication stations 20 each having a plurality of degrees of freedom. The fabrication process is thereby driven from data generated by an ASA 4 appropriate for the particular type of machine to be used. A five axes ASA 4 will therefore be more versatile than a three axes ASA 4 but may also execute much slower owing to the increased complexities introduced by having additional degrees of freedom. Therefore in general it is desirable to utilize algorithms optimized for the particular fabricator to be used. It is sufficient for the purposes of gaining a complete understanding of the present invention, that an exemplary algorithm having this basic functionality be clearly described.

In order to establish a framework by which to describe the ASA 4 of the present invention, it is useful to explain the concept of an octree hierarchy, which is a well known method for organizing data associated with spatial distributions of information. Though other methods for organizing and storing data associated with CAD models can be used to develop an ASA 4 that would be within the scope the present invention, the octree method is particularly well suited for optimizing the performance of geometric algorithms of the type described herein. Referring to FIG. 16a and FIG. 1, we see a rectangular volume 70a which is repeatedly bisected along each dimension to result in smaller and smaller rectangular volumes 72a and 74a. Since any model 3 can be enclosed by a rectangular region which can be subdivided in the manner described above, it is therefor possible to subdivide model 3 and thereby compartmentalize the data associated with it, in such a way as to allow any algorithm using such a data structure to perform much faster by reducing the amount of time spent considering portions of model 3 which are not in regions of immediate attention. A two dimensional representation, of this data organization concept is illustrated in FIG. 16b where 70b corresponds to a graphical representation of volume 70a and where each lower level of the graphical representation consists of data associated with the portions of model 3 found in the subordinately smaller volumes 72a and 74a. Now at some arbitrary level where the linear dimensions of each rectangular region is less than some predetermined amount, for example 5 millimeters, the subdivision process can be stopped and we can establish a linked list of pointers to any facets or surfaces either partially or completely contained within these agreed upon, smallest regions. The type of data to be stored in the lowest level linked list 76 includes the smallest rectangular box 74 enclosing facet 58 together with the vertices and the normal vector of facet 58. In the case of the model 3 being parametrically described by surfaces, the linked list 76 would also comprise the parameter ranges for the portions of the surfaces in question.

FIG. 17 illustrates a further concept which is useful in explaining the process by which the number and distribution of intersections of Z-rays 60 with model 3 can be determined. Herein, an XY region 78 corresponds to the XY extent of the associated octree rectangular boxes 70, 72, 74 at some level of the octree data structure explained above. The octree data structure is traversed using a depth first search, whereby at the lowest level each facet 58 found within linked list 76 is used to create Z-ray bundle 66 centered at the centroid of each facet 58. Each constituent Z-ray 60 is then made to completely pass through model 3 so that all XY regions 78 which cover some portion of model 3 will be pierced by at least one Z-ray 60. This provides a robust procedure for determining all Z-ray intersection counts over the entire model 3 since it guarantees that all facets 58 within model 3 are to be considered. Now as Z-ray 60 passes through any XY region 78 corresponding to the facets 58 associated with such a region, the data associated with all intersections can be stored in an array of intersection linked lists 80. The intersection data includes the XYZ coordinates of each intersection, the number of intersections along each Z-ray 60 and the surface normals at each such intersection. The potentially very large size of the overall octree data structure together with the significant number of intersections which can be found along any Z-ray 60 can result in the total amount of data generated by these operations being very large. This is not a problem, however, given the amount of memory and storage available in today's computers and given that the recommended octree organization minimizes the amount of extraneous data generated.

Figure 18:
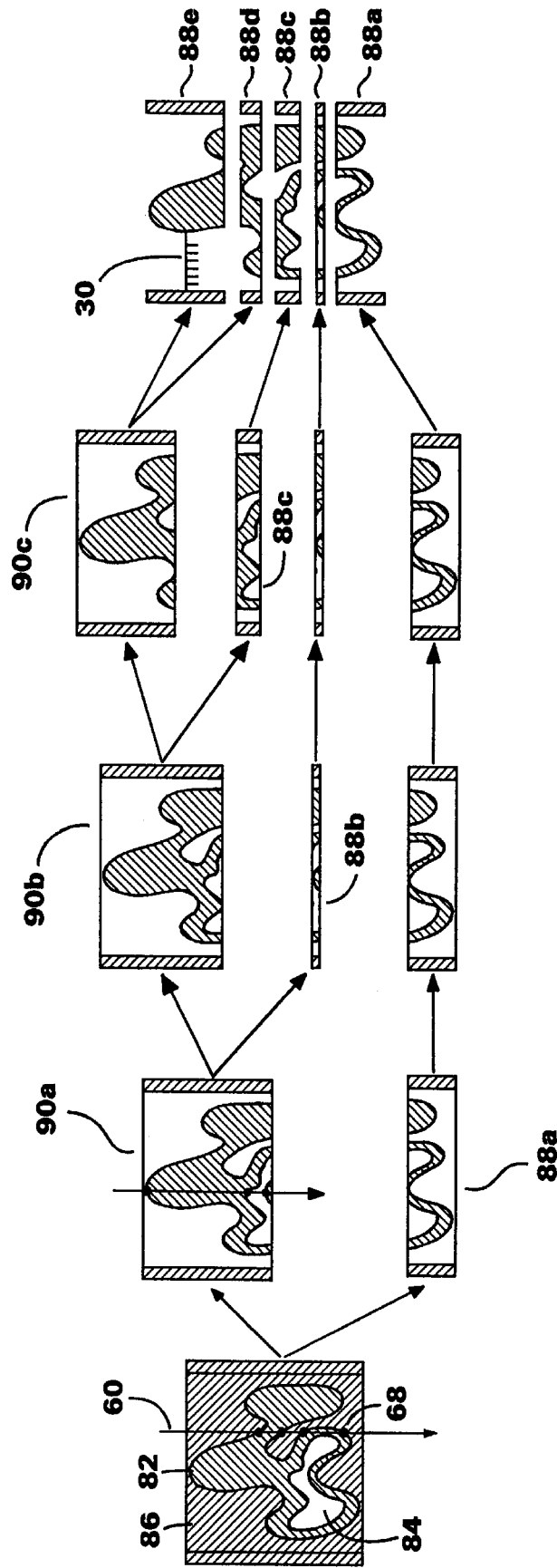
FIG. 18 is an illustration of the cross section through a complex object having a void region and the application of the partitioning algorithm to determine the optimal location to slice the model in order to build it requiring the fewest possible slices.

Reference is now made lo the,diagram of FIG. 18 which illustrates a cross section of a complex object 82 having a void region 84 and a bounding box 86. Object 82 is intersected by Z-ray 60 which passes through one region in which there result four ray/surface intersections 68. As provided in one embodiment of the present invention, this is sufficient to indicate that the object 82 cannot be fabricated from a single slab, since at most two such intersections correspond to the two orientations by which the surfaces in question are accessible and thereby machinable. As the two intersection criterion is therefor exceeded in at least one location, object 82 together with bounding box 86 must be subdivided in such a way as to result in a number of sections such that each such section will conform to the two-intersection criterion and such that when the sections are re-assembled they will faithfully reproduce original object 82. The process of sectioning a model such as that of object 82 in such a manner that each section will comply with the two intersection limit, can be carried out by a method such as a lowest to highest level slicing and testing procedure, a binary search process, or any other method by which the machinability of all surfaces within a section can be determined. As an example with reference to FIG. 18, we may utilize a direct slice and test process which begins at the lowest level of object 82 and proceeds to the uppermost level. The first stage of this multistage process would determine the optimal thickness for a first layer 88a together with a remaining portion 90a. Remaining portion 90a is then examined to find that it requires further subdivision and the process is applied again to yield a second layer 88b and a new remaining portion 90b. Yet another application of the subdivision process yields a third layer 88c and a remaining portion 90c. Two additional applications of the subdivision process culminate in the finding of five optimal layers, 88a, 88b, 88c, 88d, 88e. Now layer 88e can be seen to include ribbed support membrane 30 which is added to provide increased rigidity for this section only. The application of ASA 4 is further elucidated in FIG. 19 which illustrates an exploded view of object 1 indicating regions in which a subdivision must be made in order to deal with the model components through which Z-ray 60 and Z-ray bundle 66 result in more than two ray/surface intersections 68. Reference is now made to FIG. 20 which illustrates how tessellated approximation/model 3 in combination with octree rectangular volume 70 and its associated data structures, can be used to determine contact points 96 along any selected two dimensional fabrication path by performing a simple mathematical calculation to determine where fabrication tool tip 92 which can be represented by a simple analytic surface, will contact a portion of the surface or surfaces within a small octree region 74 corresponding to the XY coordinates of a location along fabrication path 42. In particular, such a calculation is straightforward when object 1 is represented entirely by tessellated approximation 3 in which each facet 58 can be treated mathematically as a plane. The calculation is then, that of finding the contact point between the simple tool tip geometry and a plane, which can quickly and easily be performed.

Given that the fabrication path generator, to be described in greater detail herein below, will take into account the inventory of available materials and thicknesses of the stock, yet another embodiment of the present invention will provide that the fabrication path generator also specify the preliminary operations required to machine a block of arbitrary thickness to the thickness specified by ASA 4.

Figure 21A:
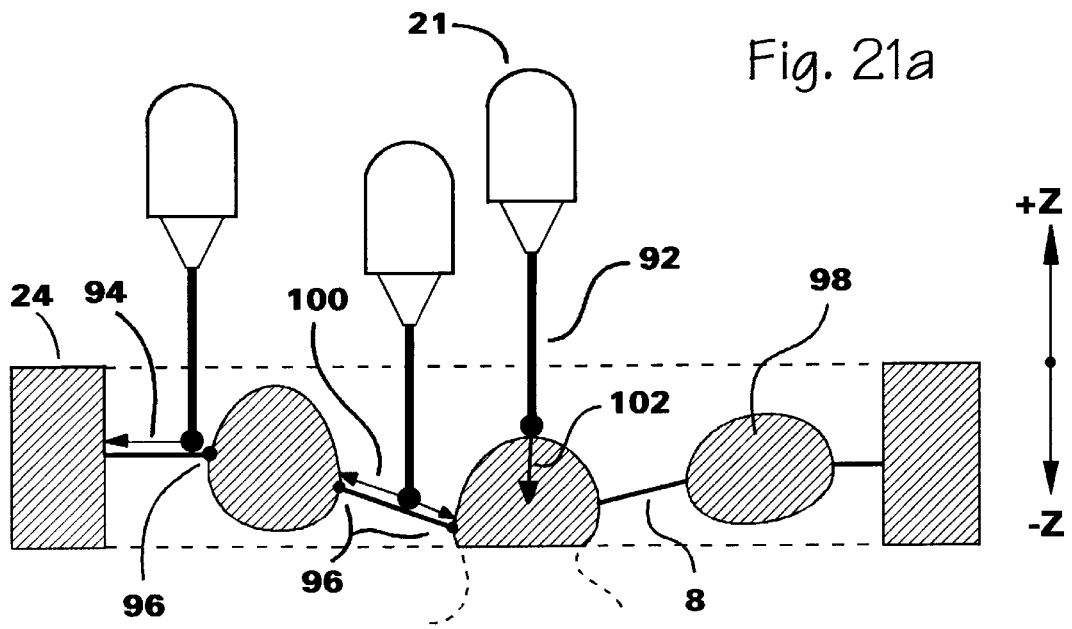
FIG. 21a shows various vectors used to determine the location, width and profile of a complex nonplanar support membrane/parting surface.
Figure 21B:
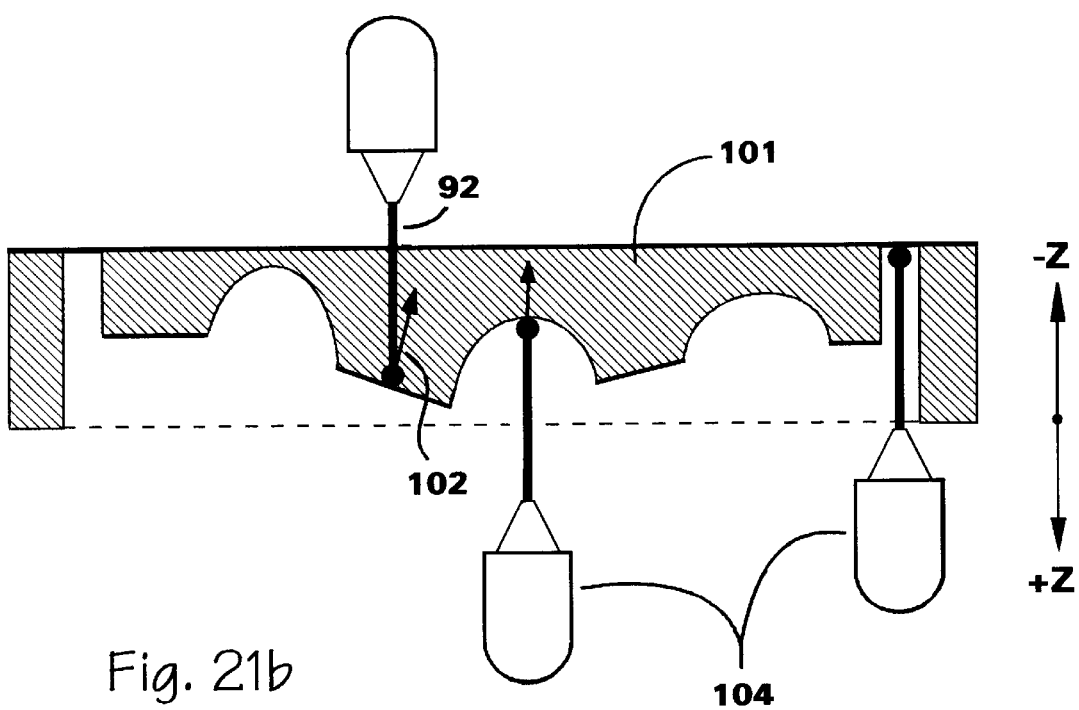
FIG. 21b shows the inverted complement of the shape shown in FIG. 21a in order to illustrate the use of surface normals to aid in determining which side of a surface and membrane to cut, given that all other local information would be ambiguous.

Reference is now made to FIGS. 21a–21b wherein the various parameters affecting the positioning of fabrication tool tip 92 will be described. In FIG. 21a a cross sectional view of the fabrication process for a slab 6 containing portions of three isolated components 98 is shown. In this instance, the XY trajectory of the fabrication path is a straight line extending from the two extremes of outer frame 24 while the tool head motion also includes a Z-axis component. The algorithm which determines the Z-component along fabrication path 42 in accordance with the preferred embodiment of the present invention, is such that model components 98 together with support membranes 8 will be integrally formed. A method for achieving this integration can be implemented by using a plurality of intermediately computed vectors. One such vector is a frame proximity vector 94 which indicates the direction and distance from a tool tip 92 to outer frame 24. Yet another vector would be a component proximity vector 100 which would point from tool tip 92 to a closest surface contact point 96. A pair of opposing proximity vectors 100 could then be used, as an example, to interpolate a support membrane which spans the two nearest contact points. The use of surface normals is important for determining surface orientations and performing necessary inside/outside tests which prevent the machining of enclosed volumes. Surface normal 102 is seen to be pointing in the opposite direction to fabrication head 21 and this fact can be used to indicate that the surface beneath tool tip 92 is an outer surface and may be safely machined. The importance of the surface normals is illustrated even more clearly in FIG. 21b in which the contour of the components and membranes in FIG. 21a are mimicked by a single complementary solid object 101. It can be seen, that without a specific test to establish which side of a surface to machine, tool tip 92 can penetrate an outer surface of object 101 in the course of approaching the lower surface at 102. However, normals 102 in combination with the direction of tool shaft 110 can be used as one type of test to indicate whether the surface in question is an inner surface which should not be machined. Other similar tests which are known to those practiced in the art of geometric analysis could also be applied, without deviating from the scope of the current invention.

Figure 22:
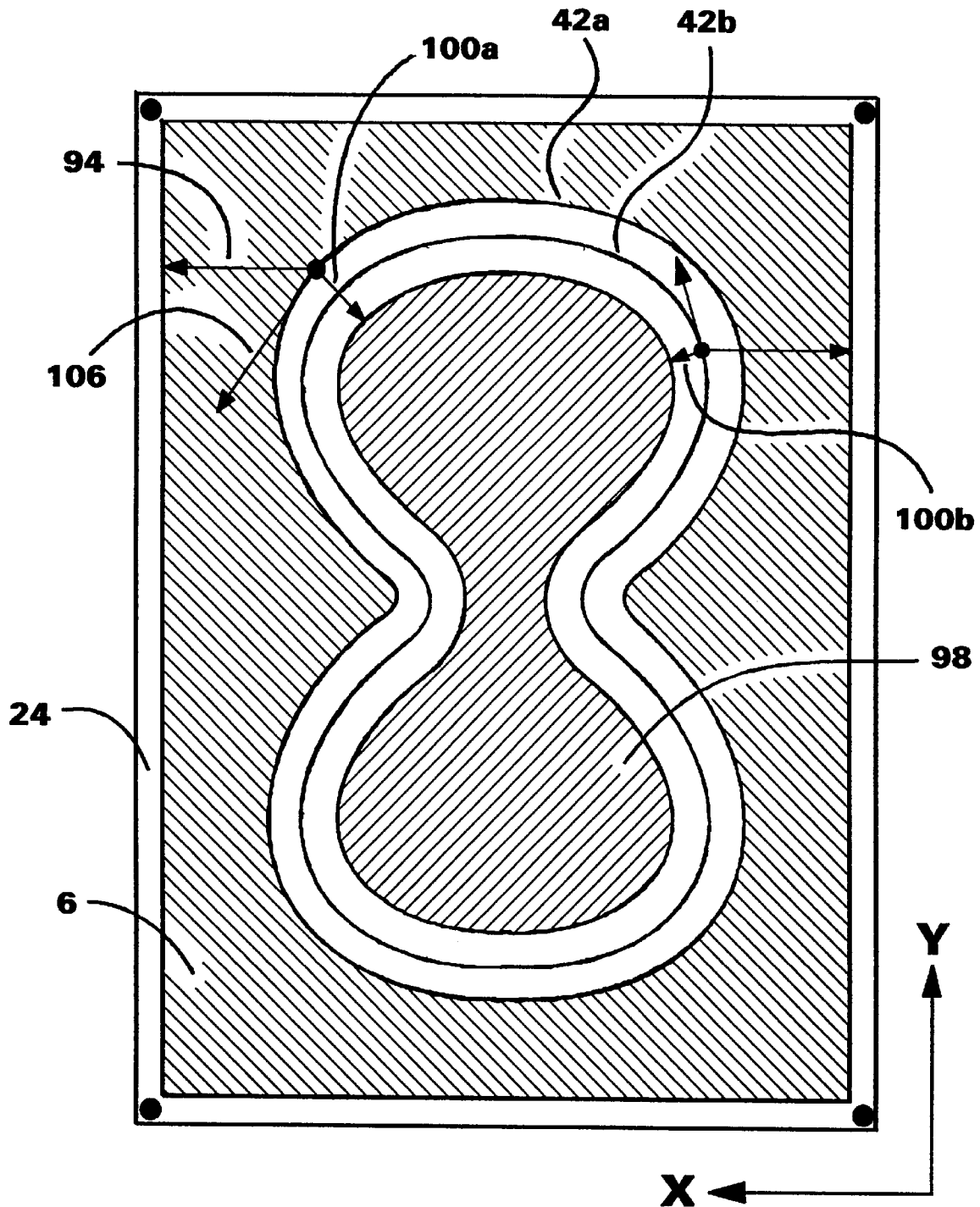
FIG. 22 shows a curvilinear fabrication path which illustrates how a support membrane geometry or parting surface could be constructed using proximity vectors and the fabrication path vector.

Reference is now made to FIG. 22 which illustrates how a curved fabrication path 42a can be determined using the same vectors described above. Frame proximity vector 94 is used to gauge the distance from path 42a to frame 24 and proximity vector 100a is used to define a clearance region having a constant width. Notice that proximity vector 100b indicates that fabrication path 42b is closer to component 98 than path 42a.

Figure 23:
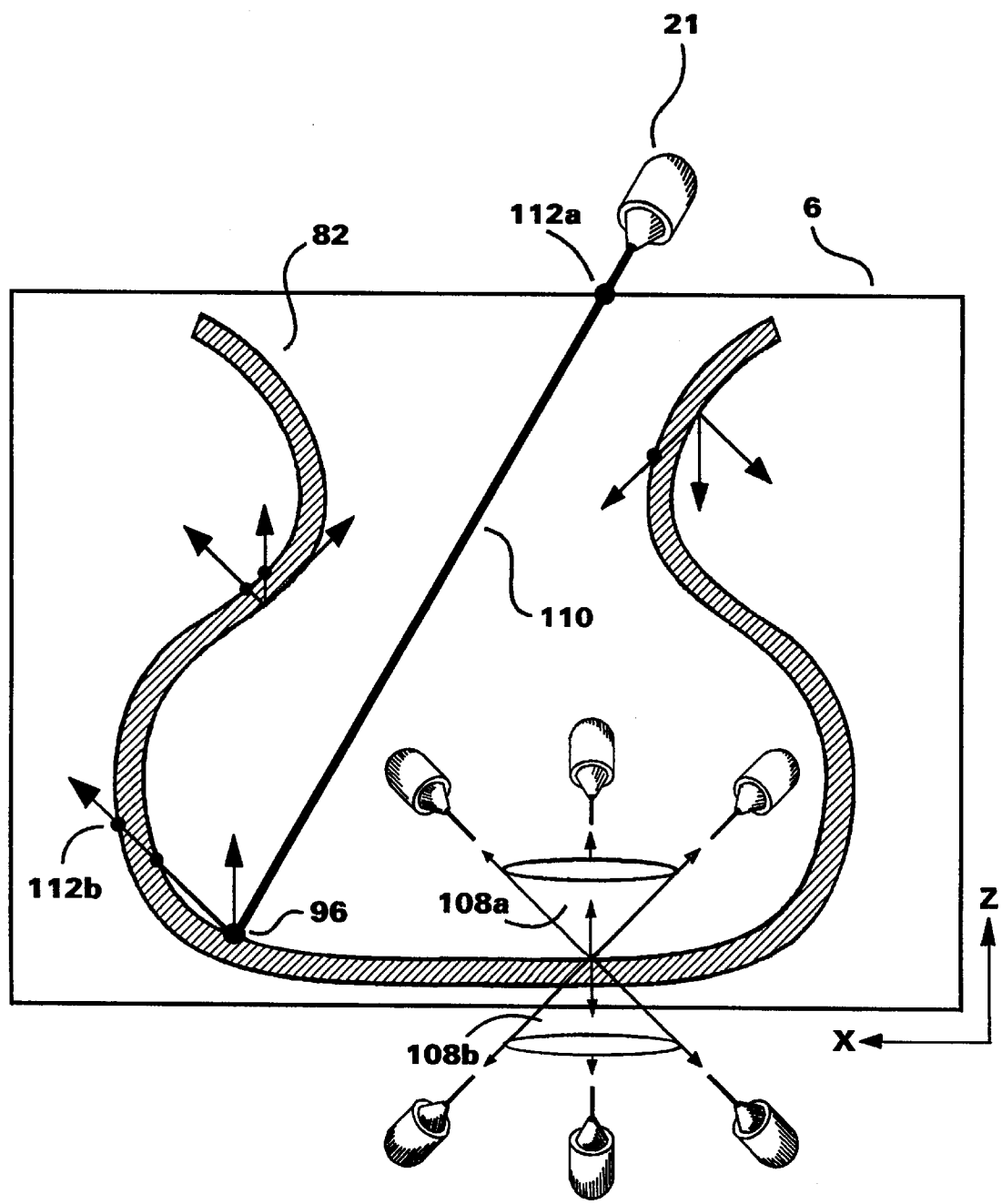
FIG. 23 is an illustration of the use of opposing cones of vectors to permit finding intersections and clearance paths for 5 axis fabrication tools having orientations confined to these cones.

The steps used to find the optimal slab thickness described in one prior embodiment of the present invention were based on the use of three-axis fabrication tools. In yet another embodiment of the present invention the procedure needed to effectively utilize a five-axis type fabrication station is prescribed, whereby substantially thicker and more complex sections can be manufactured. This procedure comprises the use of subtractive fabricators 5 having fabrication heads 21 capable of translating and pivoting as described, herein previously, in combination with a computer control program comprised of a suitable ASA 4 and a suitable fabrication path generator. Referring now to FIG. 23 there is illustrated a highly curved object 82 which cannot be fabricated within a single slab 6 using a conventional three axes fabrication station 20 due to the inaccessibility of the inner surfaces. Such surfaces may be accessible to a five axes fabricator however, and therefor there is a need to be able to determine such accessibility as part of the ASA 4 provided for the machine. When utilizing a five axes fabricator, the allowable motion of fabrication head 21 can be described by reference to a set of articulation cones 108a and 108b which specify the limits of angular motion for a fabrication tool shaft 110. In particular for the purposes of calculating accessibility, articulation cone 108a can be used when considering surfaces within non-inverted slab 6 while articulation cone 108b can used when considering surfaces within slab 6 when inverted.

Additionally fabrication tool shaft 110 which is here illustrated as having an exaggerated length, is seen intersecting the enclosing rectangular volume and tentative slab 6 at a location 112a. A useful criterion can be established which states that if, in the course of examining all surfaces of object 82, the distance from location 112a to some surface contact point 96, is found to exceed the length of shaft 110 then the tentative enclosing slab 6 requires sectioning. The articulation cones 108a–b may also be used to determine if at every surface contact point 96 there exists at least one vector within each cone which does not intersect any other surface at a location such as 112b. If such clearance vectors can always be found for all surfaces 62 or facets 58 comprising object 82 and additionally the above described criterion relating to the length of shaft 110 is not violated, then the entire portion of object 82 contained within tentative slab 6 can be fabricated using a five axis machine. It will also be understood that the use of other algorithms which are known to those skilled in the art of CNC machining and which provide similar capabilities for analyzing the machinability of complex objects, could also be used without departing from the scope of the present invention.

Figure 25:
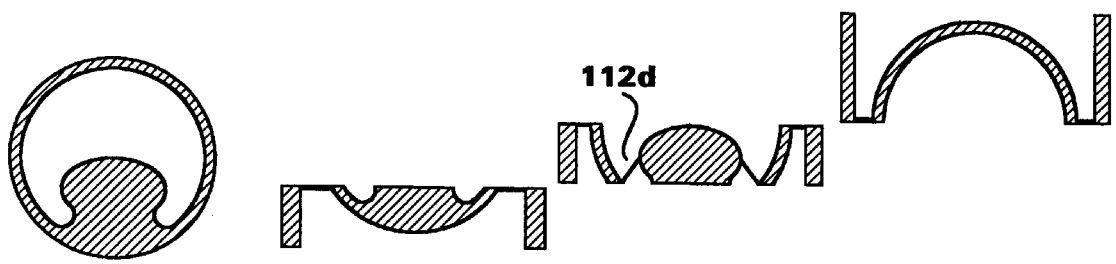
FIG. 25 shows a cross section of the same object of FIG. 24 but now inverted so that the overhang condition no longer exists and allowing the second slab membrane to be removed.
Figure 26:
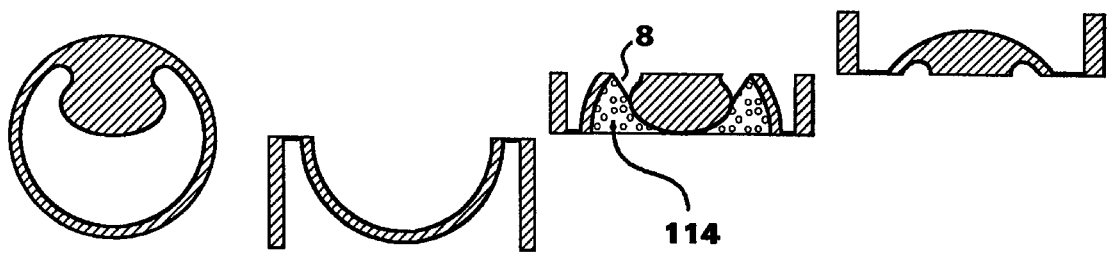
FIG. 26 shows the object of FIG. 24 in its original orientation but with fill material added to the second layer to provide continued support of the isolated portion even when the support membrane is entirely removed.
Figure 27:
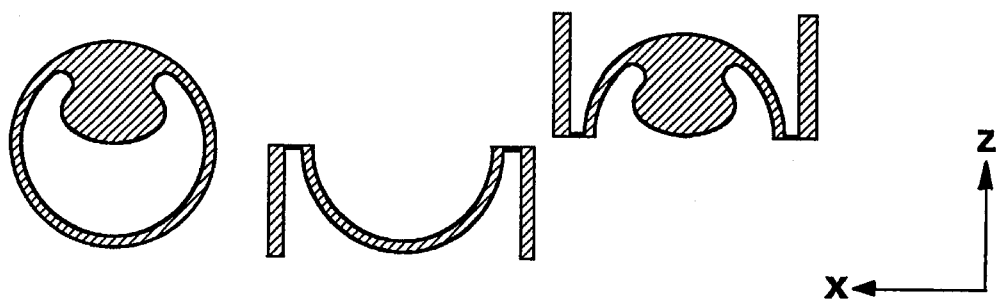
FIG. 27 shows elimination of the overhang problem altogether and the reduced number of slabs required when using a 5 axis fabrication tool.

The use of five axes fabricators, in place of three axes fabricators, can also simplify the resolution a problem which can occur when the object to be fabricated contains an overhanging component or portion. In much of the prior art, this problem has been addressed by a software solution in which the overhanging portion is automatically provided with additional support structures extending through lower levels, or by filling voids with a complementary material having properties which permit relatively easy removal. As it relates to the present invention, this condition is illustrated in a simplified form in FIGS. 24–27 in which a hollow object 113 is shown enclosing an overhanging component 14. When considering the fabrication of such an object using a 3-axis fabrication station 20 it can be seen by reference to FIG. 24 that at least three slabs 6 would be required to faithfully reproduce the shape. According to one provision of the present invention, support membrane 8 at location 112c would normally be removed after corresponding slab 6 is attached to its associated underlying section. In the particular case illustrated, unless the membrane removal operation were made conditional on the absence of overhanging portion 14 the result would be that overhanging portion 14 would fall into void region 84. Since a fabrication path algorithm, such as that diagrammed in FIG. 33 can easily perform a test for the overhang condition, it can also prevent the removal of support membrane 8 in this situation. However, if this were the only provision of the algorithm, then object 113 would still not be faithfully reproduced, since membrane 8 would be retained within the completed model. In FIG. 25 a simple solution to this problem is shown in which the orientation of object 113 is inverted prior to sectioning. This re-orientation would be performed automatically by ASA 4 according to the embodiments of the present invention and location 112*d* shows the appearance of support membrane 8 as it would be generated for the reoriented part. Now membrane 8 can be removed without problem, since the previously overhanging portion 14 of object 113 will be supported by its subordinate layer. This simple strategy will not be sufficient in many cases, however, and therefore FIG. 26 shows yet another solution to the problem which is accomplished by filling the region surrounding overhanging portion 14 with a removable support material 114 such as wax, plaster, or foam. The preferred fill material would have a slight expansion coefficient sufficient to establish a firm mechanical hold at adjoining surfaces. Support membrane 8 can then be removed without overhanging portion 14 losing support and upon completion of the model, the added support material can then be melted, dissolved or broken apart and easily removed. Still another solution is available when using a five axes fabrication machine, as can be seen in FIG. 27 where object 113, in its original orientation, can nevertheless be faithfully fabricated in only two sections, without additional support. In this situation then, the advantages offered by five axes fabrication can clearly be seen.

Figure 32:
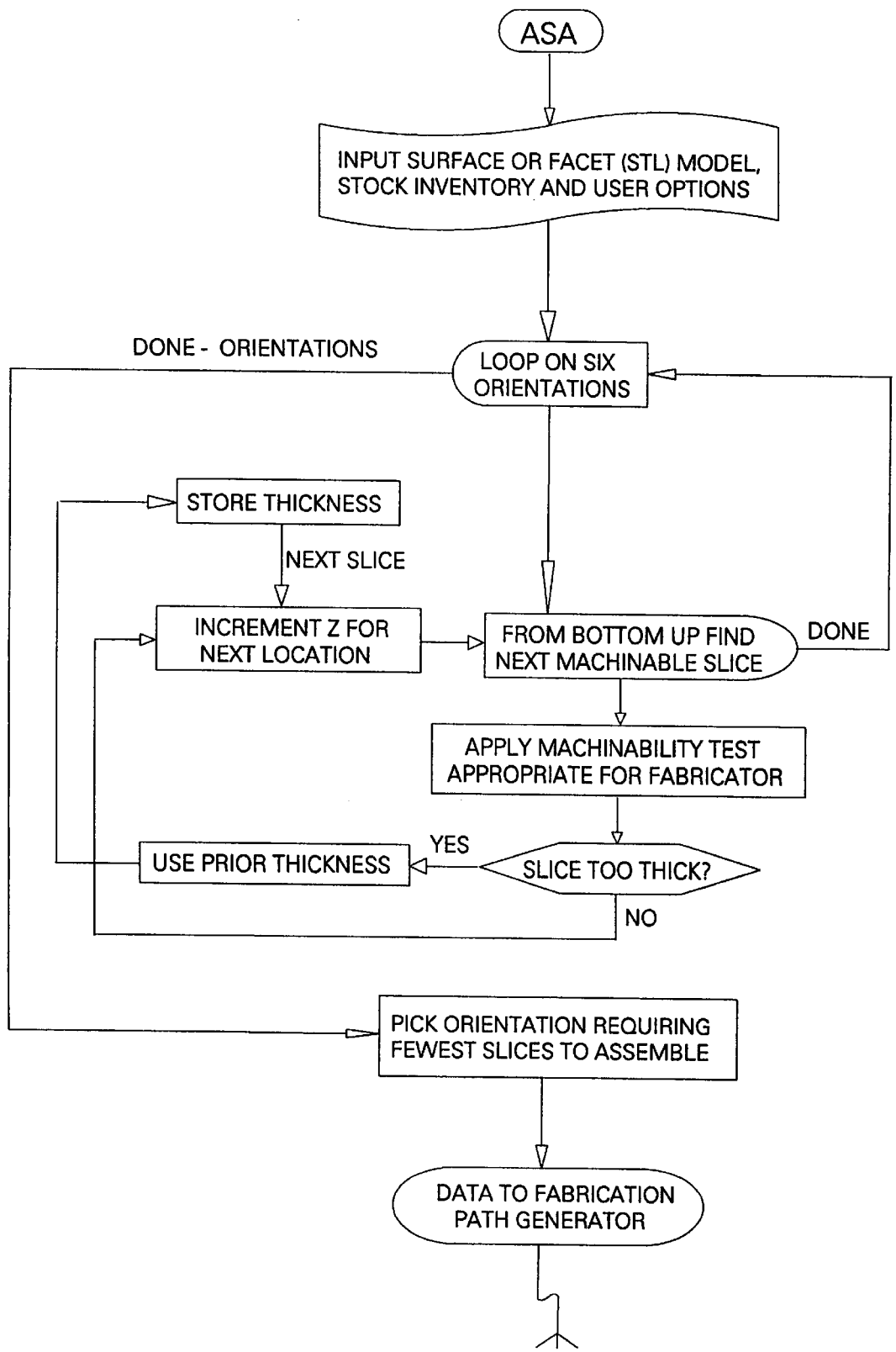
FIG. 32 shows the flow diagram of an adaptive sectioning algorithm.

Reference is now made to FIG. 32 which illustrates the flow diagram for an adaptive sectioning algorithm/ASA 4. The steps for such an algorithm to conform to the scope of the present invention comprise the following:

Providing for (he input of a computer model.

Considering (Looping) on at least six possible orientations for the model.

Using a test to determine if a section through the model can be machined completely.

Considering (Looping) through all such sections.

Testing whether an acceptable section is too thick, based on the material available.

Terminating if acceptable section is too thin, such as less than two millimeters.

Choosing the model orientation and sectioning which yields optimal results.

Storing intermediate information gathered, for later use by fabrication path generator.

Figure 33:
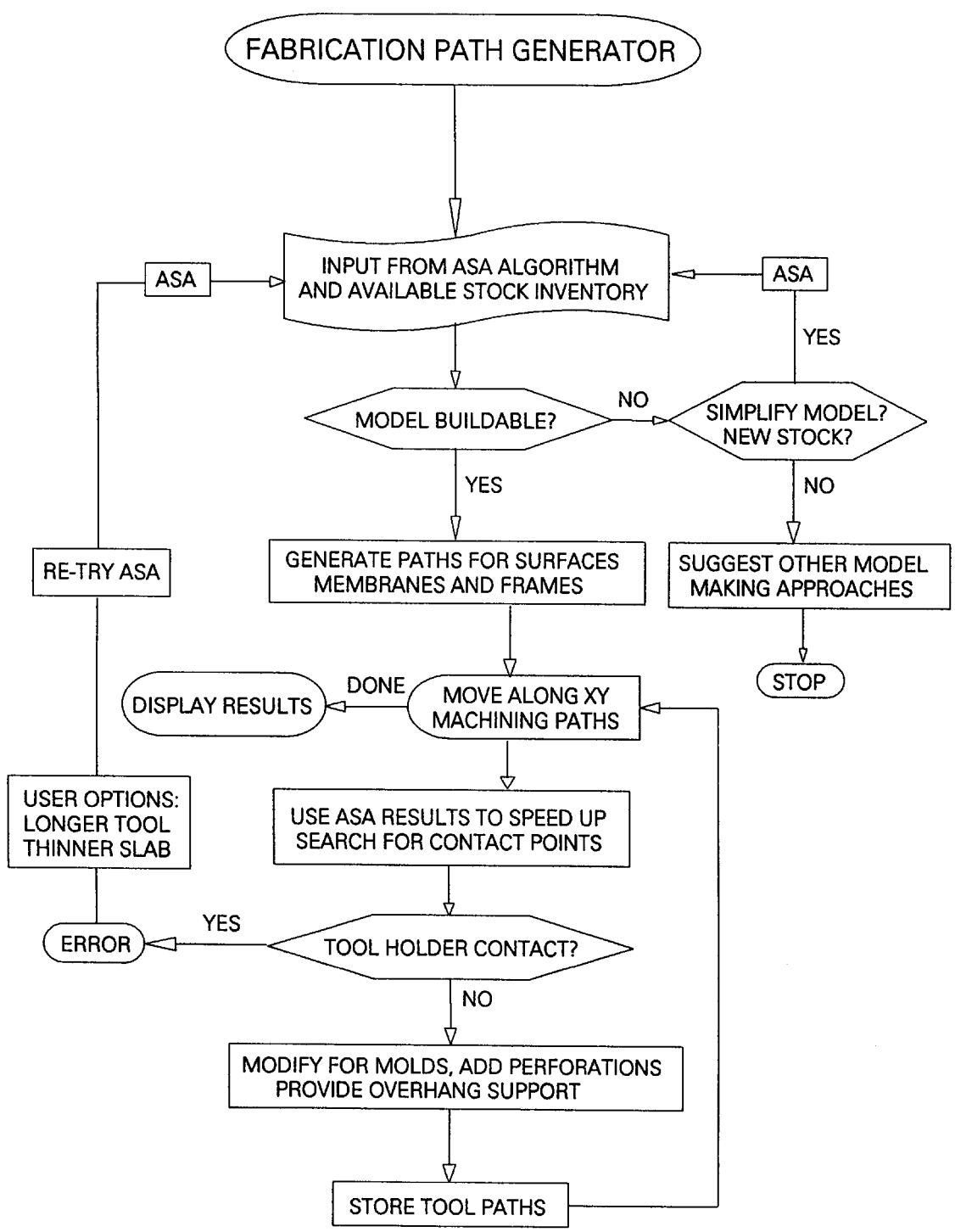
FIG. 33 shows the flow diagram for a fabrication path generator.

Reference is now made to FIG. 33 which illustrates the flow diagram for a fabrication path generator. The steps for such an algorithm to conform to the scope of the present invention comprise the following:

Deriving input from the prior executed ASA 4.

Informing operator as to any problems encountered.

If problems are present, instructing the operator as to options.

If no problems are encountered, generate paths needed to fabricate surfaces, membranes and frames.

Use ASA 4 results to speed up the process.

Test for tool clearance.

Provide for interference testing and gouge avoidance.

If tool interferes, provide operator with options.

Provide auxiliary support for overhanging components.

Add perforations if optionally requested.

Modify fabrication path for mold applications.

Store fabrication paths for post processing.

Assembly

Now in accordance with yet another provision of the present invention there is shown by way of FIGS. 28–29 various methods for permanently bonding the separately formed slabs 6 which comprise a model created in the manner herein prescribed. Referring now to FIG. 28, there is illustrated a method of bonding slabs 6 which are formed from low melting temperature materials such as wax, thermoplastics, etc. by using a radiant heat source 116 to heat and soften the upper most surfaces of a subordinate layer and bonding it directly to a succeeding layer without requiring the application of an adhesive. In FIG. 29 the localized heating is shown provided by a hot air jet 118. The use of pressure and/or the preheating of slabs 6 in combination with a topical heat treatment such as that described above would also be within the scope of the present invention.

Verification

Figures 30A, 30B:
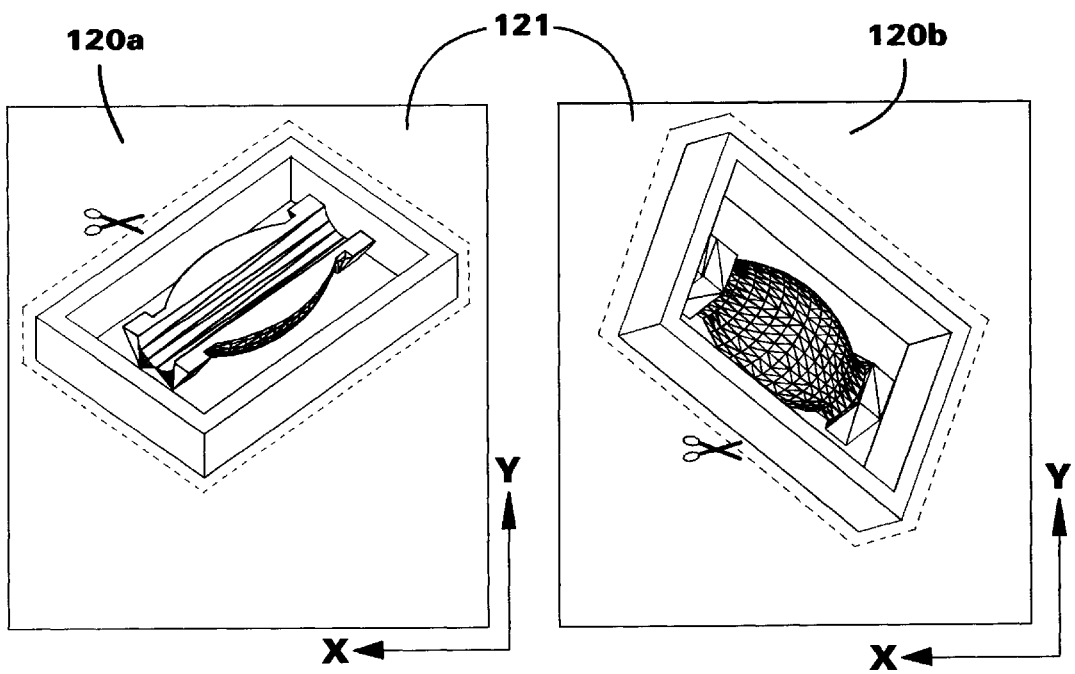

Yet another embodiment of the present invention is illustrated in FIGS. . 30–31 which show the method for creating an illustration and verification aid 122 to be used in combination with the construction process described in the present invention so as to enable a machine operator to look at and verify the proper build sequence, and to visually identify potential build problems prior to executing the build. This verification aid 122 also enables the operator to preview the finished appearance of the object. The steps for creating the verification aid are:

(a) Printing a rendering 120*a* of one side of each completed slab 6 onto a sheet material 121 in such a manner as to realistically represent the three dimensional appearance of what would be visible to the operator within slab 6 by means of such forms of illustration as a shaded isometric image, shaded perspective image, hidden line isometric image, hidden line perspective image as shown in FIG. 30*a*.

(b) Turning over sheet material 121 and printing a rendering of the opposing side 120*b* of corresponding slab 6 in an orientation and position which will coincide with the image previously rendered on the reverse side.

(c) Cutting out each rendering 120 corresponding to each slab 6

(d) Binding together the separate cutouts, in book form, so that they can be leafed through and viewed from either side and, in combination, will give the appearance of the completed build.

Conclusion, Ramification, and Scope of Invention

Accordingly, the reader will see that the present invention is directed to a method for forming an integral three-dimensional object from common materials using the techniques of subtractive fabrication. The method provides for the smooth carving of model portions within optimally sectioned slabs of material in such a way as to allow multiple objects and complex components which include void regions and isolated portions, to be created. The method also allows for the easy fixturing and machining of two sides of each slab and provides a simple method for smoothly removing the temporary supporting structures involved in the intermediate stages of the process and thereby minimizing the amount of hand finishing required. The models which are produced, are suitable for investment casting or the making of molds and can also be finished and used directly as mockups. Additional advantages of the present invention include the following;

Provides an automated subtractive fabrication process which is able to use existing machines, as well as customized machines.

Can use non-toxic, inexpensive, non-proprietary and readily available materials.

Provides the ability to automatically create much larger parts, including many types of prototypes which in the past may have been too large to benefit cost effectively from rapid prototyping technologies, such as automotive exteriors and interiors, seating designs, aerospace models, mockups for films and presentation purposes, etc.

Can produce large parts more rapidly and economically than prior methods.

Is more tolerant than prior art approaches, when faced with imperfect STL data files.

Allows surface based CAD models to be used, which result in improved surface finish and smaller files.

Allows the creation of more complex parts than would be possible using conventional CNC hardware and software.

Allows the creation of multiple nested objects in one process.

Takes into account the available inventory of stock material, prior to recommending commencement of a build.

Indicates to the operator, whether a part to be formed is too complex for this method to be effectively used and can provide other recommendations as to how to best fabricate the part, if this is the case.

Provides the operator with an estimate of the amount of time required to create the part and offers a time and cost comparison with other technologies so as to enable the operator to choose the fastest and most cost effective technology, if desired.

Provides the operator with a visual verification, simulation, and diagnostic aid, to be used prior to and during the build process, in order to verify that the part is being fabricated and assembled correctly. The verification process is simple, inexpensive, and portable.

Allows traditional machinists to create RP parts as well as conventional CNC parts without requiring specially trained operators.

Those already using subtractive fabrication machines, do not need to invest in special and expensive new hardware and consumables and the machines which they have will be easier and less expensive to upgrade, as well as less prone to become obsolete.

Provides for optimized utilization of five axis subtractive fabrication machines and will encourage greater usage of such machines in the future.

Provides instruction in the development of low cost, high speed, milling machines, which can form parts from such materials as low density foam or machining wax at much higher rates of speed.

The invention will require a minimal amount of manual effort on the part of the operator and more importantly will utilize, to advantage, the operators prior knowledge of standard machining technology. This innovation also permits the expanded utilization of both existing machine tools and personnel, without extensive capitalization and retraining costs. Based on a Market Intelligence Research Corporation study (MIRC, Mountian View, Calif.) it is estimated that $9.7 billion worth of CNC mills will be sold in 1997. Most of these machining centers will be used primarily for surface finishing purposes and not for direct fabrication. There would be enormous productivity gains and cost savings achieved if the proposed method were applicable in as few as 5% of the prototypes created to support new product development. The impact of this invention should be dramatic for industries involved in automotive and aerospace design, medical modeling and prosthetics, furniture design, and architectural and geological modeling.

It will be appreciated by persons skilled in the art that the present invention is not limited by what has been particularly shown and described hereinabove. Rather the scope of the present invention is defined only by the claims which follows:

I claim:

1. A novel method for manufacturing a complex three dimensional object from a computer generated model comprising:

(a) loading data representing said computer generated model into a computer control program;

(b) loading a set of fabrication machine parameters representing at least one subtractive fabrication together with a set of fabrication material parameters representing fabrication material properties, into said computer control program;

(c) using said computer control program to automatically specify a model fabrication which produces, by subtractive machining alone, a preferable plurality of slabs, whose number is a minimum subject to constraints imposed by said fabrication machine parameters and said fabrication material parameters, with each one of said plurality of slabs having a sufficient thickness to allow a subset of model surfaces, from said computer generated model, to be faithfully and accurately fabricated within at least one slab of said plurality of slabs, without necessitating the entire removal of said subset model surfaces from said slab, whereupon when said plurality of slabs are fabricated in accordance with instructions from said computer control program and whereupon when said plurality of slabs are aligned, assembled and joined together, the resultant assembly will comprise a complete reproduction of said complex three dimensional object bounded by said slabs, with said complex three dimensional object being preferably temporarily retained within said plurality of slabs until the time of said complex three dimensional object removal;

(d) at the time of manufacture, subtractively fabricating each one slab from said plurality of slabs, orienting each said slab, aligning each said slab with a previous slab from said plurality of slabs, and in proper sequence, assembling each said slab, by preferably using a bonding and fixturing for composite structure which preferably temporarily retains said complex three dimensional object within said composite structure until the time of said complex three dimensional object removal.

2. The method of claim 1 wherein said computer generated model is edited prior to its fabrication by a operator to incorporate additional structures for support purposes and to remove object components which would preclude said computer generated model from being fabricated using a substantially small number of slabs.

3. The method of claim 1 wherein said slabs have substantially uniform, equally sized, and regularly shaped contours and have top and bottom faces which are preferably broad, parallel and planar.

4. The method of claim 1 wherein said slabs, being provided from an inventory of stock having a finite number of thicknesses, are each machined to the correct thickness corresponding to the section to be fabricated.

5. The method of claim 1 wherein each one of said slabs further includes an outer frame, bounding each said slab, and optionally provided with a plurality of registration holes arranged around and within the outer periphery of said frame, through which a plurality of registration pins and/or screws may be used to secure said slabs.

6. The method of claim 5 wherein said frame has substantially planar and parallel top and bottom faces and said faces have sufficient width so as to provide a suitable and uniform alignment, fixturing, and support.

7. The method of claim 5 wherein said frame further includes a series of machined striations arranged along top and bottom faces which are juxtaposed in such a manner as to allow said slabs to mesh when assembled so that said slabs may be easily aligned and will be prevented from moving in X and Y directions.

8. The method of claim 5 further including said composite structure comprised of said complex three dimensional object suspended within said frame by a component support.

9. The method of claim 8 wherein said complex three dimensional object is removed from said composite structure by use of cutting tools and is finished using methods well known to those practiced in the art of model making.

10. The method of claim 8 further including the forming of a plurality of disjoint nested objects in one operation.

11. The method of claim 1 wherein said computer control program results in said slabs being machined on a plurality of sides.

12. The method of claim 1 wherein assembly of said slabs uses adhesive bonding between successive each one of said slabs.

13. The method of claim 1 wherein assembly of said slabs uses registration holes in combination with registration pins between said successive slabs.

14. The method of claim 1 further including an automated material transporting and reorientation as an element of said subtractive fabrication.

15. The method of claim 14 wherein said automated material transporting and reorienting means comprises a robotic transporting as an element of said subtractive fabrication.

16. The method of claim 14 wherein said automated material transporting and reorientation further includes a translating fixturing table as an element of said subtractive fabrication.

17. The method of claim 14 wherein said automated material transporting and reorientation further includes a rotating fixturing table as an element of said subtractive fabrication.

18. The method of claim 1 wherein said composite structure further includes at least one mold making feature taken from the set of runners, parting surfaces, sprues and pouring gates suitable for the making of an investment casting from said composite structure.

19. The method of claim 1 wherein said composite structure further includes at least one mold making feature taken from the set of runners, parting surfaces, sprues and pouring gates suitable for the making of an injection mold from said composite structure.

20. The method of claim 1 wherein said complex three dimensional object is processed for the purpose of making a mold/casting from said complex three dimensional object.

21. The method of claim 1 wherein said subtractive fabrication provided by subtractive fabrication devices.

22. The method of claim 1 wherein said subtractive fabrication occurs in tandem.

23. The method of claim 1 wherein said computer control program automatically determines a preferred orientation for said computer generated model so as to reduce the number of said slabs required.

24. The method of claim 1 wherein said computer control program results in said slabs further including an auxiliary component support comprising a support membrane having a thickness substantially less than the thickness of said slabs and said support membrane is fabricated in unison and integral with said model surfaces whereby isolated object components can be constrained within said slabs by said membrane support in such a manner as to prevent the premature separation of said isolated object components during the fabrication and assembly process and further so as to require a minimum amount of manual registration and finishing effort on the part of said operator.

25. The method of claim 24 further including at least one embedded auxiliary and enhanced support for providing greater rigidity and strength to said component support.

26. The method of claim 24 further including the step of sealing cavities within said slabs with a temporary and easily removable material providing greater rigidity and support for said component support.

27. The method of claim 24 further including the addition of an automatically fabricated ribbed and/or meshed structure to said component support.

28. The method of claim 24 wherein said support membrane consists of a thinner clearance channel conforming to the contour of said model surfaces together with a thicker membrane extending from said thinner clearance channel to said frame.

29. The method of claim 24 wherein said support membrane further includes perforations along edges formed between said model surfaces and said support membrane, so that upon completion of fabrication, said complex three dimensional object may be more easily removed from said composite structure.

30. The method of claim 24 wherein, if said component support are determined to be expendable by said computer control program, said component support may be automatically detached and/or entirely removed from said complex three dimensional object by said subtractive fabrication.

31. The method of claim 30 wherein said detachment of said component support from said object components includes using a five axes subtractive fabrication to cleanly and smoothly trim said support membrane along said model surfaces so as to preserve curvature continuity across said model surfaces and to reduce the need for hand finishing.

32. The method of claim 1 wherein output of said computer control program further includes providing said operator with advice comprising the steps of:
  (a) warning if said computer generated model cannot be faithfully built due to constraints;
  (b) indicating regions of said computer generated model which are too complex to construct;
  (c) advising said operator how to modify a complex model so as to allow it to be built;
  (d) providing an estimated build time;
  (e) providing an estimated build cost;
  (f) providing comparisons with alternative rapid prototyping methods;
  (g) providing a visual display of rendered and animated slabs on a computer screen.

33. The method of claim 1 wherein at least a minimum and maximum allowed material thickness in combination with an inventory of available stock material are entered as data into said computer control program.

34. The method of claim 1 wherein said computer control program uses a multitude of Z-rays for determining an appropriate sectioning of said computer generated model so as to reduce to a minimum the required number of said slabs.

35. The method of claim 1 wherein said computer control program uses a multitude of articulation cones for determining an appropriate sectioning of said computer generated model so as to reduce to a minimum the required number of said slabs.

36. The method of claim 1 wherein said computer control program uses a multitude of surface normals for determining an appropriate sectioning of said computer generated model so as to reduce to a minimum the required number of said slabs.

37. The method of claim 1 further including a computer algorithm capable of utilizing the intermediate data gathered as part of said computer control program for the purpose of speeding the fabrication steps for each said slab.

38. The method of claim 1 further including an assembly verification comprising the steps of:
    (a) printing renderings representative of each side of said slabs onto each side of a sheet material;
    (b) cutting out each one of said renderings along their respective outer boundaries;
    (c) binding together said renderings along one respective common edge in such a manner as to produce an assembly conveying the appearance of a three dimensional block while allowing each apparent slab of said apparent block to be viewed from either side so that said operator is provided with a visual and easily transportable verification for each step of the fabrication process and thereby allowing said operator to identify potential fabrication problems prior to initiating the build of said complex three dimensional object.

39. The method of claim 1 further including a heating applied to the outer surface of each fabricated slab so as to allow the direct fusion of said slabs without the need for adhesive.

40. The method of claim 39 wherein said heating includes a heated air stream.

41. The method of claim 39 wherein said heating includes a radiant heat source.

42. The method of claim 39 wherein each said slab is formed from a substantially low melting temperature material such as those taken from the set of wax and thermoplastic.

43. The method of claim 1 wherein said subtractive fabrication is modified for speed, using methods of machine design.

44. The method of claim 43 wherein said subtractive fabrication is modified by incorporating a plurality of components so that said components are in conformance with intended function of said subtractive fabrication.

45. The method of claim 43 wherein said subtractive fabrication is modified by providing a plurality of adjustable design parameters such as table length and width.

46. The method of claim 45 wherein said subtractive fabrication means is modified for use with said soft materials and said modification further comprises constructing said subtractive fabrication means from lighter materials such as aluminum and whose mechanisms are driven by a lower cost driving means, such as belts and/or cables, and further utilizing a lower co An s a high speed router.

47. An assembly verification means for use in combination with a thick slab subtractive fabrication process comprising the steps of: (a) printing renderings representative of each side of said slabs onto each side of a sheet material; (b) cutting out each one of said renderings along their respective outer boundaries; (c) binding together said renderings along one respective common edge in such a manner as to produce an assembly conveying the appearance of a three dimensional block while allowing each apparent slab of said apparent block to be viewed from either side so that said operator is provided with a visual and easily transportable verification means for each step of the fabrication process and thereby allowing said operator to identify potential fabrication problems prior to initiating the build of said complex three dimensional object.

48. The method of claim 1 wherein said output of said computer control program is provided in a form independent of actual fabrication of said slabs as by way of a data file so that said data file can be used at a later date to display and fabricate said slabs resulting in said complex three dimensional object being reproduced.

49. A method for manufacturing a multi-segmented mold from a computer generated model comprising:
    (a) loading data representing said computer generated model together with a set of subtractive fabrication machine parameters and a set of fabrication material parameters into a computer control program;
    (b) using said computer control program to automatically specify a mold fabrication process to be carried out by subtractive fabrication alone, which results in the production of a multi-segmented mold having a minimal number of mold sections while ensuring the faithful and accurate reproduction of a desired object of said multi-segmented mold,
    (c) automatically determining and indicating the location of parting surfaces for said multi-segmented mold;
    (d) automatically determining and indicating the location of filler ports for said multi-segmented mold;
    (e) at the time of manufacture, subtractively fabricating each said section and assembling said multi-segmented mold.

50. The method of claim 49 further permitting the location of said automatically determined parting surfaces and said automatically determined filler ports to be manually adjusted by said operator prior to fabrication of said multi-segmented mold.

51. The method of claim 49 wherein said computer generated model is resulting from the boolean subtraction of a computer generated model of said desired object, from a computer generated solid block, so as to create a new computer model having the pattern exist as a void region within formerly said solid block.

* * * * *

UNITED STATES PATENT AND TRADEMARK OFFICE
CERTIFICATE OF CORRECTION

PATENT NO. : 6,021,358
DATED : February 1, 2000
INVENTOR(S) : Sachs

It is certified that error appears in the above-identified patent and that said Letters Patent is hereby corrected as shown below:

Please delete columns 1-26 and substitute columns 1-26 as per attached.

Signed and Sealed this

Fourteenth Day of May, 2002

Attest:

Attesting Officer

JAMES E. ROGAN
*Director of the United States Patent and Trademark Office*

THREE DIMENSIONAL MODEL AN MOLD MAKING METHOD USING THICK-SLICE SUBTRACTIVE FABRICATION

CROSS-REFERENCE TO RELATED APPLICATIONS

N. A.

STATEMENT REGARDING FEDERALLY SPONSORED RESEARCH

N.A.

BACKGROUND—FIELD OF THE INVENTION

This invention relates, in general, to rapid prototype model making and more specifically to a method for the automated creation of mockups, models and molds of three-dimensional computer generated objects by means of subtractive fabrication.

BACKGROUND—DESCRIPTION OF THE PRIOR ART

In recent years there have been a large number of techniques proposed and developed in an effort to provide methods for quickly and automatically creating three dimensional (3D) objects directly from computer aided design (CAD) models. This area of technology has become variously known as rapid prototyping (RP), 3D hardcopy/printing (3DP) and freeform fabrication (FFF). The advancements made in this field have had an immediate and direct impact on the ability to quickly design and manufacture products in response to global industrial and consumer demands. A large number of industries are the beneficiaries of these advancements, in particular those involving automotive and aerospace manufacturing.

Nevertheless, there are numerous issues that limit the broader applicability of many of the fabricators currently available. One of these is the size limitation of the existing machines, which prevents some manufacturers from being able to build full scale models of their designs. In addition, most of the fabricators available today are very expensive to acquire and operate. It is the intention of the present invention to alleviate most, if not all, of these limitations.

To further an understanding of the present invention and highlight its departure from the many preceding approaches, it is valuable to review the various methods which have been proposed for simplifying the creation of three dimensional models.

Both current and past efforts have primarily evolved from a stratification principle dating back to the ancient Greeks. The stratification principle, which is attributed to Democritus, states that any closed figure can be approximated, to arbitrary precision, by a large number of inscribed rectangular cross sections. This powerful approximation technique can be used to decompose complicated curved objects into a multitude of geometrically trivial rectangular elements, which in turn, can be used to compute the approximate areas, perimeters and volumes of the more complex objects of interest.

With the advent of technologies that could allow this stratification principle to be reversed and thereby used to create arbitrary shapes from a multitude of individually formed and assembled planar approximations, there was a proliferation of methods proposed which (by combining various basic technologies) allowed for the formation of very complex objects. Most of the recent improvements and refinements of these methods involve using thinner cross sectional elements, varying the lamination methods employed, and discovering ways to more accurately and rapidly generate the needed cross sectional contours. All but a very few of the RP machines and processes developed to date, have been based in some way on this fundamental planar slicing and bonding principle. Differences are found in the materials used, the means by which the planar sections are formed, the manner in which they are laminated and the means for post-processing the completed object. The vast majority of these methods are now collectively referred to as additive processes, to distinguish them from subtractive fabrication methods such as traditional computer numerical control (CNC) machining, which creates parts by removing unwanted material from a block of oversized stock. The various methods can be further delineated and grouped into roughly seven technological categories, all of which are in some type of commercial use to date. These are described in more detail in "Automated Fabrication, Improving Productivity in Manufacturing", Marshall Burns, Prentice Hall Publishers, 1993. They are:

(1) Selective photocuring also known as stereolithography and represented in U.S. Pat. No. 4,575,330 (C. Hull) describes the process of using a laser light source to successively solidify planar sections of the computer model within a container of liquid photopolymer. Another approach, also based on photocuring, is that taken in U.S. Pat. No. 5,287,435 (N. Cohen et. al.) which describes a process whereby a masked light source is used to solidify the photopolymer rather than a laser and providing the advantage of simultaneous exposure of the polymer to the catalyzing energy.

(2) Laser cut sheet lamination, also known as laminated object manufacture, and described in U.S. Pat. No. 4,752,352 (M. Feygin) as the process of using special paper supplied by a roll fed device that is laser cut and laminated to form a wood like model.

(3) Selective laser sintering as represented in U.S. Pat. No. 5,354,414 (M. Feygin) wherein thin layers of a powder material is subjected to focused energy sufficient to induce sintering in the powder.

(4) Particle jetting techniques, also known as ballistic particle manufacture and described in U.S. Pat. No. 4,665,492 (W. Masters) as a method for forming objects from the deposition and fusing of individual droplets of molten material ejected from a computer controlled nozzle.

(5) Robotically guided extrusion as described in U.S. Pat. No. 5,121,329 which creates models by melting a filament of material and extruding it through a computer controlled nozzle.

(6) Droplet deposition on powder which has been commercialized by Soligen, Inc., Northridge, Calif. is based on the jetting of small particles of molten material or binder onto a powder which becomes selectively solidified by the particles.

(7) Three-dimensional welding, metal spaying and robotically guided metal droplet deposition technologies, which are still under development in a number of companies and universities.

Some of the advantages claimed for the additive fabrication technologies, are that they are less wasteful of expensive consumables, that they can leverage state of the art technologies such as lasers, computers and new materials to greater advantage and that they are able to automatically form extremely complex parts. Nevertheless the disadvantages of these prior methods are numerous and include some or all of the following:

The devices involved are, in most cases, quite expensive to acquire and maintain.

They require special types of consumables, which are usually proprietary, costly, sometimes toxic and sometimes limited in terms of their material properties.

They are significantly restricted in terms of the size of objects that they can build, in one operation.

For larger size models, these methods are often much slower than traditional subtractive processes.

They require a specially trained operator and special maintenance.

Once model constructions are begun, they normally cannot be stopped. Therefore it is not possible to temporarily suspend the build process if a priority change requires that a partially completed object be removed from the machine and completed at a later time.

To remove, cleanup, and achieve good surface finishes on parts, often requires considerable manual post processing.

If the original computer model contains imperfections, many systems have difficulties completing the build.

The cost of producing models increases rapidly in proportion to the volume of the object.

Methods for using more common materials and less expensive fabrication devices have also been attempted. Representative of these approaches is a product by the Sparx company (Molndal, Sweden) which is designed to provide a very low cost means of producing, very approximate, prototypes of CAD models. This device is essentially a plotter with a hot cutting tip used to cut sheets of foam material which are then assembled and bonded using registration pins as guides. Because of the staircasing inaccuracies introduced and the inability to handle highly complex objects, the results are not very useful except as a very basic visual 3D rendering aid. A similar method is used by Schroff Development Corporation (Mission, Kans.).

Larger objects have also been produced by laser cutting thin sections of cardboard, or plastic, which are then used to produce skeleton forms of the intended object. These forms are then filled with expanding foam and hand sanded. This method is used by LaserCAMM (Menlo Park, Calif.).

Prior to the emergence of the more sophisticated RP technologies outlined above, there were numerous other attempts to create three dimensional models by planar segmentation and assembly. In many of these methods, the thickness' of the planar elements comprising the model were much greater than those used by current fabricators. These approaches are exemplified in U.S. Pat. No. 2,242,631 (A. Stillman) which described a process of manufacturing reliefs by first forming a rectangular carving block from a plurality of numbered slats which were temporarily clamped together on edge. The block was then carved out to produce a master relief. Reproductions of the master were then made by copying the profile of the individual slats, assembling these and then hand finishing. Apart from the manual operations involved in this method, there was the requirement of using a large number of such slats to reproduce an object with good fidelity. The orientation of the slats also resulted in a large number of seams being presented, which had to be cosmetically treated. The edges of each slat were initially cut square with the base, rather than three-dimensionally carved, and objects having contours on all sides, or objects having voids or complex geometries, could not be made. In U.S. Pat. No. 2,903,390 (Seichi Kojima) the Stillman method is referenced when describing a method for making laminated furniture by means of the stacking and bonding together of cross sectional layers corresponding to the furniture to be made. No new art was contributed in terms of the shaping or assembly of the cross sectional members and therefore all the problems cited above remained. In U.S. Pat. No. 3,301,725 (E. F. Fontera) there is also described a means of creating sculptures by a contour layering process. This method was also an entirely manual one and required large amounts of hand finishing work.

In U.S. Pat. No. 3,932,923 (DiMatteo) a method is described whereby the above approaches were partially automated by means of a contour follower which would trace the XY profile of a master model to be reproduced and use this information to directly drive a cutting device. The cutting device would then reproduce the corresponding XY profile by cutting some type of sheet material. These pieces were then stacked, clamped and bonded. In order to produce smoother surfaces a larger number of cross sections were called for. This approach had numerous problems. The method depended on the existence of a master model for the contour follower and did not provide a means of creating parts directly from computer models. The method only used XY contour information and therefor required the use of a large number of sections in order to yield acceptable surfaces. Because the sections required manual assembly there was the possibility of introducing substantial registration errors. In addition, there was also a failure to account for the kerf (tool offset), which is produced by any cutting tool, so that significant and uncompensated inaccuracies could be introduced during the cutting process. Because of the uncompensated kerf problem, many of the masking and bonding techniques cited in the patent would probably have met with unanticipated failure, due to the adhesive entering unwanted regions and preventing proper separation of parts. The creation of complex geometries which could include void regions, islands, and overhanging portions, also could not be realized using the DiMatteo process.

Reference can also be drawn to U.S. Pat. No. 4,393,450 (R. Jerard) which provides for an automated means of forming a curvilinear shape within a soft material directly under computer control by employing an abrasive wire to cut away portions of an initial block of material while the block is rotated and the wire is translated in two dimensions. This method has many of the same limitations cited earlier. In particular, it requires the building of a special machine which would be limited to constructing objects from soft materials that could be easily and quickly cut using an abrasive wire. The object to be formed would also have to be characterized by simple contours and could not have internal voids, islands, or overhanging components. In addition, because the cutting means consists of a straight segment several inches in length, shapes having multiple protrusions or intricate contour changes (along the prescribed rotational direction) could not be formed.

All earlier attempts to create objects using thicker sections of material have suffered, from among other problems, significant staircasing effects which resulted in the creation of parts having only crude approximations to the desired objects and further requiring a considerable amount of hand finishing to produce acceptable results. Even in the most contemporary of processes, there is still a requirement for some type of manual post-process cleanup, or separation work and therefore no method, yet devised, provides a completely turnkey solution, that does not require a trained operator.

A more recent hybrid approach for providing rapid prototyping capability using both subtractive and additive fabrication is described in U.S. Pat. No. 5,398,193 (deAngelis).

This method combines selective deposition of a principal material together with a complementary support material followed by the removal of selected portions of both deposited materials. However several potential disadvantages of this method can be listed:

- The method does not enable object formation by subtractive machining alone.
- The method does not indicate how, or if, existing machines could be used exclusively in the process.
- The method does not require or indicate the possible advantages of using multiple machines to accomplish the construction.
- The method only permits machining the uppermost surface of each layer.
- The method does not attempt to orient the computer model in an optimal manner prior to fabrication.
- The method does not indicate how the predetermined thickness(s) for each layer are determined.
- The method fails to describe any novel provisions in the software slicing portion of the invention, implying that it utilizes exclusively two dimensional slice contours.
- The additive means consists of selective localized deposition rather than using complete slabs of pre-formed material having a substantial thickness.
- The method requires the use of complementary materials for support purposes.
- The method does not use the Z axis for purposes other than indexing through layers of material.
- The method does not provide for the use of machines having more than three axes of motion and therefore fails to exploit their numerous advantages.

Cost Comparison:

Even though it is difficult to make generalizations regarding costs covering a wide range of technologies, in most of the RP processes referred to above, we can apply scaling analysis to describe the dynamics of costs associated with manufacturing objects of different sizes. Such an analysis can provide a cost metric for comparison purposes. There are basically three costs to be considered when evaluating RP technologies. These are the hardware/software acquisition costs, the labor costs associated with operation of the machines, and the costs for consumables and maintenance. In general the cost for labor and overhead can be assumed to be approximately three to four times the cost for consumables as measured on a per hour of machine time basis. If we simplify the analysis somewhat further by entirely ignoring the cost of acquisition, then the problem can reduced to one of considering only the build time required. We can furthermore assume that the longer the machine operates, the more material will be consumed. In almost all prior art processes cited, the time required for object formation increases in proportion to the thickness and average cross sectional area of the object. These variables are in turn proportional to the volume of the object. In addition, the material consumed in the build is also directly related to the volume of the object. Since the volume of an object increases with the cube of its linear size factor, it could reasonably be expected that as the size of an object triples, its volume and thereby fabrication cost would rise by a factor of 27. This estimate is in fact a fairly good approximation for the actual build costs which a user would encounter. Now, we can also apply the same cost analysis to a method wherein the build time is dependent on the surface area of the object to be built rather than its volume. This would be the case for traditional CNC subtractive machining. Although the material cost would still be dependent on volume, the materials used in CNC machining would be expected to cost considerably less than those used in the additive processes described herein above, and they would most likely cost significantly less than one third that of the other hourly amortized expenditures. Under these assumptions CNC fabrication should result in an object of triple size costing less than half that produced by additive fabrication. This cost differential, could be even larger if the rate of subtractive machining were substantially higher than that for additive fabrication. Indeed various users of both RP and CNC report that in some cases CNC can produce a part in 1/10th the time required by RP. References relating to the superior speed advantages of conventional CNC can be found in articles such as, *Rapid Prototypes for Production Parts;* Paul Dvorak; Machine Design; October 1993, *Rapid Product Realization;* Joanne Wolfe; Plastics Design Forum; May 1994, *CNC Machining As A Rapid Prototyping Technique;* Rob Hassold; Modern 10 Machine Shop; October 1995. In addition, subtractive fabrication also results in significantly greater accuracy as is reported in: *Other Routes To Rapid Prototypes;* Paul Dvorak; Machine Design; June 1992. In particular, for larger parts, we can clearly see that if an automated subtractive fabrication process, suitable for creating more complex objects, were made available; it could offer significant economic benefits over that afforded by the additive fabricators, especially from an operational standpoint.

To date, no method has been proposed which has fully exploited subtractive fabrication in order to extend its capabilities to allow the creation of complex computer models having all manner of inner voids, inner components and overhanging portions. The need therefore exists for a method which will allow such larger and more complex objects to be created within a CAD/CAM system tied to a subtractive machining process.

SUMMARY OF THE INVENTION

It is the general object of the present invention to provide a process for creating three-dimensional models and mockups of arbitrary size directly from computer designed models using a wide variety of low cost, readily available materials. This and other objects of the present invention are achieved by using either existing or specially designed subtractive fabrication machines and providing the appropriate software and methodology to optimally section a complex model, in such a manner that it can be constructed by lamination of a minimal number of substantially thick and specially machined slabs, containing portions of the object and having preferably uniform outer profiles which enable simple alignment, containment and lamination of the individual sections. It is another object of the present invention to provide a comprehensive teaching on the method for producing rapid prototypes using CNC machine tools. It is a further object of the present invention to provide a process whereby the large installed base of standard machining centers can be utilized more efficiently and effectively to create a broader spectrum of objects than currently feasible. It is a further object of the invention to allow low cost fabrication of models with high quality surface finishes, for educational, artistic and hobby use.

Yet another object of the present invention is to indicate to operators the most economical method for fabricating a complex model given the availability of multiple technologies. Still another object of the invention is to provide a visual verification of the fabrication process by means of computer generated renderings of the various stages of the process in such a manner as to allow the object formation process to be seen as it would appear during the manufacturing process. Yet another object of the invention is to provide a means for generating wax models having integral sprues and parting surfaces which could be used in investment casting or for creating rubber or plaster molds. Still further objects and advantages will become apparent from a consideration of the ensuing description and accompanying drawings.

DRAWINGS

FIG. 1 is an isometric drawing of the overall process where the model represented in a CAD/CAM system is formed into a three-dimensional object comprised of a number of thick machined slabs having integral support membranes, outer frames and optional striations;

FIG. 2 shows an isometric drawing of a more complex model having overhanging components which require the preservation of two additional intermediate support membranes;

FIG. 3a is an isometric illustration of a fabrication station forming the underside surfaces of the first section of a model;

FIG. 3b is an isometric illustration showing the second fabrication station idle in preparation for receiving the first section seen in FIG. 3a from the first fabrication station;

FIG. 3c is an isometric illustration showing the first fabrication station cutting the underside surfaces for the second section of the model;

FIG. 3d is an isometric illustration showing the second fabrication station processing the upper surfaces of the inverted first section received from the machine in FIG. 3a;

FIG. 3e is an isometric illustration showing the first fabrication station processing the underside surfaces of the third section of the model;

FIG. 3f is an isometric illustration showing the second fabrication station processing the upper surfaces of the inverted second section received from the machine in FIG. 3c after it has been attached to the top of the preceding slab;

FIG. 3g is an isometric illustration showing the first fabrication station finished and now idle;

FIG. 3h is an illustration showing the second fabrication station completing the formation of the upper surfaces of the inverted final section received from the machine in FIG. 3e after it has been attached to the top of the preceding slab;

FIG. 4 is an isometric illustration showing the tandem fabrication of slabs using a single fabrication station by translation of either the fixturing table or tool;

FIG. 5 is an isometric illustration showing the tandem fabrication of slabs by alternating the slabs on a rotating fixturing table;

FIG. 6 is an isometric illustration of an enhanced ribbed support structure and clearance membrane.

Figure 14:
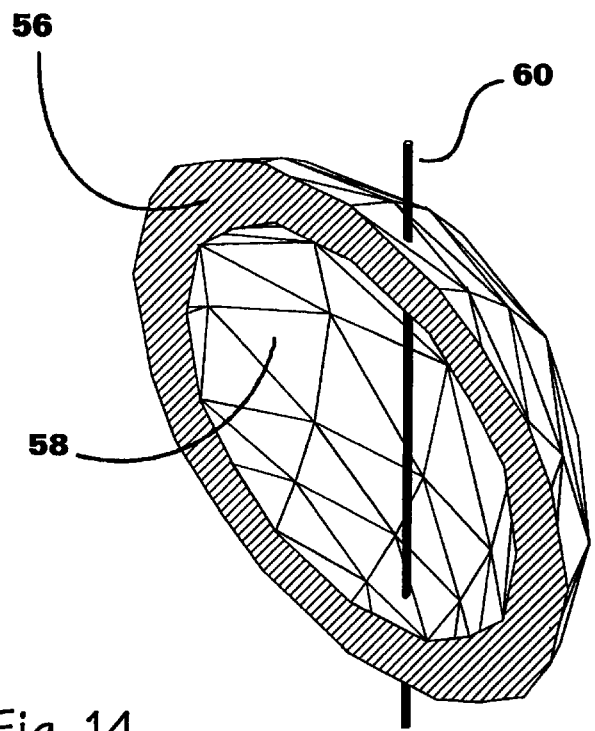
FIG. 14 is an isometric illustration of the tessellation of a hollow spherical shell with a Z axis ray intersecting the shell at four locations, two on interior facets and two on exterior facets.
Figure 15:
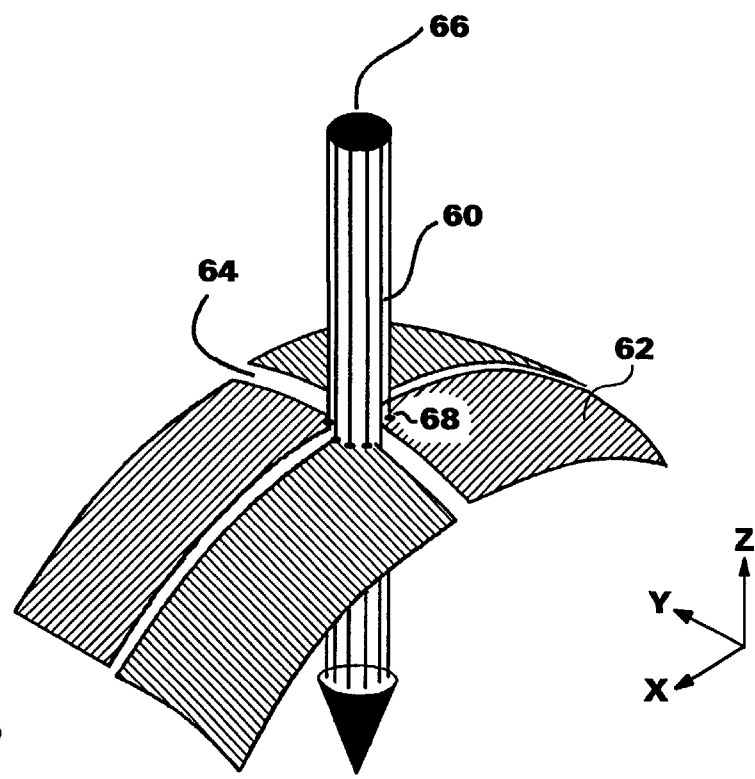
FIG. 15 is an illustration of the use of cylindrically arranged Z-rays bundles for determining intersections and sectioning of surface models which allows for small gaps between surfaces.
Figure 19:
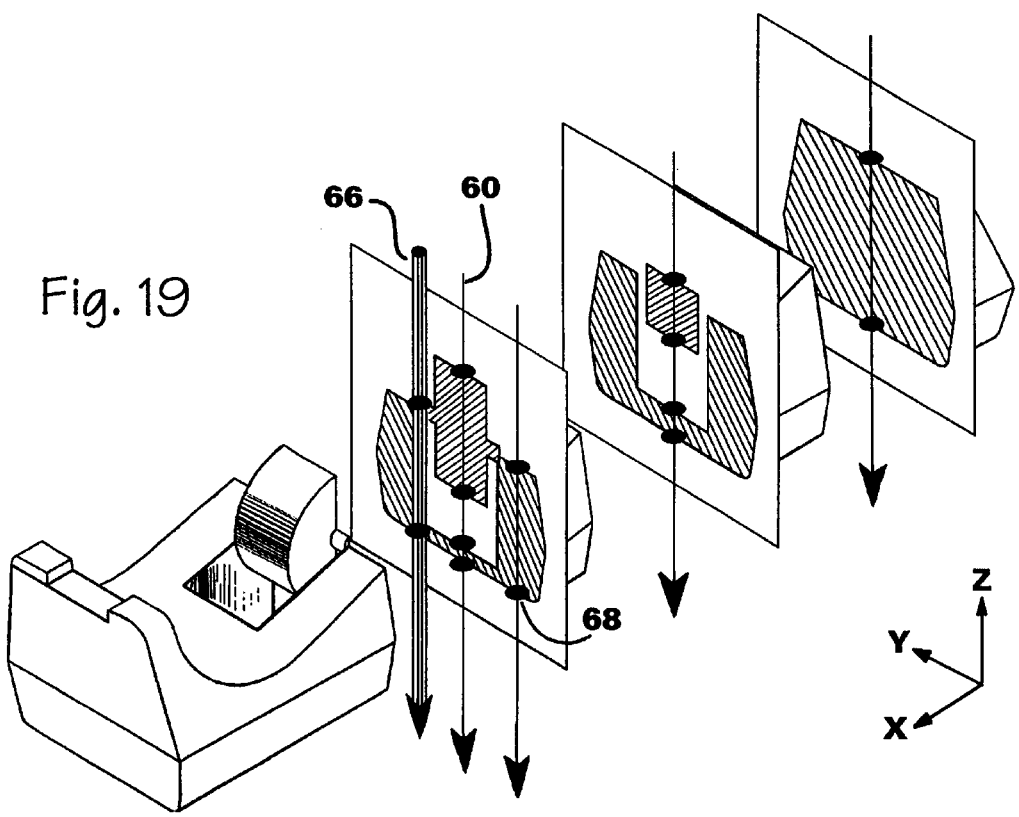
FIG. 19 is an exploded cross section of the model indicating the location of complex regions which will require sectioning.
Figure 20:
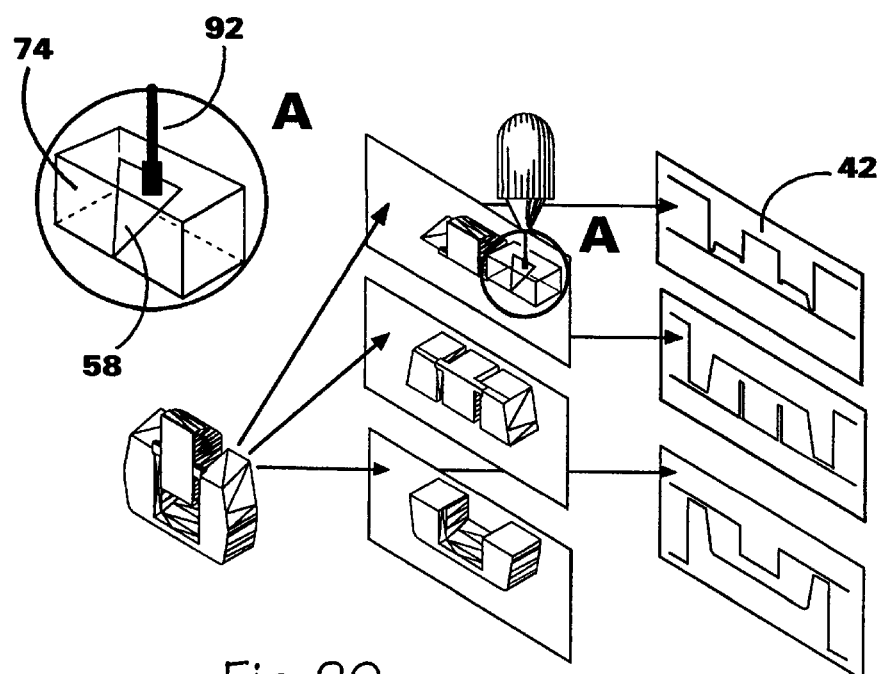
FIG. 20 shows a portion of the model partitioned into three sections together with the fabrication paths required for each layer. The magnified view A shows how the tessellation data would be used to locate the contact point for the cutting tool.
Figure 24:
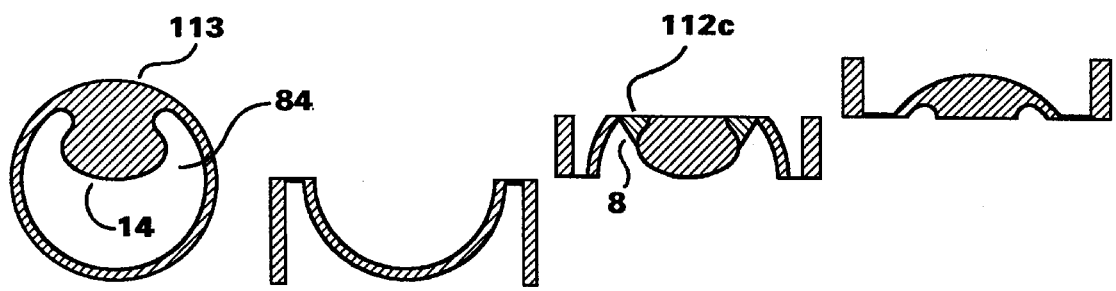
FIG. 24 shows a cross section of an object having an overhanging portion which can be sectioned but whose second slab support membrane cannot be removed.
Figure 31:
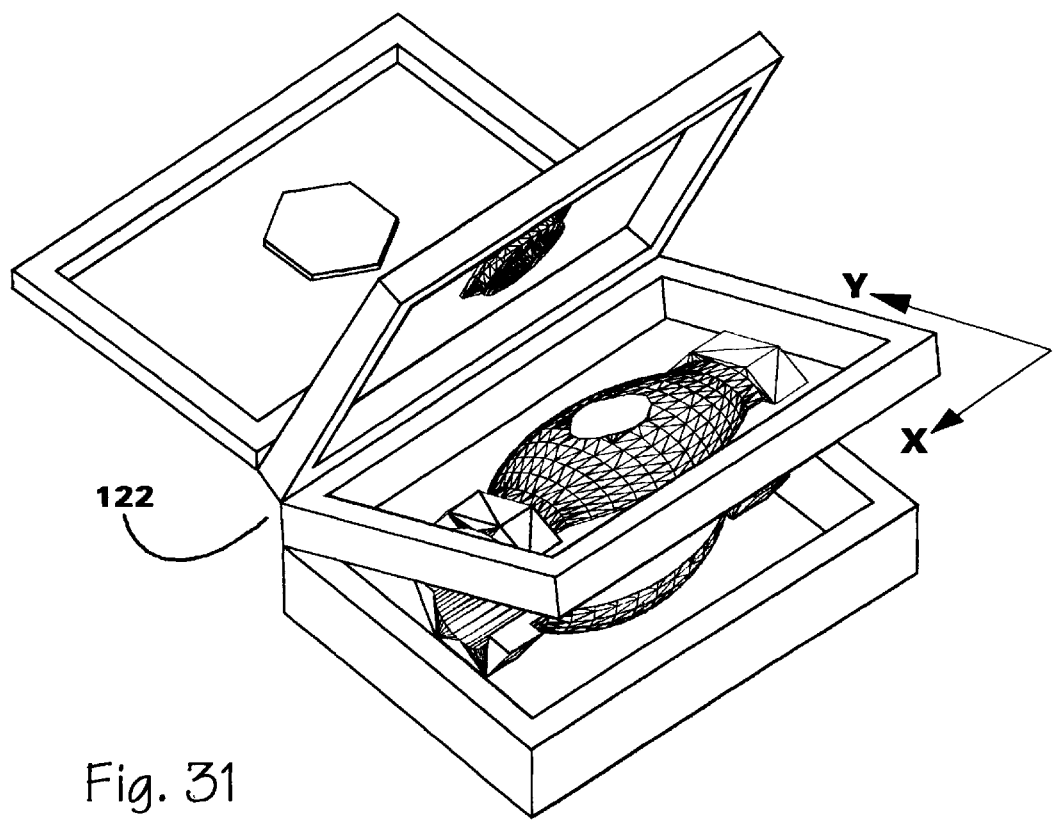
FIG. 31 shows the result of binding the two dimensional renderings.

FIG. 7 is an isometric illustration of an enhanced support structure having a thin clearance membrane and thicker main support;

FIG. 8 is an illustration of a method for providing enhanced support for objects which lack a sufficiently broad natural base through the utilization of a granular or power based media which is packed into the underside voids of the first section and temporarily sealed by means of a removable flat cover plate;

FIG. 9 shows the completed object being removed from its support membrane;

FIG. 10a shows the non-planar support membrane/parting surface and the cutter paths which can be used to form an obliquely oriented shape within a single slab;

FIG. 10b shows the shape of FIG. 10a with parting flange, removed from support frame and ready for mold creation;

FIG. 10c shows a casting mold with protruding membrane on one side and parting surfaces extending from the membrane;

FIG. 11a shows the object of FIG. 10a with a perforated support membrane/parting surface for use in an investment casting mold or to permit simpler removal of the model;

FIG. 11b shows the shape from FIG. 11a removed from the support frame and ready for mold creation, having various auxiliary mold making features, such as sprues, runners, parting surfaces, funnels, etc.;

FIG. 11c shows an investment mold created from model in FIG. 11a;

FIG. 12 is an illustration of a complex multi-segment investment mold with multiple partially trimmed parting surfaces;

FIG. 13 is an illustration of a complex multi-segment injection mold having multiple parting surfaces determined by the support membrane geometry;

FIG. 14 is an isometric illustration of the tessellation of a hollow spherical shell with a Z axis ray intersecting the shell at four locations, two on interior facets and two on exterior facets;

FIG. 15 is an illustration of the use of cylindrically arranged Z-rays bundles for determining intersections and sectioning of surface models which allows for small gaps between surfaces;

FIG. 16a is an illustration of the partial octree partition of a cubic bounding box;

FIG. 16b is an illustration of the organization of the octree data for FIG. 16a, showing the eight subdivisions for each level and the linked list used to store the tessellation or surface portion data;

FIG. 17 shows Z-rays piercing the partitioned model and yielding a linked list of intersection data;

FIG. 18 is an illustration of the cross section through a complex object having a void region and the application of the partitioning algorithm to determine the optimal location to slice the model in order to build it requiring the fewest possible slices;

FIG. 19 is an exploded cross section of the model indicating the location of complex regions which will require sectioning;

FIG. 20 shows a portion of the model partitioned into three sections together with the fabrication paths required for each layer. The magnified view A shows how the tessellation data would be used to locate the contact point for the cutting tool;

FIG. 21a shows various vectors used to determine the location, width and profile of a complex non-planar support membrane/parting surface;

FIG. 21b shows the inverted complement of the shape shown in FIG. 21a in order to illustrate the use of surface normals to aid in determining which side of a surface and membrane to cut, given that all other local information would be ambiguous;

FIG. 22 shows a curvilinear fabrication path which illustrates how a support membrane geometry or parting surface could be constructed using proximity vectors and the fabrication path vector;

FIG. 23 is an illustration of the use of opposing cones of vectors to permit finding intersections and clearance paths for 5 axis fabrication tools having orientations confined to these cones;

FIG. 24 shows a cross section of an object having an overhanging portion which can be sectioned but whose second slab support membrane cannot be removed;

FIG. 25 shows a cross section of the same object of FIG. 24 but now inverted so that the overhang condition no longer exists and allowing the second slab membrane to be removed;

FIG. 26 shows the object of FIG. 24 in its original orientation but with fill material added to the second layer to provide continued support of the isolated portion even when the support membrane is entirely removed;

FIG. 27 shows elimination of the overhang problem altogether and the reduced number of slabs required when using a 5 axis fabrication tool;

FIG. 28 shows the use of a radiant heat source as a method of heating and melting the upper most portion of a slab fabricated from a wax or thermoplastic material so that it can be made to adhere to the next layer placed onto it;

FIG. 29 shows the use of a heated air stream to melt the uppermost surfaces of a slab made from a wax or thermoplastic material prior to affixing the succeeding slab;

FIG. 30$a$ is an illustration of the front side of a two dimensional isometric rendering on paper which conveys the appearance of one completed slab;

FIG. 30$b$ is an illustration of the bottom of the slab as rendered isometrically on the back side of the paper shown in FIG. 30$a$;

FIG. 31 shows the result of binding the two dimensional renderings;

FIG. 32 shows the flow diagram of an adaptive sectioning algorithm;

FIG. 33 shows the flow diagram for a fabrication path generator;

DETAILED DESCRIPTION OF THE INVENTION

The description of the present invention will proceed from a consideration of general principles to a detailed exposition of each embodiment of the invention, in such a manner as to enable anyone skilled in the art to make or use the invention disclosed herein.

The rapid prototyping method described in the present invention will comprise the following subsystems:

(a) A computer and controls subsystem.
(b) At least one subtractive fabrication machine having at least three axes of motion, for the fabrication of a number of predetermined slabs, prepared from a variety of materials.
(c) A set of algorithms which are used to specify the optimal slicing and fabricating steps which will enable the 3D model to be faithfully fabricated from a minimum number of slabs within existing machine constraints and allowing for the creation of supporting membranes, embedded gating and parting surfaces.
(d) An illustration and verification method for visually previewing results of the above algorithms and showing the correct construction sequence and appearance for each fabricated layer.

Fabrication Process:

By reference now to the drawings, wherein like reference numerals refer to similar or identical parts throughout the several views and more specifically to FIG. 1 which generally illustrates the three stages of a preferred embodiment of the 3D model creation process. The process comprises the steps of representing an object 1 within a computer CAD/CAM system 2 by any of a number of mathematical descriptions/models 3 well known to those practiced in the art, such as the tessellated approximation shown. Since model 3 within CAD/CAM system 2 is equivalent to object 1 for the purposes of the present invention, it will be understood that they may be used interchangeably without loss of meaning. Object 1 and model 3 may also represent a plurality of nested but disjoint objects which are to be fabricated in the same process, since the invention is capable of fabricating such objects as well. Furthermore, model 3 could optionally include auxiliary components intended to provide additional structural support should this be desired.

Model 3 is utilized during the various fabrication stages to determine optimal strategies for fabricating object 1 from a plurality of slabs 6$a$, 6$b$, 6$c$, such that all surfaces of model 3 both external and internal, will be faithfully reproduced upon assembly. The process of optimally slicing model 3 into machinable sections, is performed by an adaptive sectioning algorithm/ASA 4. Data from ASA 4 is sent to a fabrication path generator which determines the fabrication paths necessary to form each slab 6. The fabrication path generator also advises the operator should problems arise and will suggest options which will allow the fabrication to proceed. A number of subtractive fabricators 5 are then driven by the data provided from the fabrication path algorithm to form each slab 6.

As is illustrated by slab 6$c$, there is provided in accordance with a preferred embodiment of the present invention a method of supporting and positionally restraining intermediate portions of model 3 which may become isolated components 9 during the formation process by embedding these components 9 within a thin support membrane 8 which is automatically prescribed and fabricated under the direction of the computer control program to be described in greater detail hereinafter. It is further seen that in accordance with one preferred embodiment of the present invention, slabs 6$a$, 6$b$, 6$c$ are sequentially assembled and bonded to form a composite structure containing embedded object 1. In accordance with another embodiment of the present invention, slabs 6$a$, 6$b$, 6$c$ may also be temporarily secured during bonding by any number of threaded shafts/screws 10 through a plurality of registration holes 12 which are automatically provided along the periphery of slabs 6$a$, 6$b$, 6$c$.

Referring now to FIG. 2 we see an illustration of the end result of applying the above general principle of construction to an object having moderate complexity and overhanging components 14$a$, 14$b$. A thin principal support membrane 8 within the first layer is augmented by thin auxiliary support membranes 18$a$ and 18$b$ which are automatically determined and fabricated and can include optional perforations 19 added along the outer peripheral edges of the supported portions.

FIGS. 3$a$, 3$b$, 3$c$, 3$d$, 3$e$, 3$f$, 3$g$, 3$h$ illustrate in greater detail a preferred embodiment of the progressive fabrication process which creates object 1 from slabs 6$a$, 6$b$, 6$c$ with the use of a tandem pair of fabrication stations 20$a$ and 20$b$. Such fabrication stations could be individual CNC type milling machines such as the machines available from Fadal Engineering of Chatsworth, Calif. or they could be much larger gantry type units such as those made by Quickmill Inc. of Buffalo, N.Y. The machines could also consist of specially designed tandem units, such as those made by Mikron Corp. of Monroe, Conn.

Fabrication station 20a of FIG. 3a is capable of at least three axes of motion and is provided with a fabrication head 21 which can have additional degrees of freedom such as would be the case for a five axes type CNC machine. Fabrication head 21 can utilize any type of available subtractive machining technology such as milling or laser cutting, in order to form slabs 6a, 6b, 6c.

Inverted first slab 6a is secured by a suitable standard fixturing mechanism 22 which is not an embodiment of the present invention and can be provided by any manner of sliding, anchoring, clamping, bracketing, magnetic holding, vacuum holding, motor driven vise or other common mode of fixturing known in the art of machining. Fixturing mechanism 22 will therefor be regarded as a component of the fabrication apparatus and will not be illustrated or referred to in succeeding figures.

Slab 6a is machined to conform to the underside surfaces of the lowest portion of model 3 preferably together with a principal support membrane 8. As can be further seen in FIG. 3a, a frame 24 is preferably created during the fabrication process which has a preferably predetermined and uniform outer contour consisting of a sufficient and predetermined width of material whose upper and lower faces are preferably, planar, level and parallel to the base of fabrication machine 20. In keeping with the preferred embodiment of the present invention, frame 24 is preserved during the entire fabrication process so as to allow the accurate registration and bonding of succeeding layers. According to another embodiment of the present invention, frame 24 can also be automatically provided with a series of alignment striations 7 illustrated in FIG. 1 and positioned along the periphery of frame 24 in such an arrangement as to permit the successive slabs 6 to mesh and thereby to be easily aligned, secured, and fastened into place, without the need for registration pins. In order to provide such striations 7 it is necessary for the computer control program to instruct the fabrication path algorithm to allow each slab 6 to be thickened by an amount corresponding to the height of the ridges to be machined along the top and bottom boundaries of each frame 24 while restoring the thickness prescribed by ASA 4 on the interior portions of each slab 6.

Reference is now made to FIG. 3b which illustrates fabrication station 20b temporarily idle in preparation for receiving slab 6a from first fabrication station 20a. FIG. 3c shows first fabrication station 20a machining the underside of slab 6b while in FIG. 3d second fabrication station 20b is shown simultaneously completing work on the upper surfaces of slab 6a which has been transferred and inverted from first fabrication station 20a by either manual or automated conveyance. FIG. 3e shows fabrication station 20a preparing the underside of slab 6c. In FIG. 3f fabrication station 20b is shown completing work on the upper surfaces of slab 6b which has been transferred from station 20a and then inverted and bonded to previous slab 6a. The bonding can be achieved using a standard adhesive and with or without additional mechanical fastening. According to one embodiment of the invention, the mechanical fastening is achieved by using registration pins, screws and or striations, set into frame 24 in such a way as to allow the fabrication process to continue while the adhesive layer is setting. The preferred use of a cyanoacrylate type adhesive would hasten the setting time and eliminate the need for mechanical fastening. After completing formation of the surfaces comprising slab 6b the computer control program can then direct the fabrication station 20b to automatically remove support membrane 8 from second layer slab 6b since it is no longer required to provide support and immobilization of the components therein. Membrane 8 removal preferably proceeds in such a manner as to permit the thin edges of membrane 8 to be shaped so as to conform and match as closely as possible the shape and curvature of the surfaces on either side of each membrane 8. Membrane 8 removal is preferably conditional on the membrane not being that of the first slab and not being required to provide support for overhanging model components 14. Referring now to FIG. 3g fabrication station 20a is shown idle having completed fabrication of the underside portion of final slab 6c. In FIG. 3h slab 6c has been transferred from station 20a and affixed to prior slab 6b on fabrication station 20b which is shown completing the final machining of the remaining surfaces of model 3. Model 3 is then ready to be removed from the composite structure comprised of frame 24 and lower support membrane 8.

The preferred embodiments described herein above, in which tandem fabrication occurs utilizing dual machining stations, is of advantage only in that it allows for a significant increase in the speed of construction and is therefore not a strict requirement of the present invention. Other methods for achieving similar results which would be within the scope of the present invention include the use of one fabrication station 20 as shown in FIG. 4 having a mechanism to allow alternating operations on each work piece using an extended travel fixturing table 26 or by equivalently allowing fabrication head 21 to travel between workpieces. Still another embodiment of the present invention is shown in FIG. 5 in which a tandem fabrication capability is provided by using one fabrication station 20 which incorporates a rotational fixturing and transferring table 28. It is also possible, in keeping with yet another embodiment of the present invention, to carry out the construction using only a single fabrication station 20 without modifications, as will be better understood by referring once again to FIG. 3f. Accordingly, machine 20b can be used exclusively, by allowing each slab 6 to be temporarily fastened onto the preceding layer, whereby the underside surfaces of each slab 6 can be formed. Each successive slab 6 is then inverted and preferably bonded to preceding slab 6 whereupon the process continues as previously described. Such an approach, however, will reduce construction speed by about 50%.

Still other methods for providing tandem fabrication capability which are known within the art, can be substituted for those methods described above without deviating significantly from the main embodiments of the present invention.

We will now consider in further detail the use of support membranes 8 as further embodied in the present invention. Supporting membranes 8 which are preferably an integral component within each slab 6 are comprised of three basic types which are determined by the computer control program. Such membranes 8 are provided to increase rigidity, immobilize components, and provide for a number of molding options. The three types of supporting membranes 8 can be further described as follows:

(a) A thin supporting membrane 8 consisting of a uniformly thin surface extending outwardly from one or more components within slab 6 to frame 24 as illustrated in FIG. 1

(b) A thin supporting membrane 8 having a narrow width which serves as a tool clearance area and which is augmented by a mesh like or ribbed support structure 30 extending to outer frame 24 as is shown in FIG. 6 and which provides increased rigidity during fabrication. Ribbed support structure 30 also serves to limit the amount of material consumed when an investment casting is to be made in which a portion of the supporting structure is to be retained to provide entrance paths for the casting material.

(c) A thin supporting membrane 8 having a preferably narrow width and which is augmented by a substantially thickened and solid support structure 32 as shown in FIG. 7. Thickened support structure 32 extends from the thinner inner support membrane 8 to outer frame 24 in such a manner as to provide greatly increased rigidity, while reducing fabrication time.

It is sometimes the case that an object such as conical object 34 shown in FIG. 8, is to be created in its preferred orientation which is lacking of any substantial planar lower surface which could be used to help provide increased support when fabricating higher level surfaces. Although it is possible to use the augmented support structures 30 and 32 previously described to significantly reduce the instability of such a structure, in yet another embodiment of the present invention another method for increasing support for first slab 6a is provided by filling the void regions between support membrane 8 and the lower edges of outer frame 24 with one of a number of easily removable filler material 36, such as sand, powder, foam, wax, plaster, or other soluble compound, in such a manner as to provide a plane and level surface which is flush with the lower faces of frame 24. In the case that such material is not firmly set in place such as with the use of sand, a planar cover plate 38 can be secured by screws 10 or with a temporary adhesive so as to result in a broader and firmer support base upon which other operations can be performed without resulting in unacceptable deformation of the principal support membrane 8 and thereby ensuring a high accuracy in the succeeding steps of the process.

Upon completing all steps of the fabrication process, the result will be object 1 suspended by typically a single lower support membrane 8 within outer frame 24 which is to be removed in the final step of the process as shown in FIG. 9. The removal of object 1 from the composite structure can be accomplished by any of a number of procedures such as manual cutting or automated trimming using fabrication station 20. Upon removal of object 1 there can be additional surface finishing and treatments applied such as filing, hand sanding and the application of sealers and paints. In the case where object 1 is created as a preliminary step for a casting process, a portion of the membrane may be retained as an integral part of the model as illustrated in FIGS. 10–13.

Reference is now made to FIG. 10a which illustrates a non-planar support membrane 40 and the associated fabrication paths for an obliquely oriented oblong object 44. FIG. 10b shows the oblong object 44 removed from frame 24 but retaining a portion of support membrane 8. In accordance with one embodiment of the present invention this is done in preparation for the object to be used to create an injection type mold 46. The membrane portion is trimmed to be consistent with the size of the mold to be made. A mold is then fashioned from the composite object formed from oblong object 44 together with the portion of its support membrane 8 as shown in FIG. 10c. A portion of support membrane 8 can thereby be used to provide an entrance port for the molten material to be injected while the remaining portions can serve as parting line guides. The parting line guides will then be joined with a set of extended parting surfaces 48 so that the mold can be easily separated and the cast part removed.

In FIG. 11a oblong object 44 is shown supported by non-planar membrane 40 having a thin annular rim 52, a perforated edge 19 and a funnel 50 as auxiliary integral components. The auxiliary structures are optionally and automatically added by the computer control program as directed by operator specified parameters in accordance with one preferred embodiment of the present invention. Support membrane 40 is then substantially trimmed to the outer edge of rim 52 while funnel 50 is retained, as shown in FIG. 11b. Support rim 52 will later function as both a runner and parting surface in mold 54, while perforations 19 will function as sprues, allowing molten material to enter the mold cavity. FIG. 11c now shows oblong object 44 together with its filler funnel 50 and support rim 52 encased within an investment type mold 54 which will be fired so as to eliminate entirely oblong object 44 and thereby form the complementary void necessary for the investment casting process. The materials used for object fabrication in the case of investment casting, would normally consist of wax or styrene foam.

Reference is now made to FIG. 12 which illustrates a more complex investment mold 54 which includes multiple support membranes 8, and multiple filler ports 50. FIG. 13 is an illustration of a similar complex injection type mold 46 which includes multiple thickened support membranes 32, multiple filler ports 50 and multiple parting surfaces 48 which are held together by means of threaded shaft 10. It is therefore understood that the present invention can be used to create various types of molds, including those having multiple fill ports and/or multiple parting surfaces.

Computer Control Algorithms:

The algorithms which comprise the computer control program, will now be explained in greater detail. This explanation will be aided by reference first to FIG. 14 which shows a hemispherical shell 56 as represented by tessellated approximation 3 consisting of a large number of triangular facets 58. Shell 56 is further illustrated being pierced by a vertical line segment which will be henceforth referred to as a Z-ray 60 and which can also be described as a vector parallel to the Z-axis of fabrication station 20. Z-ray 60 is further seen to intersect two pair of inner and outer facets 58. In this particular case Z-ray 60 will be said to have an intersection count of four with shell 56. In the more general case shown in FIG. 15 a portion of an arbitrary object, is seen to comprise four mathematically described surfaces 62 which could be of a type nurbs, bezier, coons, facets 58, etc. We can see by way of this illustration, that gaps 64 separate surfaces 62 and that a single Z-ray 60 can easily pass through a gap 64 and therefore not intersect any surface 62. Therefore according to one embodiment of the present invention a remedy for this potential problem is provided by using the concept of a Z-ray bundle 66 which is a cylindrical arrangement of a large number of individual Z-rays 60 having a variable diameter which is dependent on an operator specified gap tolerance or parameter. The effect of having multiple Z-rays 60 intersecting surfaces 62 can be seen by the fact that at least some ray/surface intersections 68 can be found even when many Z-rays 60 fail to intersect any surface 62. The ray/surface intersection count for a Z-ray bundle 66 piercing such an arbitrary object, will then be defined to be the maximum number of intersections found for any single Z-ray 60 within Z-ray bundle 66. The intersection count is an important principle which is used in one embodiment of the partitioning algorithm, as will be described in greater detail hereinafter.

The general set of algorithms particularly suited to providing the information required to enable the further embodiments of the present invention will be henceforth collectively referred to as "adaptive sectioning algorithms" or ASA 4. Slabs 6 are fabricated using a number of subtractive fabrication stations 20 each having a plurality of degrees of freedom. The fabrication process is thereby driven from data generated by an ASA 4 appropriate for the particular type of machine to be used. A five axes ASA 4 will therefore be more versatile than a three axes ASA 4 but may also execute much slower owing to the increased complexities introduced by having additional degrees of freedom. Therefore in general it is desirable to utilize algorithms optimized for the particular fabricator to be used. It is sufficient for the purposes of gaining a complete understanding of the present invention, that an exemplary algorithm having this basic functionality be clearly described.

In order to establish a framework by which to describe the ASA 4 of the present invention, it is useful to explain the concept of an octree hierarchy, which is a well known method for organizing data associated with spatial distributions of information. Though other methods for organizing and storing data associated with CAD models can be used to develop an ASA 4 that would be within the scope the present invention, the octree method is particularly well suited for optimizing the performance of geometric algorithms of the type described herein. Referring to FIG. 16a and FIG. 1, we see a rectangular volume 70a which is repeatedly bisected along each dimension to result in smaller and smaller rectangular volumes 72a and 74a. Since any model 3 can be enclosed by a rectangular region which can be subdivided in the manner described above, it is therefor possible to subdivide model 3 and thereby compartmentalize the data associated with it, in such a way as to allow any algorithm using such a data structure to perform much faster by reducing the amount of time spent considering portions of model 3 which are not in regions of immediate attention. A two dimensional representation of this data organization concept is illustrated in FIG. 16b where 70b corresponds to a graphical representation of volume 70a and where each lower level of the graphical representation consists of data associated with the portions of model 3 found in the subordinately smaller volumes 72a and 74a. Now at some arbitrary level where the linear dimensions of each rectangular region is less than some predetermined amount, for example 5 millimeters, the subdivision process can be stopped and we can establish a linked list of pointers to any facets or surfaces either partially or completely contained within these agreed upon, smallest regions. The type of data to be stored in the lowest level linked list 76 includes the smallest rectangular box 74 enclosing facet 58 together with the vertices and the normal vector of facet 58. In the case of the model 3 being parametrically described by surfaces, the linked list 76 would also comprise the parameter ranges for the portions of the surfaces in question.

FIG. 17 illustrates a further concept which is useful in explaining the process by which the number and distribution of intersections of Z-rays 60 with model 3 can be determined. Herein, an XY region 78 corresponds to the XY extent of the associated octree rectangular boxes 70, 72, 74 at some level of the octree data structure explained above. The octree data structure is traversed using a depth first search, whereby at the lowest level each facet 58 found within linked list 76 is used to create Z-ray bundle 66 centered at the centroid of each facet 58. Each constituent Z-ray 60 is then made to completely pass through model 3 so that all XY regions 78 which cover some portion of model 3 will be pierced by at least one Z-ray 60. This provides a robust procedure for determining all Z-ray intersection counts over the entire model 3 since it guarantees that all facets 58 within model 3 are to be considered. Now as Z-ray 60 passes through any XY region 78 corresponding to the facets 58 associated with such a region, the data associated with all intersections can be stored in an array of intersection linked lists 80. The intersection data includes the XYZ coordinates of each intersection, the number of intersections along each Z-ray 60 and the surface normals at each such intersection. The potentially very large size of the overall octree data structure together with the significant number of intersections which can be found along any Z-ray 60 can result in the total amount of data generated by these operations being very large. This is not a problem, however, given the amount of memory and storage available in today's computers and given that the recommended octree organization minimizes the amount of extraneous data generated.

Reference is now made to the diagram of FIG. 18 which illustrates a cross section of a complex object 82 having a void region 84 and a bounding box 86. Object 82 is intersected by Z-ray 60 which passes through one region in which there result four ray/surface intersections 68. As provided in one embodiment of the present invention, this is sufficient to indicate that the object 82 cannot be fabricated from a single slab, since at most two such intersections correspond to the two orientations by which the surfaces in question are accessible and thereby machinable. As the two intersection criterion is therefor exceeded in at least one location, object 82 together with bounding box 86 must be subdivided in such a way as to result in a number of sections such that each such section will conform to the two-intersection criterion and such that when the sections are re-assembled they will faithfully reproduce original object 82. The process of sectioning a model such as that of object 82 in such a manner that each section will comply with the two intersection limit, can be carried out by a method such as a lowest to highest level slicing and testing procedure, a binary search process, or any other method by which the machinability of all surfaces within a section can be determined. As an example with reference to FIG. 18, we may utilize a direct slice and test process which begins at the lowest level of object 82 and proceeds to the uppermost level. The first stage of this multistage process would determine the optimal thickness for a first layer 88a together with a remaining portion 90a. Remaining portion 90a is then examined to find that it requires further subdivision and the process is applied again to yield a second layer 88b and a new remaining portion 90b. Yet another application of the subdivision process yields a third layer 88c and a remaining portion 90c. Two additional applications of the subdivision process culminate in the finding of five optimal layers, 88a, 88b, 88c, 88d, 88e. Now layer 88e can be seen to include ribbed support membrane 30 which is added to provide increased rigidity for this section only. The application of ASA 4 is further elucidated in FIG. 19 which illustrates an exploded view of object 1 indicating regions in which a subdivision must be made in order to deal with the model components through which Z-ray 60 and Z-ray bundle 66 result in more than two ray/surface intersections 68. Reference is now made to FIG. 20 which illustrates how tessellated approximation/model 3 in combination with octree rectangular volume 70 and its associated data structures, can be used to determine contact points 96 along any selected two dimensional fabrication path by performing a simple mathematical calculation to determine where fabrication tool tip 92 which can be represented by a simple analytic surface, will contact a portion of the surface or surfaces within a small octree region 74 corresponding to the XY coordinates of a location along fabrication path 42. In particular, such a calculation is straightforward when object 1 is represented entirely by tessellated approximation 3 in which each facet 58 can be treated mathematically as a plane. The calculation is then, that of finding the contact point between the simple tool tip geometry and a plane, which can quickly and easily be performed.

Given that the fabrication path generator, to be described in greater detail herein below, will take into account the inventory of available materials and thicknesses of the stock, yet another embodiment of the present invention will provide that the fabrication path generator also specify the preliminary operations required to machine a block of arbitrary thickness to the thickness specified by ASA 4.

Reference is now made to FIGS. 21a–21b wherein the various parameters affecting the positioning of fabrication tool tip 92 will be described. In FIG. 21a a cross sectional view of the fabrication process for a slab 6 containing portions of three isolated components 98 is shown. In this instance, the XY trajectory of the fabrication path is a straight line extending from the two extremes of outer frame 24 while the tool head motion also includes a Z-axis component. The algorithm which determines the Z-component along fabrication path 42 in accordance with the preferred embodiment of the present invention, is such that model components 98 together with support membranes 8 will be integrally formed. A method for achieving this integration can be implemented by using a plurality of intermediately computed vectors. One such vector is a frame proximity vector 94 which indicates the direction and distance from a tool tip 92 to outer frame 24. Yet another vector would be a component proximity vector 100 which would point from tool tip 92 to a closest surface contact point 96. A pair of opposing proximity vectors 100 could then be used, as an example, to interpolate a support membrane which spans the two nearest contact points. The use of surface normals is important for determining surface orientations and performing necessary inside/outside tests which prevent the machining of enclosed volumes. Surface normal 102 is seen to be pointing in the opposite direction to fabrication head 21 and this fact can be used to indicate that the surface beneath tool tip 92 is an outer surface and may be safely machined. The importance of the surface normals is illustrated even more clearly in FIG. 21b in which the contour of the components and membranes in FIG. 21a are mimicked by a single complementary solid object 101. It can be seen, that without a specific test to establish which side of a surface to machine, tool tip 92 can penetrate an outer surface of object 101 in the course of approaching the lower surface at 102. However, normals 102 in combination with the direction of tool shaft 110 can be used as one type of test to indicate whether the surface in question is an inner surface which should not be machined. Other similar tests which are known to those practiced in the art of geometric analysis could also be applied, without deviating from the scope of the current invention.

Reference is now made to FIG. 22 which illustrates how a curved fabrication path 42a can be determined using the same vectors described above. Frame proximity vector 94 is used to gauge the distance from path 42a to frame 24 and proximity vector 100a is used to define a clearance region having a constant width. Notice that proximity vector 100b indicates that fabrication path 42b is closer to component 98 than path 42a.

The steps used to find the optimal slab thickness described in one prior embodiment of the present invention were based on the use of three-axis fabrication tools. In yet another embodiment of the present invention the procedure needed to effectively utilize a five-axis type fabrication station is prescribed, whereby substantially thicker and more complex sections can be manufactured. This procedure comprises the use of subtractive fabricators 5 having fabrication heads 21 capable of translating and pivoting as described, herein previously, in combination with a computer control program comprised of a suitable ASA 4 and a suitable fabrication path generator. Referring now to FIG. 23 there is illustrated a highly curved object 82 which cannot be fabricated within a single slab 6 using a conventional three axes fabrication station 20 due to the inaccessibility of the inner surfaces. Such surfaces may be accessible to a five axes fabricator however, and therefor there is a need to be able to determine such accessibility as part of the ASA 4 provided for the machine. When utilizing a five axes fabricator, the allowable motion of fabrication head 21 can be described by reference to a set of articulation cones 108a and 108b which specify the limits of angular motion for a fabrication tool shaft 110. In particular for the purposes of calculating accessibility, articulation cone 108a can be used when considering surfaces within non-inverted slab 6 while articulation cone 108b can used when considering surfaces within slab 6 when inverted.

Additionally fabrication tool shaft 110 which is here illustrated as having an exaggerated length, is seen intersecting the enclosing rectangular volume and tentative slab 6 at a location 112a. A useful criterion can be established which states that if, in the course of examining all surfaces of object 82, the distance from location 112a to some surface contact point 96, is found to exceed the length of shaft 110 then the tentative enclosing slab 6 requires sectioning. The articulation cones 108a–b may also be used to determine if at every surface contact point 96 there exists at least one vector within each cone which does not intersect any other surface at a location such as 112b. If such clearance vectors can always be found for all surfaces 62 or facets 58 comprising object 82 and additionally the above described criterion relating to the length of shaft 110 is not violated, then the entire portion of object 82 contained within tentative slab 6 can be fabricated using a five axis machine. It will also be understood that the use of other algorithms which are known to those skilled in the art of CNC machining and which provide similar capabilities for analyzing the machinability of complex objects, could also be used without departing from the scope of the present invention.

The use of five axes fabricators, in place of three axes fabricators, can also simplify the resolution a problem which can occur when the object to be fabricated contains an overhanging component or portion. In much of the prior art, this problem has been addressed by a software solution in which the overhanging portion is automatically provided with additional support structures extending through lower levels, or by filling voids with a complementary material having properties which permit relatively easy removal. As it relates to the present invention, this condition is illustrated in a simplified form in FIGS. 24–27 in which a hollow object 113 is shown enclosing an overhanging component 14. When considering the fabrication of such an object using a 3-axis fabrication station 20 it can be seen by reference to FIG. 24 that at least three slabs 6 would be required to faithfully reproduce the shape. According to one provision of the present invention, support membrane 8 at location 112c would normally be removed after corresponding slab 6 is attached to its associated underlying section. In the particular case illustrated, unless the membrane removal operation were made conditional on the absence of overhanging portion 14 the result would be that overhanging portion 14 would fall into void region 84. Since a fabrication path algorithm, such as that diagrammed in FIG. 33 can easily perform a test for the overhang condition, it can also prevent the removal of support membrane 8 in this situation. However, if this were the only provision of the algorithm, then object 113 would still not be faithfully reproduced, since membrane 8 would be retained within the completed model. In FIG. 25 a simple solution to this problem is shown in which the orientation of object 113 is inverted prior to sectioning. This re-orientation would be performed automatically by ASA 4 according to the embodiments of the present invention and location 112d shows the appearance of support membrane 8 as it would be generated for the reoriented part. Now membrane 8 can be removed without problem, since the previously overhanging portion 14 of object 113 will be supported by its subordinate layer. This simple strategy will not be sufficient in many cases, however, and therefore FIG. 26 shows yet another solution to the problem which is accomplished by filling the region surrounding overhanging portion 14 with a removable support material 114 such as wax, plaster, or foam. The preferred fill material would have a slight expansion coefficient sufficient to establish a firm mechanical hold at adjoining surfaces. Support membrane 8 can then be removed without overhanging portion 14 losing support and upon completion of the model, the added support material can then be melted, dissolved or broken apart and easily removed. Still another solution is available when using a five axes fabrication machine, as can be seen in FIG. 27 where object 113, in its original orientation, can nevertheless be faithfully fabricated in only two sections, without additional support. In this situation then, the advantages offered by five axes fabrication can clearly be seen.

Reference is now made to FIG. 32 which illustrates the flow diagram for an adaptive sectioning algorithm/ASA 4. The steps for such an algorithm to conform to the scope of the present invention comprise the following:

Providing for the input of a computer model.

Considering (Looping) on at least six possible orientations for the model.

Using a test to determine if a section through the model can be machined completely.

Considering (Looping) through all such sections.

Testing whether an acceptable section is too thick, based on the material available.

Terminating if acceptable section is too thin, such as less than two millimeters.

Choosing the model orientation and sectioning which yields optimal results.

Storing intermediate information gathered, for later use by fabrication path generator.

Reference is now made to FIG. 33 which illustrates the flow diagram for a fabrication path generator. The steps for such an algorithm to conform to the scope of the present invention comprise the following:

Deriving input from the prior executed ASA 4.

Informing operator as to any problems encountered.

If problems are present, instructing the operator as to options.

If no problems are encountered, generate paths needed to fabricate surfaces, membranes and frames.

Use ASA 4 results to speed up the process.

Test for tool clearance.

Provide for interference testing and gouge avoidance.

If tool interferes, provide operator with options.

Provide auxiliary support for overhanging components.

Add perforations if optionally requested.

Modify fabrication path for mold applications.

Store fabrication paths for post processing.

Assembly:

Now in accordance with yet another provision of the present invention there is shown by way of FIGS. 28–29 various methods for permanently bonding the separately formed slabs 6 which comprise a model created in the manner herein prescribed. Referring now to FIG. 28, there is illustrated a method of bonding slabs 6 which are formed from low melting temperature materials such as wax, thermoplastics, etc. by using a radiant heat source 116 to heat and soften the upper most surfaces of a subordinate layer and bonding it directly to a succeeding layer without requiring the application of an adhesive. In FIG. 29 the localized heating is shown provided by a hot air jet 118. The use of pressure and/or the preheating of slabs 6 in combination with a topical heat treatment such as that described above would also be within the scope of the present invention.

Verification:

Yet another embodiment of the present invention is illustrated in FIGS. 30–31 which show the method for creating an illustration and verification aid 122 to be used in combination with the construction process described in the present invention so as to enable a machine operator to look at and verify the proper build sequence, and to visually identify potential build problems prior to executing the build. This verification aid 122 also enables the operator to preview the finished appearance of the object. The steps for creating the verification aid are:

(a) Printing a rendering 120a of one side of each completed slab 6 onto a sheet material 121 in such a manner as to realistically represent the three dimensional appearance of what would be visible to the operator within slab 6 by means of such forms of illustration as a shaded isometric image, shaded perspective image, hidden line isometric image, hidden line perspective image as shown in FIG. 30a.

(b) Turning over sheet material 121 and printing a rendering of the opposing side 120b of corresponding slab 6 in an orientation and position which will coincide with the image previously rendered on the reverse side.

(c) Cutting out each rendering 120 corresponding to each slab 6.

(d) Binding together the separate cutouts, in book form, so that they can be leafed through and viewed from either side and, in combination, will give the appearance of the completed build.

CONCLUSION, RAMIFICATION, AND SCOPE OF INVENTION

Accordingly, the reader will see that the present invention is directed to a method for forming an integral three-dimensional object from common materials using the techniques of subtractive fabrication. The method provides for the smooth carving of model portions within optimally sectioned slabs of material in such a way as to allow multiple objects and complex components which include void regions and isolated portions, to be created. The method also allows for the easy fixturing and machining of two sides of each slab and provides a simple method for smoothly removing the temporary supporting structures involved in the intermediate stages of the process and thereby minimizing the amount of hand finishing required. The models which are produced, are suitable for investment casting or the making of molds and can also be finished and used directly as mockups. Additional advantages of the present invention include the following:

Provides an automated subtractive fabrication process which is able to use existing machines, as well as customized machines.

Can use non-toxic, inexpensive, non-proprietary and readily available materials.

Provides the ability to automatically create much larger parts, including many types of prototypes which in the past may have been too large to benefit cost effectively from rapid prototyping technologies, such as automotive exteriors and interiors, seating designs, aerospace models, mockups for films and presentation purposes, etc.

Can produce large parts more rapidly and economically than prior methods.

Is more tolerant than prior art approaches, when faced with imperfect STL data files.

Allows surface based CAD models to be used, which result in improved surface finish and smaller files.

Allows the creation of more complex parts than would be possible using conventional CNC hardware and software.

Allows the creation of multiple nested objects in one process.

Takes into account the available inventory of stock material, prior to recommending commencement of a build.

Indicates to the operator, whether a part to be formed is too complex for this method to be effectively used and can provide other recommendations as to how to best fabricate the part, if this is the case.

Provides the operator with an estimate of the amount of time required to create the part and offers a time and cost comparison with other technologies so as to enable the operator to choose the fastest and most cost effective technology, if desired.

Provides the operator with a visual verification, simulation, and diagnostic aid, to be used prior to and during the build process, in order to verify that the part is being fabricated and assembled correctly. The verification process is simple, inexpensive, and portable.

Allows traditional machinists to create RP parts as well as conventional CNC parts without requiring specially trained operators.

Those already using subtractive fabrication machines, do not need to invest in special and expensive new hardware and consumables and the machines which they have will be easier and less expensive to upgrade, as well as less prone to become obsolete.

Provides for optimized utilization of five axis subtractive fabrication machines and will encourage greater usage of such machines in the future.

Provides instruction in the development of low cost, high speed, milling machines, which can form parts from such materials as low density foam or machining wax at much higher rates of speed.

The invention will require a minimal amount of manual effort on the part of the operator and more importantly will utilize, to advantage, the operators prior knowledge of standard machining technology. This innovation also permits the expanded utilization of both existing machine tools and personnel, without extensive capitalization and retraining costs. Based on a Market Intelligence Research Corporation study (MIRC, Mountian View, Calif.) it is estimated that $9.7 billion worth of CNC mills will be sold in 1997. Most of these machining centers will be used primarily for surface finishing purposes and not for direct fabrication. There would be enormous productivity gains and cost savings achieved if the proposed method were applicable in as few as 5% of the prototypes created to support new product development. The impact of this invention should be dramatic for industries involved in automotive and aerospace design, medical modeling and prosthetics, furniture design, and architectural and geological modeling.

It will be appreciated by persons skilled in the art that the present invention is not limited by what has been particularly shown and described hereinabove. Rather the scope of the present invention is defined only by the claims which follow:

I claim:

1. A novel method for manufacturing a complex three dimensional object from a computer generated model comprising:

(a) loading data representing said computer generated model into a computer control program;

(b) loading a set of fabrication machine parameters representing at least one subtractive fabricator, together with a set of fabrication material parameters representing fabrication material properties, into said computer control program;

(c) using said computer control program to automatically specify the subtractive fabrication of, a preferable plurality of slabs, whose number is a preferable minimum subject to constraints imposed by said; fabrication machine parameters, and said fabrication material parameters, with each one of said plurality of slabs having a sufficient thickness to allow a subset of model surfaces, from said computer generated model, to be faithfully and accurately fabricated within at least one slab of said plurality of slabs, without necessitating the entire removal of said subset model surfaces from said slab, whereupon when said plurality of slabs are fabricated in accordance with instructions from said computer control program and whereupon when said plurality of slabs are aligned, assembled and joined together, the resultant assembly will comprise a complete reproduction of said complex three dimensional object, with said complex three dimensional object being preferably temporarily retained within said plurality of slabs until the time of said complex three dimensional object removal;

(d) at the time of manufacture, subtractively fabricating each one slab from said plurality of slabs, orienting each said slab, aligning each said slab with a previous slab from said plurality of slabs, and in proper sequence, assembling each said slab so as to form by preferably bonding, and fixturing, a composite structure which preferably temporarily retains said complex three dimensional object within said composite structure until the time of said complex three dimensional object removal.

2. The method of claim 1 wherein said computer generated model is edited prior to its fabrication by a operator to incorporate additional structures for support purposes and to remove object components which would preclude said computer generated model from being fabricated using a substantially small number of slabs.

3. The method of claim 1 wherein said slabs have substantially uniform, equally sized, and regularly shaped contours and said slabs have top and bottom faces which are preferably broad, parallel and planar.

4. The method of claim 1 wherein said slabs, being provided from an inventory of stock having a finite number of thicknesses, are each machined to the correct thickness corresponding to the section to be fabricated.

5. The method of claim 1 wherein each one of said slabs further includes an outer frame, bounding each said slab, and said frame is optionally provided with a plurality of registration holes arranged around and within the outer periphery of said frame, through which a plurality of registration pins and/or screws may be used to secure said slabs.

6. The method of claim 5 wherein said frame has substantially planar and parallel top and bottom faces and said faces have sufficient width so as to provide a suitable and uniform alignment, fixturing, and support for said slabs.

7. The method of claim 5 wherein said frame further includes a series of machined striations arranged along top and bottom faces which are juxtaposed in such a manner as to allow said slabs to mesh when assembled so that said slabs may be easily aligned and will be prevented from moving in X and Y directions.

8. The method of claim 5 further including said composite structure comprised of said complex three dimensional object suspended within said frame by a component support structure.

9. The method of claim 8 wherein said complex three dimensional object is removed from said composite structure by use of cutting tools and is finished using methods well known to those practiced in the art of model making.

10. The method of claim 8 further including the forming of a plurality of disjoint nested objects in one operation.

11. The method of claim 1 wherein said computer control program results in said slabs being machined on a plurality of sides.

12. The method of claim 1 wherein assembly of said slabs uses adhesive bonding between successive each one of said slabs.

13. The method of claim 1 wherein assembly of said slabs uses registration holes in combination with registration pins between said successive slabs.

14. The method of claim 1 further including the automated transportation and reorientation of said slabs as an element of said subtractive fabrication.

15. The method of claim 14 wherein said automated transportation and reorientation of said slabs comprises robotic transporting as an element of said subtractive fabrication.

16. The method of claim 14 wherein said automated transportation and reorientation of said slabs further includes a translating fixturing table as an element of said subtractive fabrication.

17. The method of claim 14 wherein said automated transportation and reorientation of said slabs further includes a rotating fixturing table as an element of said subtractive fabricator.

18. The method of claim 1 wherein said composite structure further includes at least one mold making feature taken from the set of runners, parting surfaces, sprues, and pouring gates; suitable for the making of an investment casting from said composite structure.

19. The method of claim 1 wherein said composite structure further includes at least one mold making feature taken from the set of runners, parting surfaces, sprues, and pouring gates; for the making of an injection mold from said composite structure.

20. The method of claim 1 wherein said complex three dimensional object is processed for the purpose of making a mold/casting from said complex three dimensional object.

21. The method of claim 1 wherein said subtractive fabrication is provided by a subtractive fabrication device.

22. The method of claim 1 wherein said subtractive fabrication occurs in tandem.

23. The method of claim 1 wherein said computer control program automatically determines a preferred orientation for said computer generated model so as to reduce the number of said slabs required.

24. The method of claim 1 wherein said computer control program results in said slabs further including an auxiliary component support structure comprising a support membrane having a thickness substantially less than the thickness of said slabs and said support membrane is fabricated in unison and integral with said model surfaces whereby isolated object components can be constrained within said slabs by said support membrane in such a manner as to prevent the premature separation of said isolated object components during the fabrication and assembly process and further so as to require a minimum amount of manual registration and finishing effort on the part of said operator.

25. The method of claim 24 further including at least one embedded auxiliary and enhanced support structure for providing greater rigidity and strength to said component support structure.

26. The method of claim 24 further including the step of sealing cavities within said slabs with a temporary and easily removable material providing greater rigidity and support for said component support structure.

27. The method of claim 24 further including the addition of an automatically fabricated ribbed and/or meshed structure to said component support structure.

28. The method of claim 24 wherein said support membrane consists of a thinner clearance channel conforming to the contour of said model surfaces together with a thicker membrane extending from said thinner clearance channel to said frame.

29. The method of claim 24 wherein said support membrane further includes perforations along edges formed between said model surfaces and said support membrane, so that upon completion of fabrication, said complex three dimensional object may be more easily removed from said composite structure.

30. The method of claim 24 wherein, if said component support structure is determined to be expendable by said computer control program said component support structure may be automatically detached and/or entirely removed from said complex three dimensional object by said subtractive fabrication.

31. The method of claim 30 wherein said detachment of said component support structure from said isolated objects components includes using a five axes subtractive fabricator to cleanly and smoothly trim said support membrane along said model surfaces so as to preserve curvature continuity across said model surfaces and so as to reduce the need for hand finishing.

32. The method of claim 1 wherein output of said computer control program further includes providing said operator with advice comprising the steps of:

(a) warning if said computer generated model cannot be faithfully built due to constraints;

(b) indicating regions of said computer generated model which are too complex to construct;

(c) advising said operator how to modify a complex model so as to allow it to be built;

(d) providing an estimated build time;

(e) providing an estimated build cost;

(f) providing comparisons with alternative rapid prototyping methods;

(g) providing a visual display of rendered and animated slabs on a computer screen.

33. The method of claim 1 wherein at least a minimum and maximum allowed material thickness in combination with an inventory of available stock material are entered as data into said computer control program.

34. The method of claim 1 wherein said computer control program uses a multitude of Z-rays for determining an appropriate sectioning of said computer generated model so as to reduce to a minimum the required number of said slabs.

35. The method of claim 1 wherein said computer control program uses a multitude of articulation cones for determining an appropriate sectioning of said computer generated model so as to reduce to a minimum the required number of said slabs.

36. The method of claim 1 wherein said computer control program uses a multitude of surface normals for determining an appropriate sectioning of said computer generated model so as to reduce to a minimum the required number of said slabs.

37. The method of claim 1 further including a computer algorithm capable of utilizing the intermediate data gathered as part of said computer control program for the purpose of speeding the fabrication steps for each said slab.

38. The method of claim 1 further including an assembly verification process comprising the steps of:

(a) printing renderings representative of each side of said slabs onto each side of a sheet material;

(b) cutting out each one of said renderings along their respective outer boundaries;

(c) binding together said renderings along one respective common edge in such a manner as to produce an assembly conveying the appearance of a three dimensional block while allowing each apparent slab of said apparent three dimensional block to be viewed from either side so that said operator is provided with a visual and easily transportable verification for each step of the fabrication process and thereby allowing said operator to identify potential fabrication problems prior to initiating the build of said complex three dimensional object.

39. The method of claim 1 further including the step of applying heat to the outer surface of each fabricated slab so as to allow the direct fusion of said slabs without the need for adhesive.

40. The method of claim 39 wherein said heating includes a heated air stream.

41. The method of claim 39 wherein said heating includes a radiant heat source.

42. The method of claim 39 wherein each said slab is formed from a substantially low melting temperature material such as those taken from the set of wax and thermoplastic.

43. The method of claim 1 wherein said subtractive fabricator is modified to increase speed.

44. The method of claim 43 wherein said subtractive fabricator is modified to incorporate a plurality of components having lower cost.

45. The method of claim 43 wherein said subtractive fabricator is modified by providing a plurality of adjustable design parameters such as table length and width.

46. The method of claim 1 wherein said subtractive fabricator is modified for use with substantially soft materials and said modification further comprises constructing said subtractive fabricator from lighter materials such as aluminum.

47. An assembly verification process for use in combination with a thick slab subtractive fabrication process comprising the steps of:

(a) printing renderings representative of each side of said slabs onto each side of a sheet material;

(b) cutting out each one of said renderings along their respective outer boundaries;

(c) binding together said renderings along one respective common edge in such a manner as to produce an assembly conveying the appearance of a three dimensional block while allowing each apparent slab of said apparent three dimensional block to be viewed from either side so that said operator is provided with a visual and easily transportable verification for each step of the fabrication process and thereby allowing said operator to identify potential fabrication problems prior to initiating the build of said complex three dimensional object.

48. The method of claim 1 wherein said output of said computer control program is provided in a form independent of actual fabrication of said slabs as by way of a data file so that said data file can be used at a later date to display and fabricate said slabs resulting in said complex three dimensional object being reproduced.

49. A method for manufacturing a multi-segmented mold from a computer generated model comprising:

(a) loading data representing said computer generated model together with a set of subtractive fabrication machine parameters and a set of fabrication material parameters into a computer control program;

(b) using said computer control program to automatically specify the subtractive fabrication of a multi-segmented mold having a minimal number of mold sections while ensuring the faithful and accurate reproduction of a desired object from said multi-segmented mold;

(c) automatically determining and indicating the location of parting surfaces for said multi-segmented mold;

(d) automatically determining and indicating the location of filler ports for said multi-segmented mold;

(e) at the time of manufacture, subtractively fabricating each said mold section and assembling said multi-segmented mold.

50. The method of claim 49 further permitting the location of said automatically determined parting surfaces and said automatically determined filler ports to be manually adjusted by said operator prior to fabrication of said multi-segmented mold.

51. The method of claim 49 wherein said computer generated model results from the Boolean subtraction of a computer generated model of said desired object, from a computer generated solid block, so as to create a new computer model having the pattern exist as a void region within formerly said computer generated solid block.

* * * * *